United States Patent
Black et al.

(10) Patent No.: US 8,486,512 B2
(45) Date of Patent: Jul. 16, 2013

(54) PATTERN FORMATION EMPLOYING SELF-ASSEMBLED MATERIAL

(75) Inventors: Charles T. Black, New York, NY (US); Timothy J. Dalton, Ridgefield, CT (US); Bruce B. Doris, Brewster, NY (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/430,179

(22) Filed: Mar. 26, 2012

(65) Prior Publication Data
US 2012/0183742 A1    Jul. 19, 2012

Related U.S. Application Data

(62) Division of application No. 12/026,123, filed on Feb. 5, 2008, now Pat. No. 8,215,074.

(51) Int. Cl.
*B32B 3/00* (2006.01)

(52) U.S. Cl.
USPC .............................. 428/156; 428/167; 428/187

(58) Field of Classification Search
USPC ................. 428/156, 167, 172, 187; 977/882, 977/887, 888
See application file for complete search history.

(56) References Cited

U.S. PATENT DOCUMENTS

| | | | |
|---|---|---|---|
| 7,105,118 B2 | 9/2006 | Narayan et al. | |
| 7,223,444 B2 | 5/2007 | Deppert et al. | |
| 7,605,081 B2 | 10/2009 | Yang et al. | |
| 8,030,108 B1 | 10/2011 | Lee et al. | |
| 8,083,953 B2* | 12/2011 | Millward et al. | 216/2 |
| 2004/0119064 A1 | 6/2004 | Narayan et al. | |
| 2008/0274413 A1* | 11/2008 | Millward | 430/5 |
| 2008/0286659 A1 | 11/2008 | Millward | |
| 2010/0055459 A1 | 3/2010 | Desimone et al. | |
| 2010/0259184 A1 | 10/2010 | Kato et al. | |
| 2011/0200873 A1 | 8/2011 | Hu et al. | |
| 2011/0276125 A1 | 11/2011 | Walker et al. | |
| 2011/0294073 A1 | 12/2011 | Shin et al. | |

OTHER PUBLICATIONS

Nealey et al., "Self-assembling resists for nanolithography" IEDM Technical Digest (Dec. 2005) Digital Object Identifier 10.1109/IEDM.2005.1609349.

Ross et al., "Nanostructured Surfaces with Long-Range Order for Controlled Self-Assembly" NSF Nanoscale Science and Engineering Grantees Conference (2003) pp. 1-4.

(Continued)

*Primary Examiner* — Catherine A Simone
(74) *Attorney, Agent, or Firm* — Scully, Scott, Murphy & Presser, P.C.; Katherine S. Brown, Esq.

(57) ABSTRACT

In one embodiment, Hexagonal tiles encompassing a large are divided into three groups, each containing ⅓ of all hexagonal tiles that are disjoined among one another. Openings for the hexagonal tiles in each group are formed in a template layer, and a set of self-assembling block copolymers is applied and patterned within each opening. This process is repeated three times to encompass all three groups, resulting in a self-aligned pattern extending over a wide area. In another embodiment, the large area is divided into rectangular tiles of two non-overlapping and complementary groups. Each rectangular area has a width less than the range of order of self-assembling block copolymers. Self-assembled self-aligned line and space structures are formed in each group in a sequential manner so that a line and space pattern is formed over a large area extending beyond the range of order.

19 Claims, 69 Drawing Sheets

OTHER PUBLICATIONS

International Search Report dated May 20, 2009 issued in corresponding International Application No. PCT/US2009/032936.

Office Action dated Jul. 20, 2012, in a related U.S. Patent Application, namely U.S. Appl. No. 13/430,177.

* cited by examiner

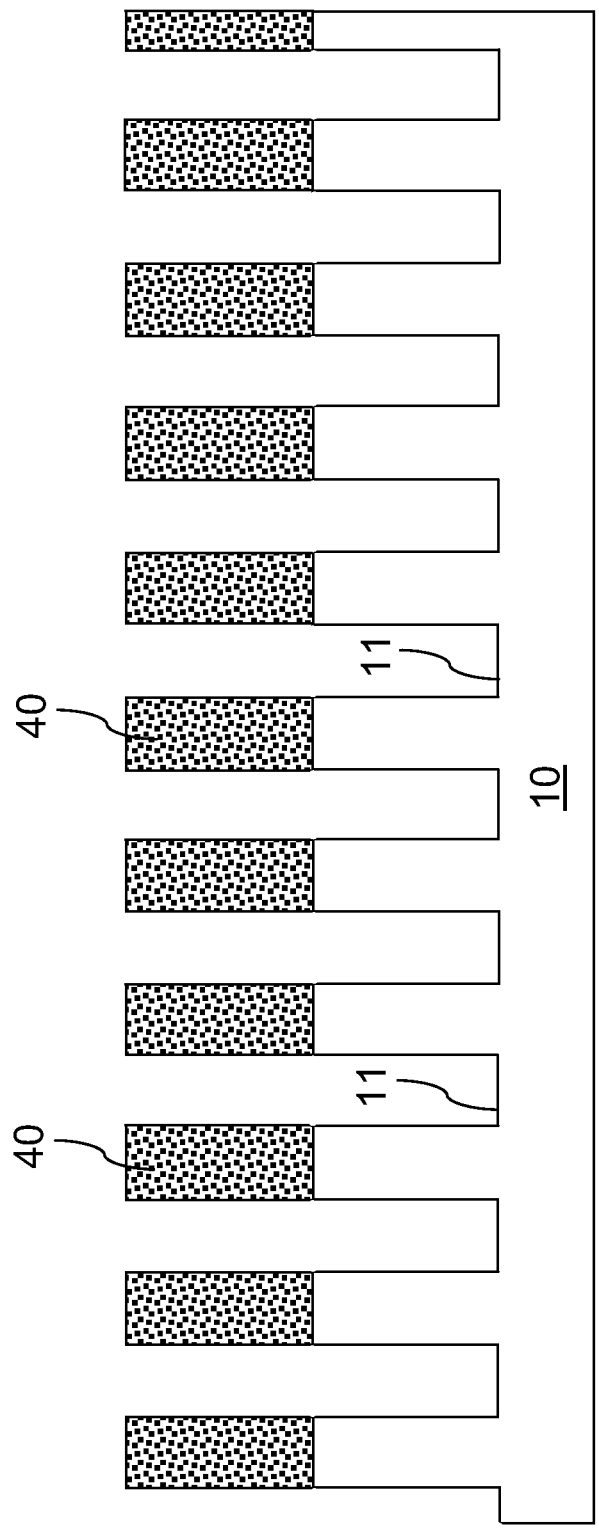

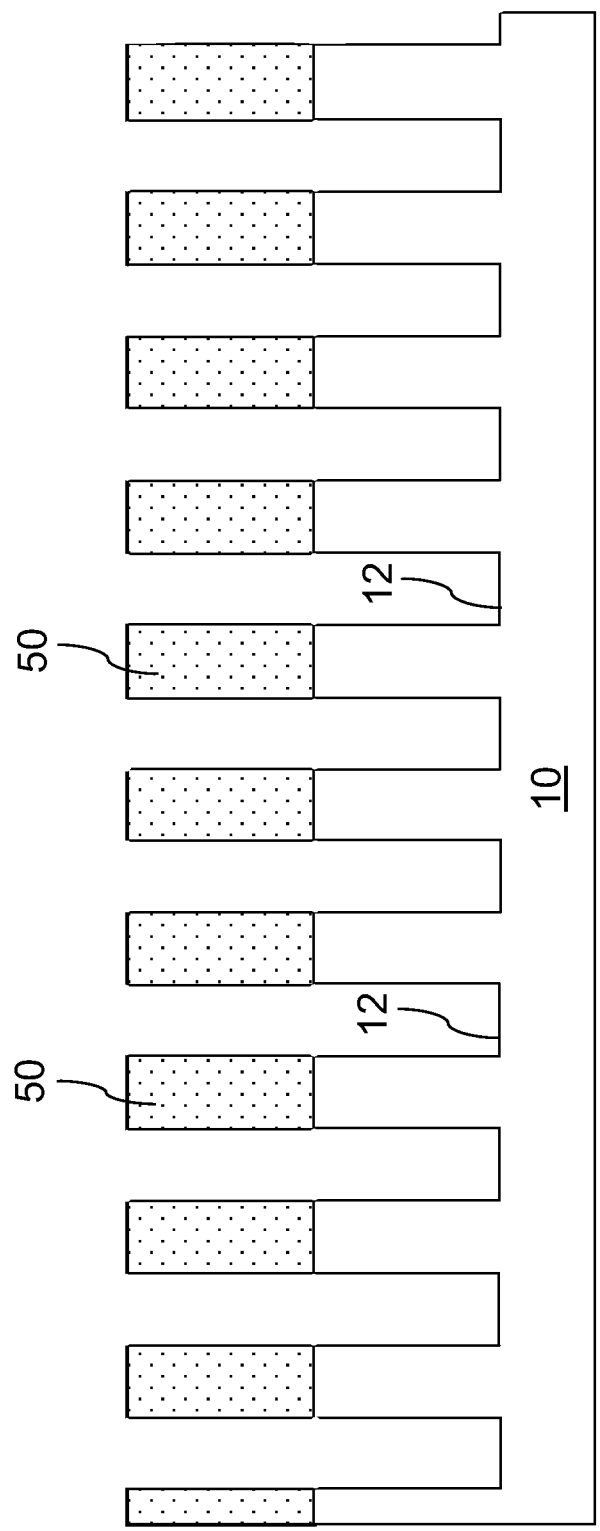

PATTERN FORMATION EMPLOYING SELF-ASSEMBLED MATERIAL

CROSS REFERENCE TO RELATED APPLICATION

This application is a divisional of U.S. patent application Ser. No. 12/026,123, filed Feb. 5, 2008, now U.S. Pat. No. 8,215,074 the entire content and disclosure of which is incorporated herein by reference.

FIELD OF THE INVENTION

The present invention relates generally to nanoscale structures, and more particularly to self-assembled sublithographic nanoscale structures in a regular periodic array and methods for manufacturing for the same.

BACKGROUND OF THE INVENTION

The use of bottom-up approaches to semiconductor fabrication has grown in interest within the semiconductor industry. One such approach utilizes self-assembling block copolymers for generation of sublithographic ground rule nanometer scale patterns.

Self-assembling copolymer materials that are capable of self-organizing into nanometer-scale patterns may be applied within a recessed region of a template layer to form a nanoscale structure. Under suitable conditions, the two or more immiscible polymeric block components separate into two or more different phases on a nanometer scale, and thereby form ordered patterns of isolated nano-sized structural units. Such ordered patterns of isolated nano-sized structural units formed by the self-assembling block copolymers can be used for fabricating nano-scale structural units in semiconductor, optical, and magnetic devices. Dimensions of the structural units so formed are typically in the range of 5 to 40 nm, which are sublithographic (i.e., below the resolution of the lithographic tools).

The self-assembling block copolymers are first dissolved in a suitable solvent system to form a block copolymer solution, which is then applied onto the surface of an underlayer to form a block copolymer layer. The self-assembling block copolymers are annealed at an elevated temperature to form two sets of polymer block structures containing two different polymeric block components. The polymeric block structure may be lines or cylinders. One set of polymer block structures may be embedded in the other set of polymer block structures, or polymeric block structures belonging to different sets may alternate. The self-assembling block copolymers are non-photosensitive resists, of which the patterning is effected not by photons, i.e., optical radiation, but by self-assembly under suitable conditions such as an anneal.

While self-assembly of the two sets of polymer block structures by an anneal is an inherent chemical property of the self-assembling block copolymers, self-alignment of the two sets of polymer block structures requires an interaction of the self-assembling block copolymers with a physically constraining environment. In other words, the self-alignment of the two sets of polymer block structures requires an external structure to register the self-aligned structures to. Such an external structure functions as a template for registry of the self-aligned structure during the anneal that separates a first polymeric block component and a second polymeric block component.

The effective range of order generated by the external structure generates and effecting the self-alignment of the self-assembling block copolymers during anneal is finite. In other words, the spatial extent of the effect of the presence of the external structure as a template is limited, and does not propagate indefinitely. The coherence of the order is lost if the distance between the self-assembling block copolymers and the external structure exceeds the effective range. In this case, the two sets of polymer block structures no longer register with the external structure. While the size of a self-assembled self-aligned nanoscale structure may vary depending on the composition of the self-assembling block copolymers, the limited range, typically comprising less than 100 alterations of the first polymeric block component and the second polymeric block component. Thus, it is difficult to form a self-assembled self-aligned nanoscale structure having a dimension exceeding about 1 micron.

However, a large repetitive patterned structure is highly desirable for advanced semiconductor devices and nanoscale devices. Therefore, there is a need for a nanoscale self-assembled self-aligned structure that extends over a large area and having a size that is not limited by inherent effective range of the self-assembling block copolymers, and methods of forming such a nanoscale self-assembled self-aligned structure.

SUMMARY OF THE INVENTION

The present invention addresses the needs described above by providing contiguous nanoscale self-assembled self-aligned structures extending over an area extending beyond a range of order of self-assembling block copolymers generated by external structures, and methods of manufacturing the same.

In one embodiment, a large area extending beyond a coherency range of order in self-alignment is divided into hexagonal tiles having lithographic dimensions. The hexagonal tiles are divided into three groups, each containing ⅓ of all hexagonal tiles that are disjoined among one another. The hexagonal tiles in each group are in a hexagonal array. Openings for the hexagonal tiles in each group are formed in a template layer, and a set of self-assembling block copolymer is applied and patterned within each opening. This process is repeated three times to encompass all three groups, resulting in a self-aligned pattern extending over a wide area. In a second embodiment, the large area is divided into rectangular tiles of two non-overlapping and complementary groups. Each rectangular area has a width less than the range of order of self-assembling block copolymers. Self-assembled self-aligned line and space structures are formed in each group in a sequential manner so that a line and space pattern is formed over a large area extending beyond the range of order. Variations of hexagonal tiles are also contemplated herein such as rectangular, square, and triangular tiles.

According to an aspect of the present invention, a method of forming a nanoscale pattern on a substrate is provided. The method comprises:

forming a first template layer encompassing a predefined area on a substrate;

patterning first openings, each having a shape of a regular hexagon, in the first template layer, wherein the first openings are arranged in a first hexagonal array;

forming first nanoscale self-assembled self-aligned structures in the first openings;

forming a second template layer encompassing the area on the first nanoscale self-assembled self-aligned structures;

patterning second openings, each having a shape of the regular hexagon, in the second template layer, wherein the second openings are arranged in a second hexagonal array;

forming second nanoscale self-assembled self-aligned structures in the second openings;

forming a third template layer encompassing the area on the first and second nanoscale self-assembled self-aligned structures;

patterning third openings, each having a shape of the regular hexagon, in the third template layer, wherein the third openings are arranged in a third hexagonal array; and forming third nanoscale self-assembled self-aligned structures in the third openings.

In one embodiment, each of the first openings, the second openings, and the third openings does not overlap any other of the first openings, the second openings, and the third openings.

In another embodiment, the predefined area is the same as a union of combined areas of the first openings, combined areas of the second openings, and combined areas of the third openings.

In even another embodiment, the second hexagonal array is offset from the first hexagonal array by one instance of the regular hexagon, the third hexagonal array is offset from the first hexagonal array by another instance of the regular hexagon, and the third hexagonal array is offset from the second hexagonal array by yet another instance of the regular hexagon.

In yet another embodiment, each of the first, second, and third nanoscale self-assembled self-aligned structures is congruent to another of the first, second, and third nanoscale self-assembled self-aligned structures.

In still another embodiment, the method further comprises:

applying a non-photosensitive polymeric resist comprising a first polymeric block component and a second polymeric block component within each of the first openings prior to the forming of first nanoscale self-assembled self-aligned structures;

applying the non-photosensitive polymeric resist within each of the second openings prior to the forming of second nanoscale self-assembled self-aligned structures; and applying the non-photosensitive polymeric resist within each of the third openings prior to the forming of third nanoscale self-assembled self-aligned structures.

In still yet another embodiment, each of the first, second, and third nanoscale self-assembled self-aligned structures comprises at least one circular cylinder comprising the first polymeric block component and a polymeric matrix comprising the second polymeric block component and laterally abutting the at least one circular cylinder.

In a further embodiment, each of the first, second, and third nanoscale self-assembled self-aligned structures further comprises six instances of a third of a circular cylinder, each instance having a volume of one third of a total volume of the at least one circular cylinder and having an angle of 120 degrees at a ridge.

In an even further embodiment, the six instances and the polymeric matrix laterally abuts a boundary of one of the first, second, and third openings.

In a yet further embodiment, each of the first, second, and third nanoscale self-assembled self-aligned structures comprises a plurality of circular cylinders comprising the first polymeric block component and a polymeric matrix comprising the second polymeric block component and laterally abutting the at least one circular cylinder, and each of the plurality of circular cylinders is disjoined from boundaries of the first, second, and third openings.

In a still further embodiment, the method further comprises etching one of a set of the circular cylinders and a set of the polymeric matrices selective to the other of the set of the circular cylinders and the set of the polymeric matrices.

In further another embodiment, the method further comprises forming a pattern having sublithographic dimensions in the substrate employing a remaining portion of the circular cylinders and the polymeric matrices as an etch mask.

According to another aspect of the present invention, a method of forming a nanoscale pattern on a substrate is provided. The method comprises:

forming a first template layer encompassing a predefined area on a substrate;

patterning first openings, each having a shape of a rectangle and a lithographic width, in the first template layer;

forming first nanoscale self-assembled self-aligned structures in the first openings;

forming a second template layer directly on the first nanoscale self-assembled self-aligned structures;

patterning second openings, each having a shape of a rectangle and a lithographic width, in the first template layer, wherein the second openings are a complement of the first openings within the predefined area; and forming first nanoscale self-assembled self-aligned structures in the first openings.

In one embodiment, the method further comprises:

applying a non-photosensitive polymeric resist comprising a first polymeric block component and a second polymeric block component within each of the first openings prior to the forming of first nanoscale self-assembled self-aligned structures; and applying the non-photosensitive polymeric resist within each of the second openings prior to the forming of second nanoscale self-assembled self-aligned structures.

In another embodiment, each of the first and second nanoscale self-assembled self-aligned structures comprises at least one nominal width line and two edge lines, each comprising the first polymeric component, wherein each of the two edge lines abut a boundary of one of the first openings, wherein the at least one nominal width line is disjoined from the two edge lines, wherein the at least one nominal width line has a nominal line width and the two edge lines have an edge line width, wherein the nominal line width is sublithographic and greater than the edge line width.

In even another embodiment, each of the first and second nanoscale self-assembled self-aligned structures further comprises complementary lines comprising the second polymeric component, wherein each of the complementary lines laterally abuts two of the at least one nominal width line and the two edge lines and has another width that is sublithographic.

In yet another embodiment, the method further comprises:

etching one of the first polymeric component and the second polymeric component selective to the other; and forming a pattern having sublithographic dimensions in the substrate, wherein the pattern comprises a periodic repetition of at least one first line with a first sublithographic dimension and a second line with a second sublithographic dimension, wherein each neighboring pair of the at least one first line and the second line is separated by a same sublithographic spacing.

In a yet another aspect of the present invention, a structure comprising a substrate is provided, wherein the substrate has a pattern of protrusion or recess from a substantially planar surface, wherein the pattern comprises a hexagonal array of a unit pattern, wherein the hexagonal array has a minimum periodicity of a lithographic dimension, wherein the unit pattern has a shape of a regular hexagon and comprises circles of a same diameter, wherein a collection of the circles from two neighboring instances of the unit pattern does not have hexagonal periodicity.

In one embodiment, the same diameter is sublithographic.

In another embodiment, the pattern is a pattern of protrusion, wherein the structure further comprises a plurality of cylinders having the same diameter, comprising a polymeric component of a non-photosensitive polymeric resist, and located directly on each of the pattern of protrusion, wherein edges of the circles coincide with cylindrical surfaces of the plurality of the cylinders.

In yet another embodiment, the pattern is a pattern of recess, wherein the structure further comprises a matrix of a polymeric component of a non-photosensitive polymeric resist, wherein the matrix contains cylindrical openings, wherein edges of the circles coincide with cylindrical surfaces of the cylindrical openings.

In a still another aspect of the present invention, a structure comprising a substrate is provided, wherein the substrate has a one dimensional periodic repetition of a unit pattern, wherein the unit pattern comprises a protrusion or recess of at least one first line and a second line on a substantially planar surface, wherein each of the at least one first line has a first sublithographic width, wherein the second line has a second sublithographic width, wherein each neighboring pair of the at least one first line and the second line is separated by a same sublithographic spacing.

In one embodiment, the first sublithographic width and the second sublithographic width are different.

In another embodiment, the pattern is a pattern of protrusion, wherein the structure further comprises a plurality of polymeric lines comprising a polymeric component of a non-photosensitive polymeric resist and located directly on each of the at least one first line and a second line, wherein each edge of the polymeric lines vertically coincides with an edge of the at least one first line or the second line.

In yet another embodiment, the pattern is a pattern of recess, wherein the structure further comprises a plurality of polymeric lines comprising a polymeric component of a non-photosensitive polymeric resist and located directly on the substantially planar surface, wherein each edge of the polymeric lines vertically coincides with an edge of the at least one first line or the second line.

BRIEF DESCRIPTION OF THE DRAWINGS

Figures with the same numeric label correspond to the same stage of manufacturing. Figures with the suffix "A" are top-down views. Figures with the suffix "B" or "C" are vertical cross-sectional views along the plane B-B' or C-C', respectively, of the corresponding figure with the same numeric label and the suffix "A."

DETAILED DESCRIPTION OF THE INVENTION

Figure 1A:
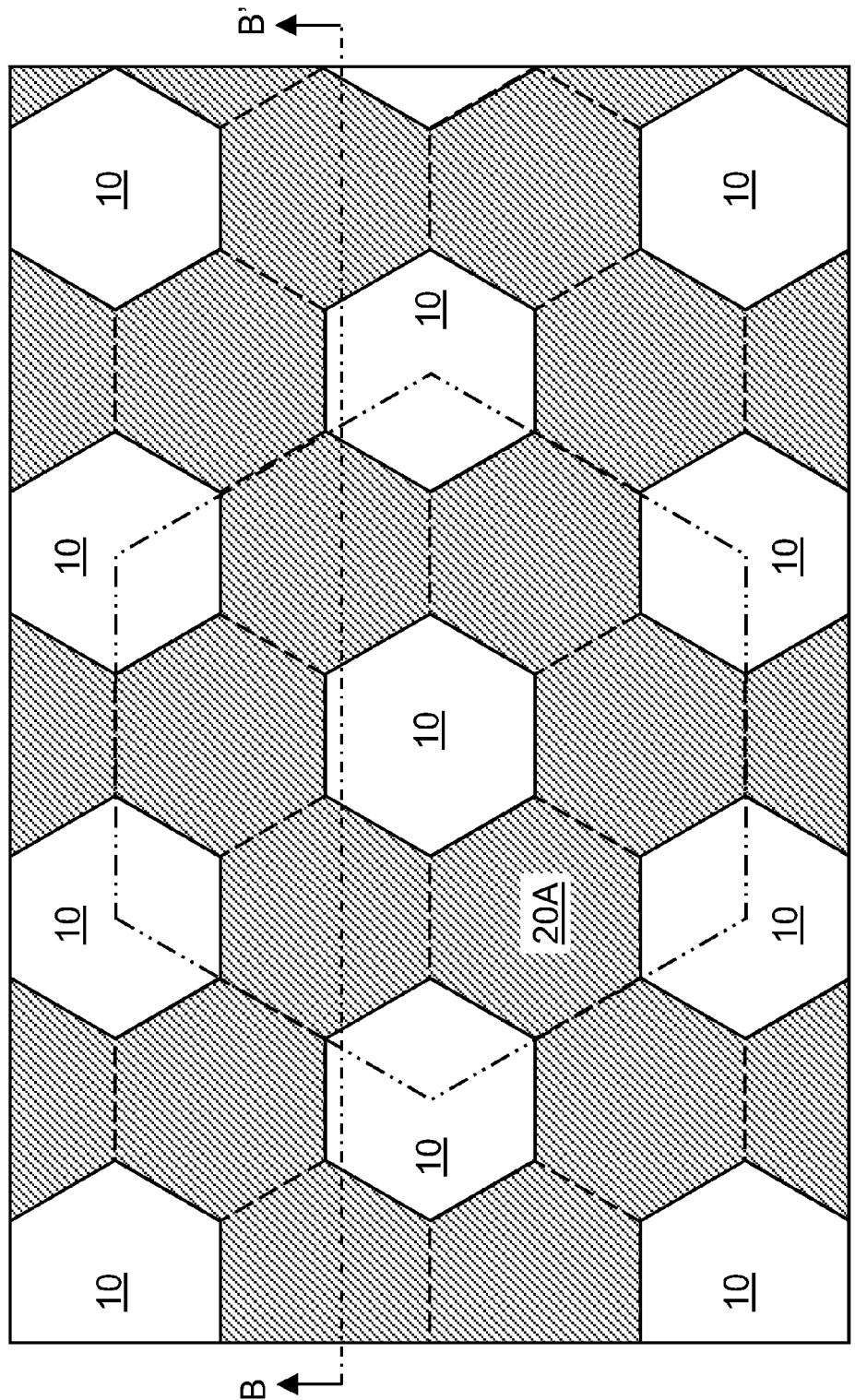
FIGS. 1A-16B are sequential views of a first exemplary nanoscale structure according to a first embodiment of the present invention.

As stated above, the present invention relates to self-assembled sublithographic nanoscale structures in a regular periodic array and methods for manufacturing for the same, which are now described in detail with accompanying figures. It is noted that like and corresponding elements are referred to by like reference numerals.

Figure 1B:
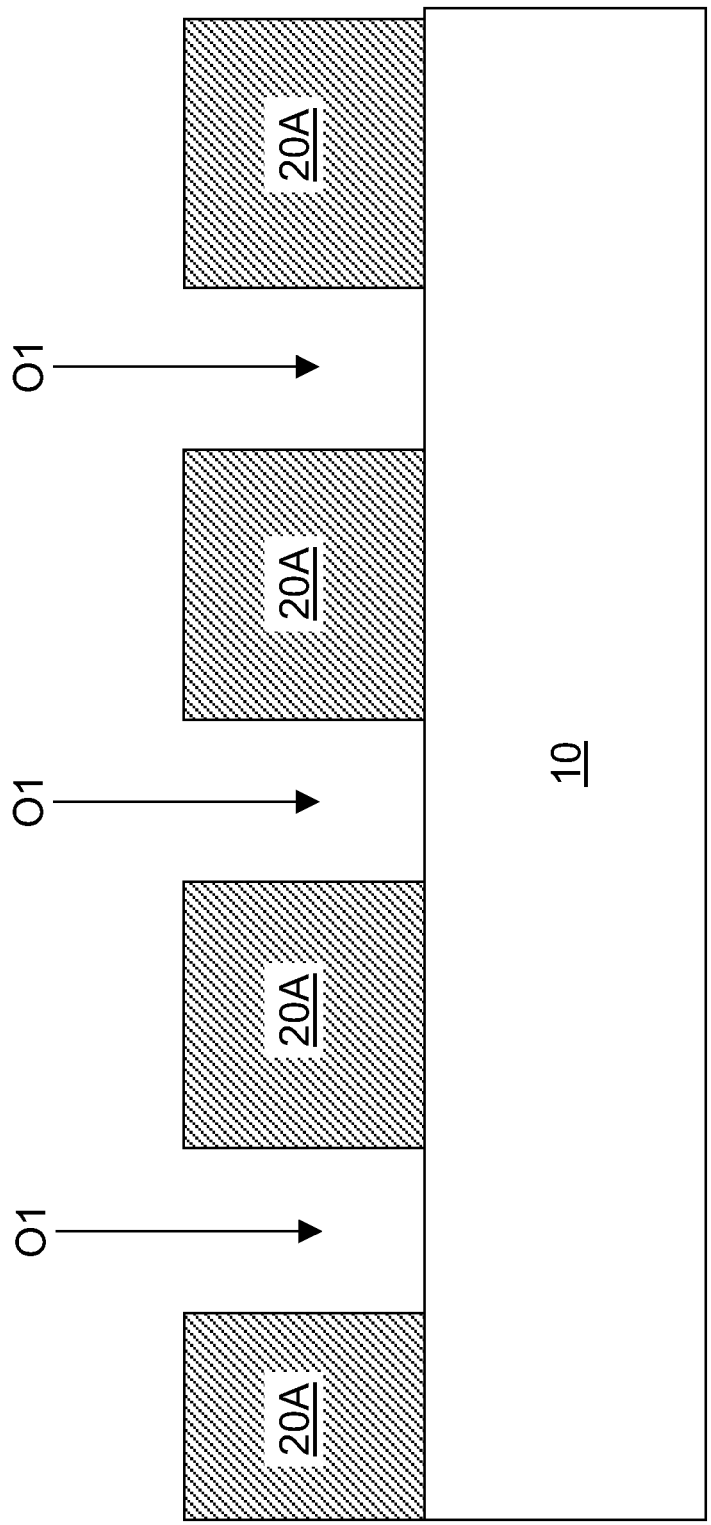

Referring to FIG. 1, a first exemplary nanoscale structure according to a first embodiment of the present invention comprises a first template layer 20A formed on a substrate 10. The lateral extent of the first template layer 20A and the substrate 10 may exceed the lateral range of order of non-photosensitive polymeric resists to be subsequently employed. The substrate 10 may be a semiconductor substrate, an insulator substrate, a metallic substrate, or a combination thereof. The semiconductor substrate may be a silicon substrate, other group IV element semiconductor substrate, or a compound semiconductor substrate. Also, the semiconductor substrate may be a bulk substrate, a semiconductor-on-insulator (SOI) substrate, or a hybrid substrate having a bulk portion and an SOI portion. The first template layer 20A may comprise a semiconductor material or an insulator material. Exemplary semiconductor materials include polysilicon, amorphous silicon, a polycrystalline silicon containing alloy that include germanium or carbon, or an amorphous silicon containing alloy that includes germanium or silicon. Exemplary insulator materials include a dielectric oxide, a dielectric oxynitride, a dielectric nitride, and a porous or non-porous low dielectric constant insulator material (having a dielectric constant less than the dielectric constant of silicon oxide, i.e., 3.9). Further, the first template layer 20 may comprise amorphous carbon or diamond-like carbon such as hydrogen-free amorphous carbon, tetrahedral hydrogen-free amorphous carbon, metal-containing hydrogen-free amorphous carbon, hydrogenated amorphous carbon, tetrahedral hydrogenated amorphous carbon, metal-containing hydrogenated amorphous carbon, and modified hydrogenated amorphous carbon.

The first template layer 20A is first formed as a blanket layer covering the entirety of a top surface of the substrate 10, and subsequently patterned by lithographic methods employing application of a photoresist (not shown), patterning of the photoresist, and an anisotropic etch that transfers the pattern in the photoresist into the first template layer 20A. The pattern contains first openings O1 in the first template layer 20A beneath which the top surface of the substrate 10 is exposed. Each of the first openings O1 has a shape of a regular hexagon of an identical size. Since the first openings O1 are formed by lithographic methods, characteristic dimensions, e.g., the length of a side of the regular hexagon, are lithographic dimensions.

Whether a dimension is a lithographic dimension or a sublithographic dimension depends on whether the dimension may be formed by lithographic patterning methods. The minimum dimension that may be formed by lithographic patterning methods is herein referred to as a "lithographic minimum dimension," or a "critical dimension." While the lithographic minimum dimension is defined only in relation to a given lithography tool and normally changes from generation to generation of semiconductor technology, it is understood that the lithographic minimum dimension and the sublithographic dimension are to be defined in relation to the best performance of lithography tools available at the time of semiconductor manufacturing. As of 2007, the lithographic minimum dimension is about 45 nm and is expected to shrink in the future. A dimension less than the lithographic minimum dimension is a sublithographic dimension, while a dimension equal to or greater than the lithographic minimum dimension is a lithographic dimension.

The location of the first openings O1 is determined by filling a top surface of the first template layer 20A, as formed by blanket deposition or blanket application of the material comprising the first template layer 20A and not containing any pattern, with a hypothetical hexagonal array of regular hexagons. The regular hexagons fill the top surface of the first template layer 20A in the same manner as hexagonal tiles are employed to fill a predefined area. The boundaries of the regular hexagons are represented by broken lines in FIG. 1A. A set of one third of the regular hexagons comprises the first openings O1 such that each of the regular hexagons in the set is separated from other regular hexagons in the same set and form another hexagonal array, a unit hexagon of which is shown by double dotted lines in FIG. 1A. This hexagonal array is of the first openings is herein referred to as a "first hexagonal array." Thus, the area of the first openings O1 is approximately one third of the entire area of the top surface of the first template layer 20A prior to patterning.

The length of a side of the regular hexagon is a lithographic dimension, and for example, may be greater than 45 nm. Typical range of the length of the side of the regular hexagon that would be practicable in 2007 is from about 45 nm to about 1,000 nm, and more typically, from about 45 nm to about 100 nm.

Figure 2A:
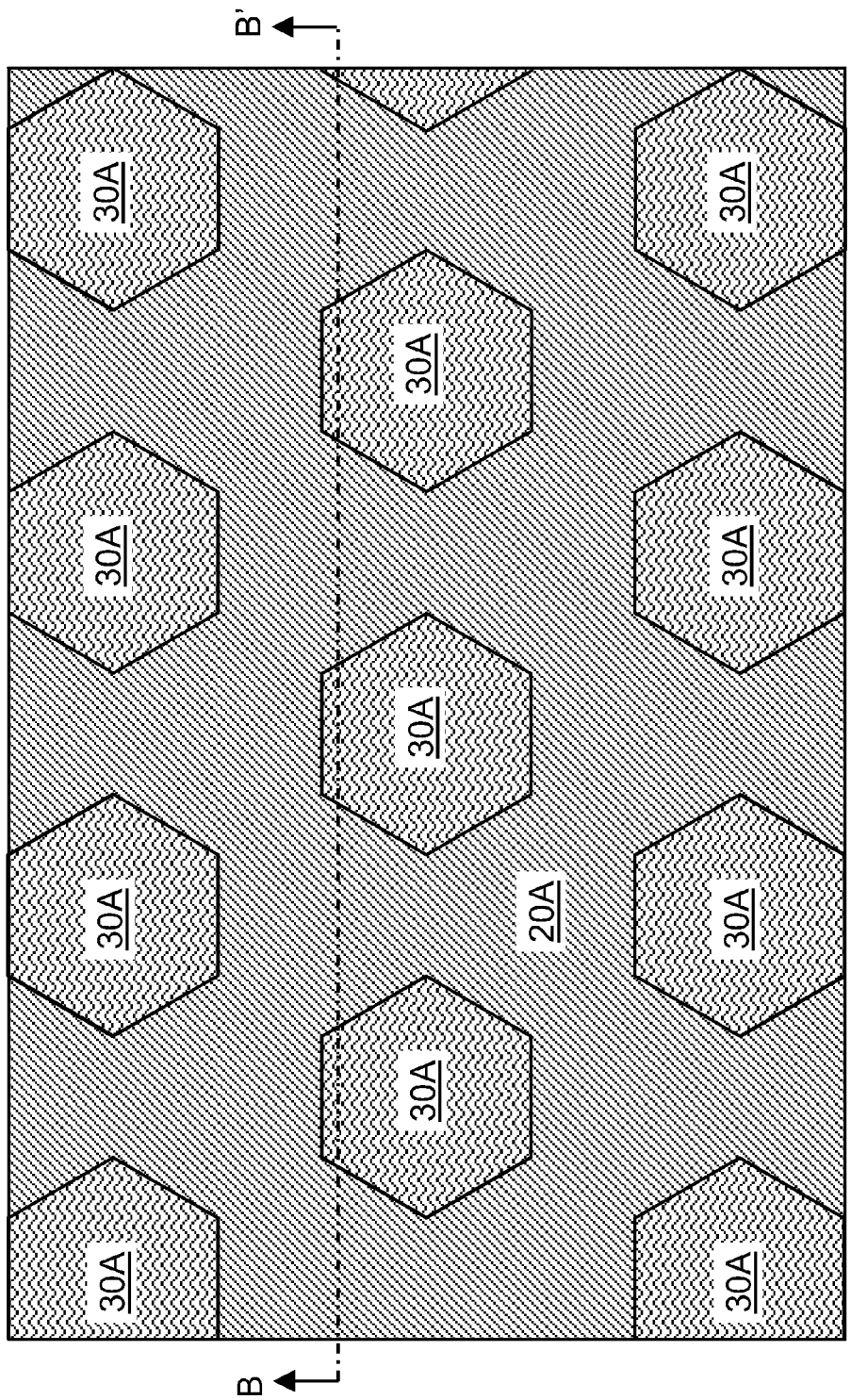
Figure 2B:
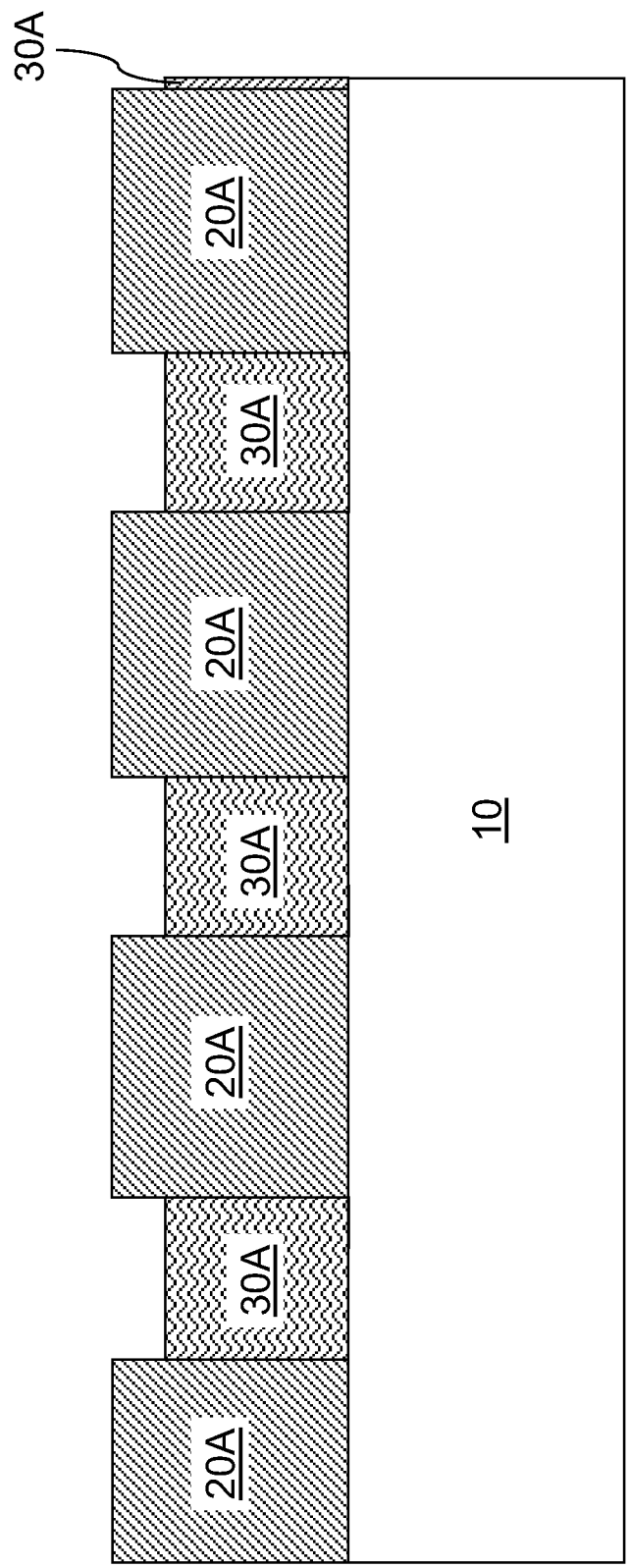

Referring to FIGS. 2A and 2B, a first non-photosensitive polymeric resist is applied within each of the first openings O1 by methods well known in the art, such as spin coating to form first non-photosensitive polymeric resist portions 30A. Preferably, the top surface of the first non-photosensitive polymeric resist portions 30A is coplanar with the top surface of the first template layer 20A or recessed below the top surface of the first template layer 20A. The first non-photosensitive polymeric resist comprises self-assembling block copolymers that are capable of self-organizing into nanometer-scale patterns.

The first non-photosensitive polymeric resist comprises a first polymeric block component and a second polymeric block component that are immiscible with each other. The non-photosensitive polymeric resist may be self-planarizing. Alternatively, the non-photosensitive polymeric resist may be planarized by chemical mechanical planarization, a recess etch, or a combination thereof.

Exemplary materials for the first polymeric block component and the second polymeric block component are described in commonly-assigned, copending U.S. patent application Ser. No. 11/424,963, filed on Jun. 19, 2006, the contents of which are incorporated herein by reference. Specific examples of self-assembling block copolymers for the non-photosensitive polymeric resist that can be used for forming the structural units of the present invention may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA). The self-assembling block copolymers are first dissolved in a suitable solvent system to form a block copolymer solution, which is then applied onto the surface of the first exemplary structure to form the non-photosensitive polymeric resist. The solvent system used for dissolving the block copolymer and forming the block copolymer solution may comprise any suitable solvent, including, but not limited to: toluene, propylene glycol monomethyl ether acetate (PGMEA), propylene glycol monomethyl ether (PGME), and acetone. The non-photosensitive polymeric resist is not a conventional photoresist that may be developed upon exposure to ultraviolet light or optical light. Also, the non-photosensitive polymeric resist is not a conventional low-k dielectric material.

Figure 3A:
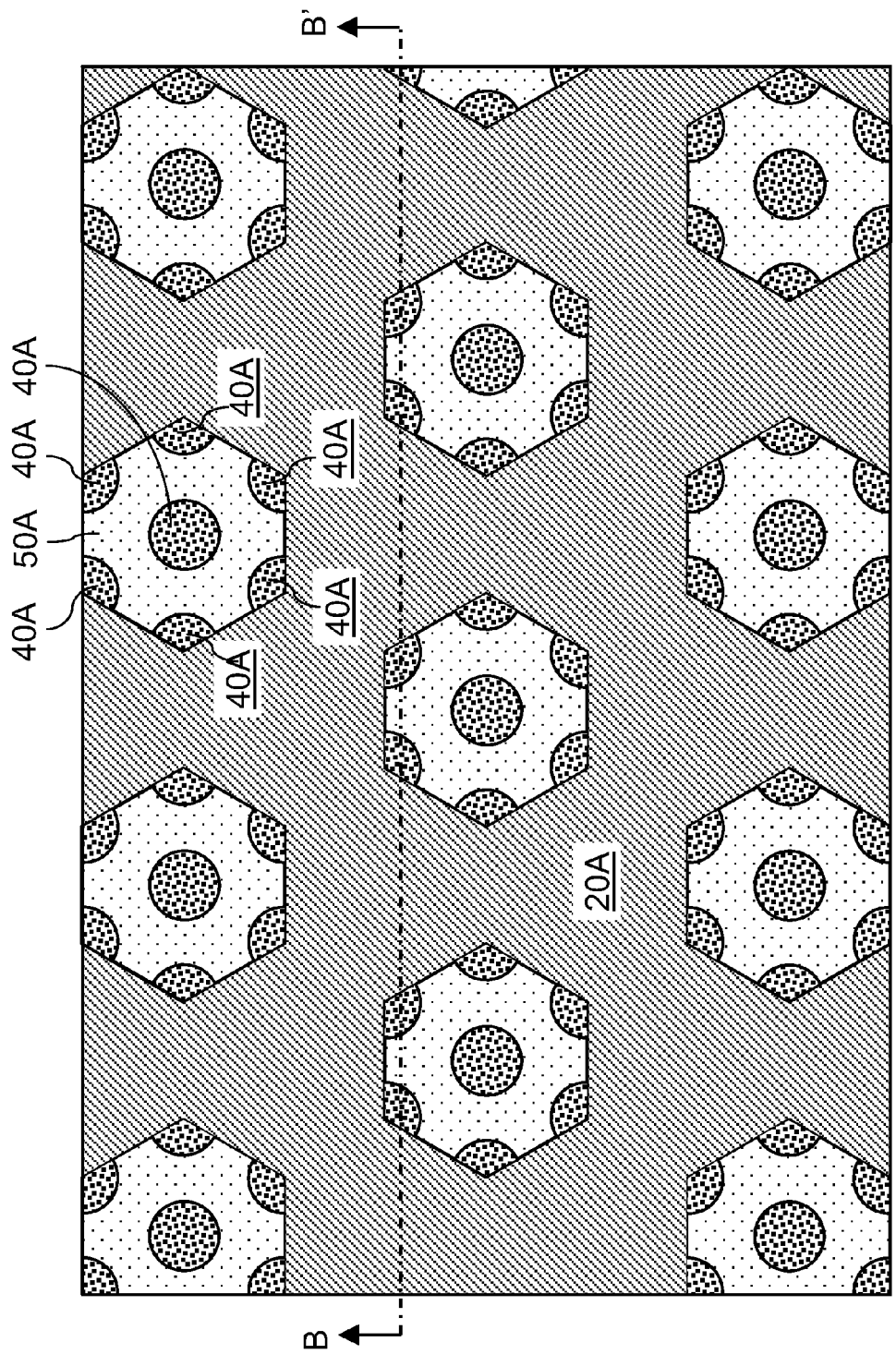
Figure 3B:
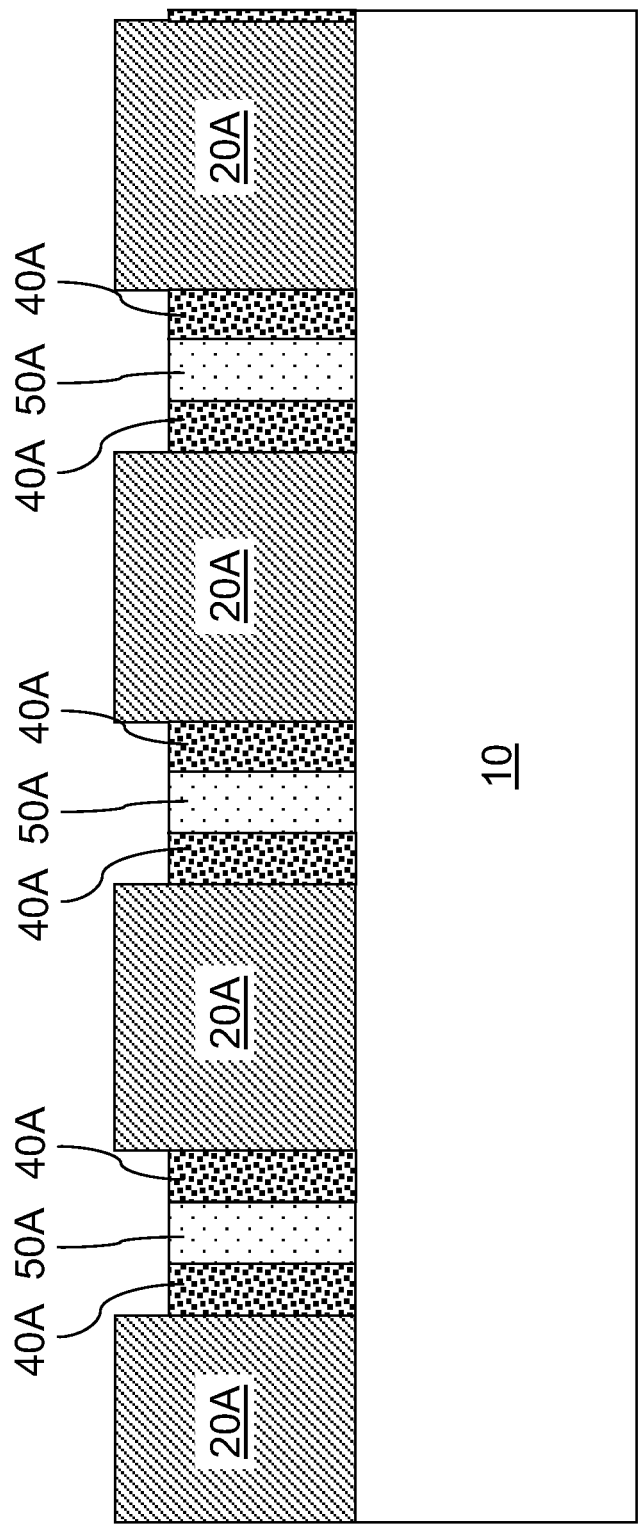

Referring to FIGS. 3A and 3B, a first nanoscale self-assembled self-aligned structure is formed within each of the first openings O1 by causing cross-linking of the self-assembling block copolymers through annealing. Specifically, the first non-photosensitive polymeric resist is annealed by ultraviolet treatment or by thermal annealing at an elevated temperature to form first columnar polymeric structures 40A comprising the first polymeric block component and a first polymeric matrix 50A comprising the second polymeric block component and laterally abutting the sidewalls of the first columnar polymeric structures 40A.

Exemplary processes of annealing the self-assembling block copolymers in the block copolymer layer to form two sets of polymer blocks are described in Nealey et al., "Self-assembling resists for nanolithography," IEDM Technical Digest, December, 2005, Digital Object Identifier 10.1109/IEDM.2005.1609349, the contents of which are incorporated herein by reference. Methods of annealing described in the '963 Application may be employed. The anneal may be performed, for example, at a temperature from about 200° C. to about 300° C. for a duration from less than about 1 hour to about 100 hours.

The first columnar polymeric structures 40A comprises at least one circular cylinder and six fractional circular cylinders each corresponding to one third of one of the at least one circular cylinder and contains an arc spanning an angle substantially equal to 120 degrees, or $2\pi/3$. In other words, each of the six fractional circular cylinders may be obtained by subdividing one of the at least one circular cylinders into three equal parts by three radial cuts, each separated by 120 degrees and originating from a center axis of the one circular cylinder. Thus, each of the six fractional circular cylinders has two rectangular surfaces that meet at a ridge at an angle of 120 degrees. The ridge of a fractional circular cylinder is located at a corner of a regular hexagon forming one of the first nanoscale self-assembled self-aligned structures (40A, 50A). The formation of the six fractional circular cylinders is effected by selecting the material for the first template layer 20A and the first and second polymeric block components such that the first polymeric block component "wets" the walls of the first template layer 20A by surface tension. For example, the composition and the mean molecular weight of the first polymeric block component may be manipulated to make the first polymeric block component more wetting or less wetting to the surface of the material selected for the first template layer 20A.

The first nanoscale self-assembled self-aligned structures (40A, 50A) are "self-assembled." The chemical composition of the first non-photosensitive polymeric resist is such that the immiscibility of the first and second polymeric block components enable self assembly of the first polymeric block component into the first columnar polymeric structures 40A, i.e., the at least one circular cylinder and the six fractional circular cylinders. The second polymeric block component assembles into the first polymeric block matrix 50A.

The first nanoscale self-assembled self-aligned structures (40A, 50A) are "self-aligned" to the walls of the first template layer 20A that define the first openings O1. Specifically, each of the first nanoscale self-assembled self-aligned structures (40A, 50A) is confined within the area of a regular hexagon that corresponds to one of the first openings O1 (See FIG. 1A). Further, due to self-assembly and wetting characteristics, each of the at least one circular cylinder and the six fractional circular cylinders is self-aligned relative to the regular hexagon. The at least one circular cylinder may comprise a single cylinder, seven cylinders, or any plurality of cylinders compatible with formation of a hexagonal array of cylinders within each of the first openings O1. In case the total number of the at least one circular cylinder exceeds seven in each of the first openings O1, half cylinders (not shown), each being equivalent to half of one of the at least one circular cylinder, comprising the first polymeric block component may be formed within the each of the first openings O1 such that an hexagonal periodicity is satisfied by the at least one circular cylinder, the six fractional circular cylinders, and the half cylinders.

In one illustrative case, a "honeycomb" structure is formed with in a poly (methyl methacrylate b-styrene) (PMMA-b-S) block copolymer. In the case of cylindrical phase diblock, the PMMA-b-S block can separate to form vertically oriented cylinders within the matrix of the polystyrene block upon thermal annealing.

Figure 4A:
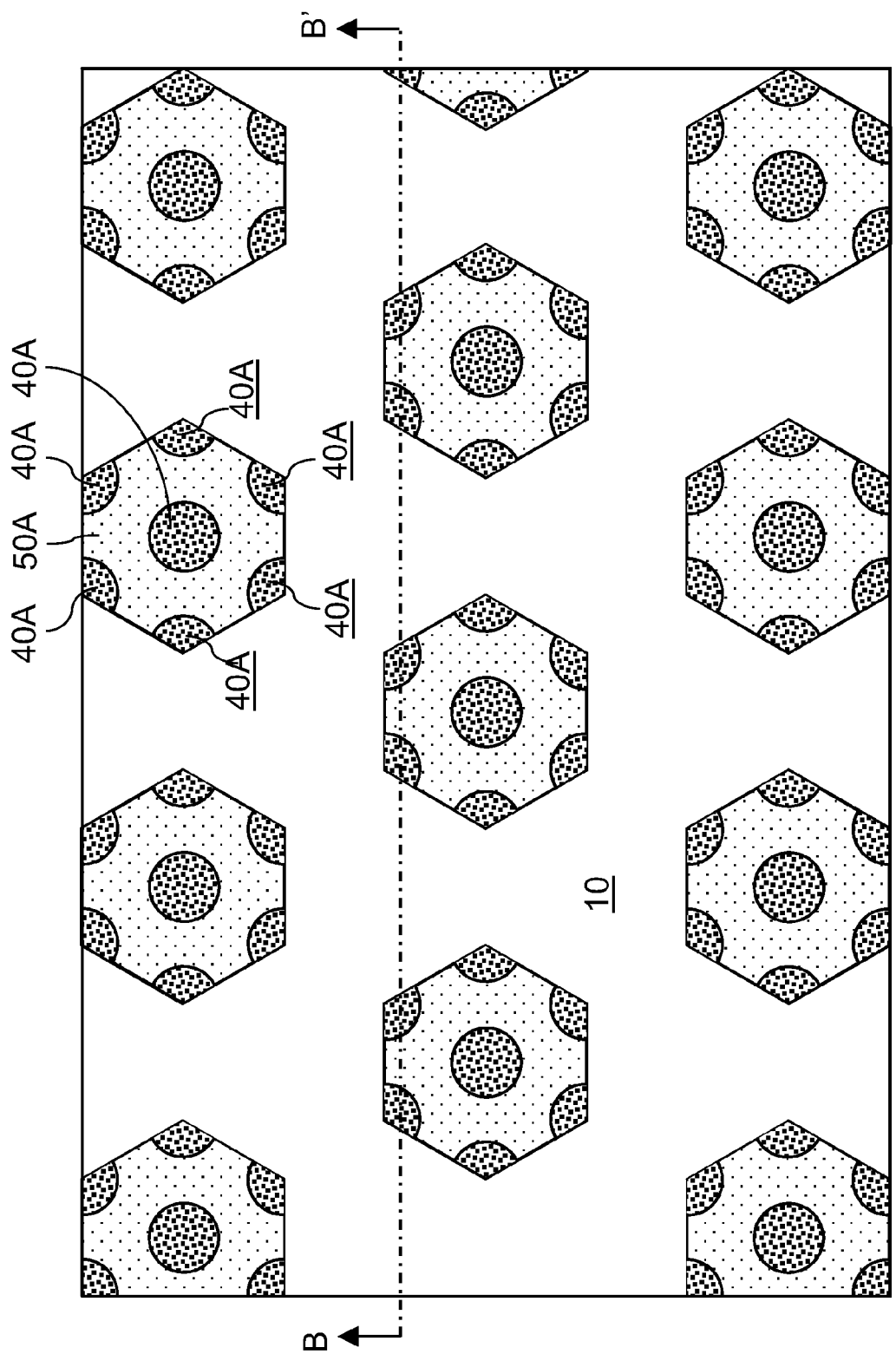
Figure 4B:
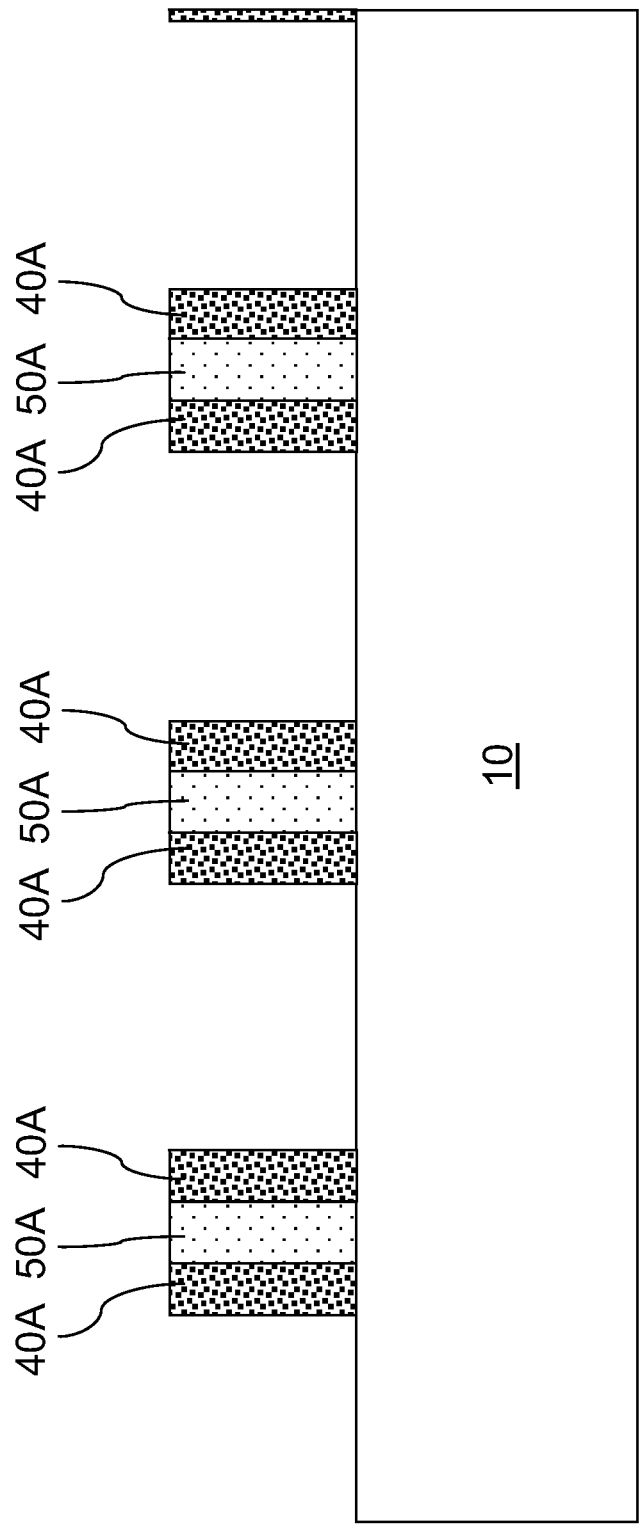

Referring to FIGS. 4A and 4B, the first template layer 20A is removed selective to the first nanoscale self-assembled self-aligned structures (40A, 50A) and the substrate 10. A wet etch or a dry etch may be employed. The collection of the first nanoscale self-assembled self-aligned structures (40A, 50A) constitutes a hexagonal array, in which a unit cell comprises one instance of the first nanoscale self-assembled self-aligned structures (40A, 50A) and a space not containing any of the first nanoscale self-assembled self-aligned structures (40A, 50A) and having a volume equal to two instances of the first nanoscale self-assembled self-aligned structures (40A, 50A).

Figure 5A:
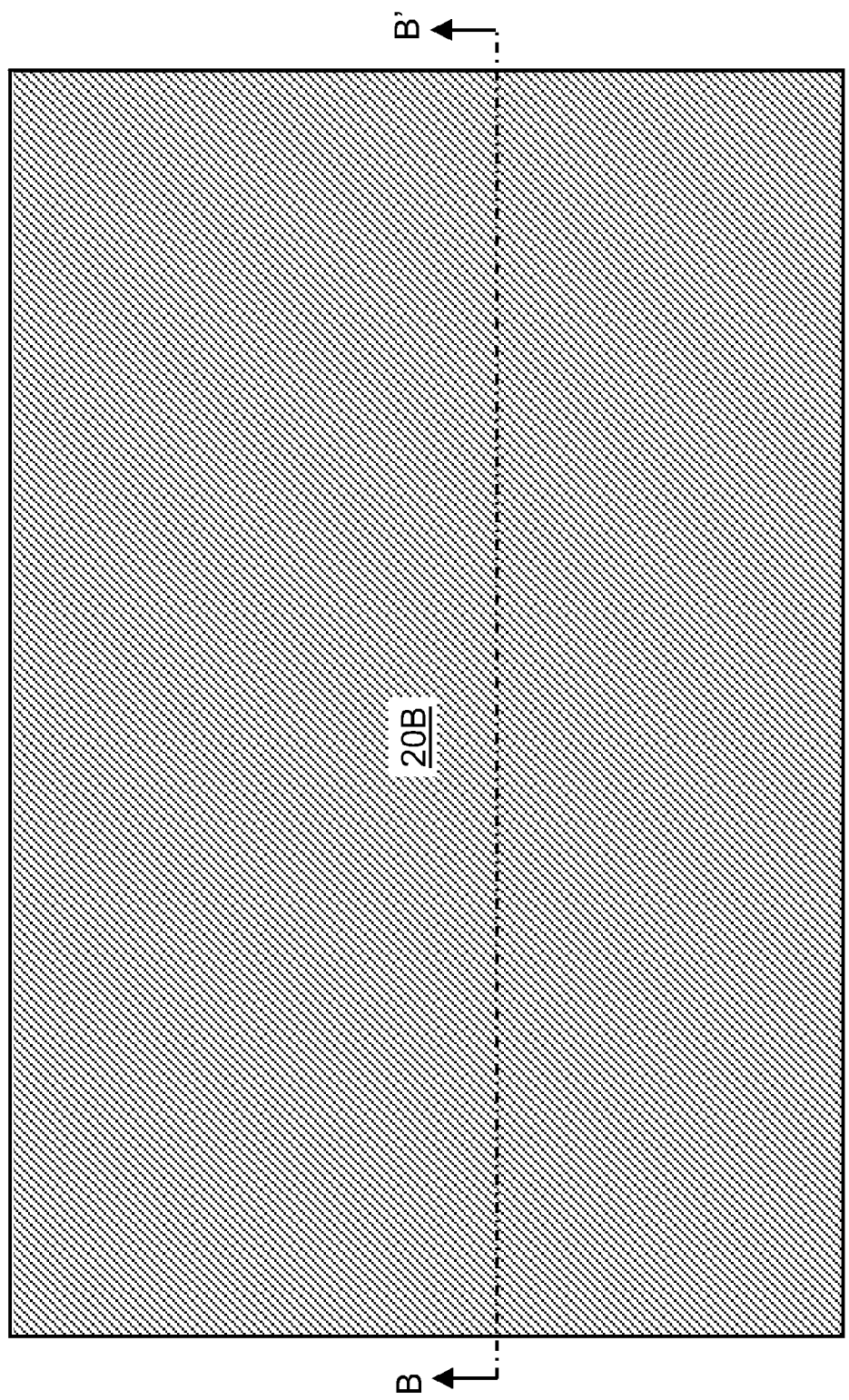
Figure 5B:
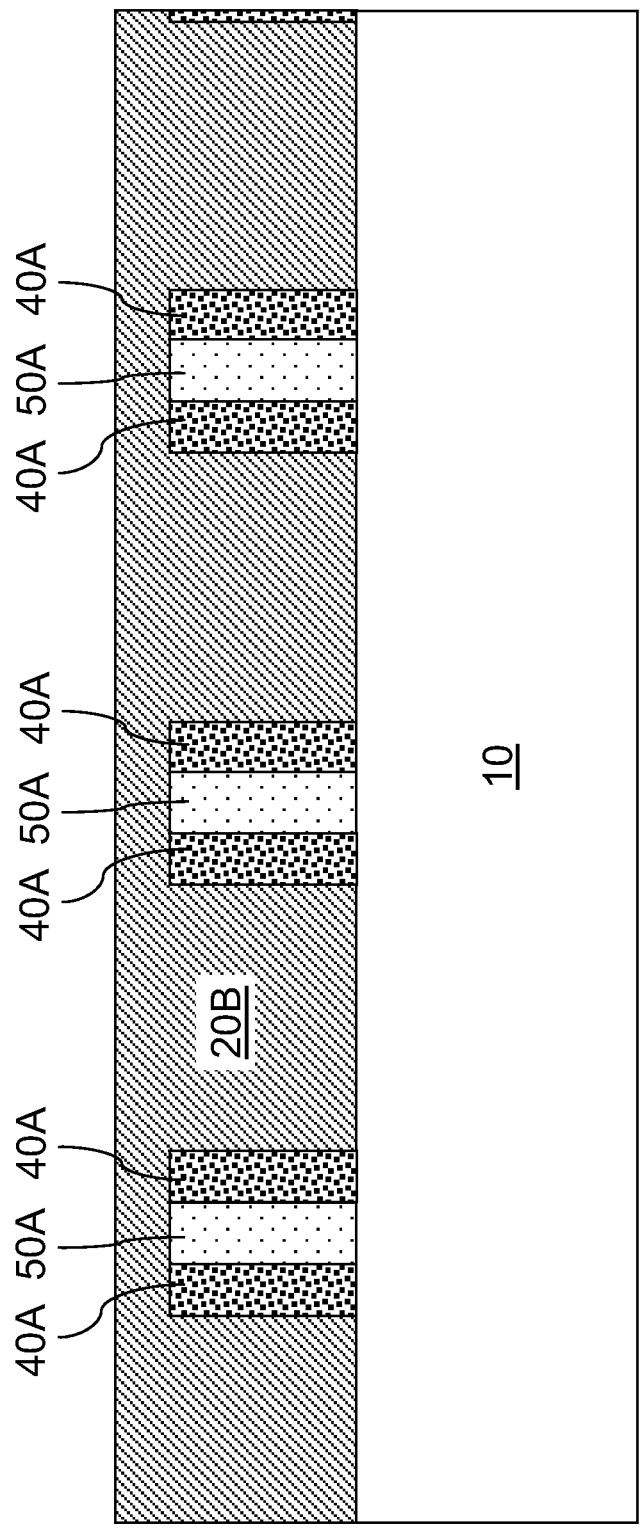

Referring to FIGS. 5A and 5B, a second template layer 20B is formed over the first nanoscale self-assembled self-aligned structures (40A, 50A) and the substrate 10. The second template layer 20B may be selected from the materials that may be employed as the first template layer 20A. The second template layer 20B may comprise the same material as, or a different material from, the first template layer 20A. The second template layer 20B is formed as a blanket layer and covers top surfaces of the first nanoscale self-assembled self-aligned structures (40A, 50A).

Figure 6A:
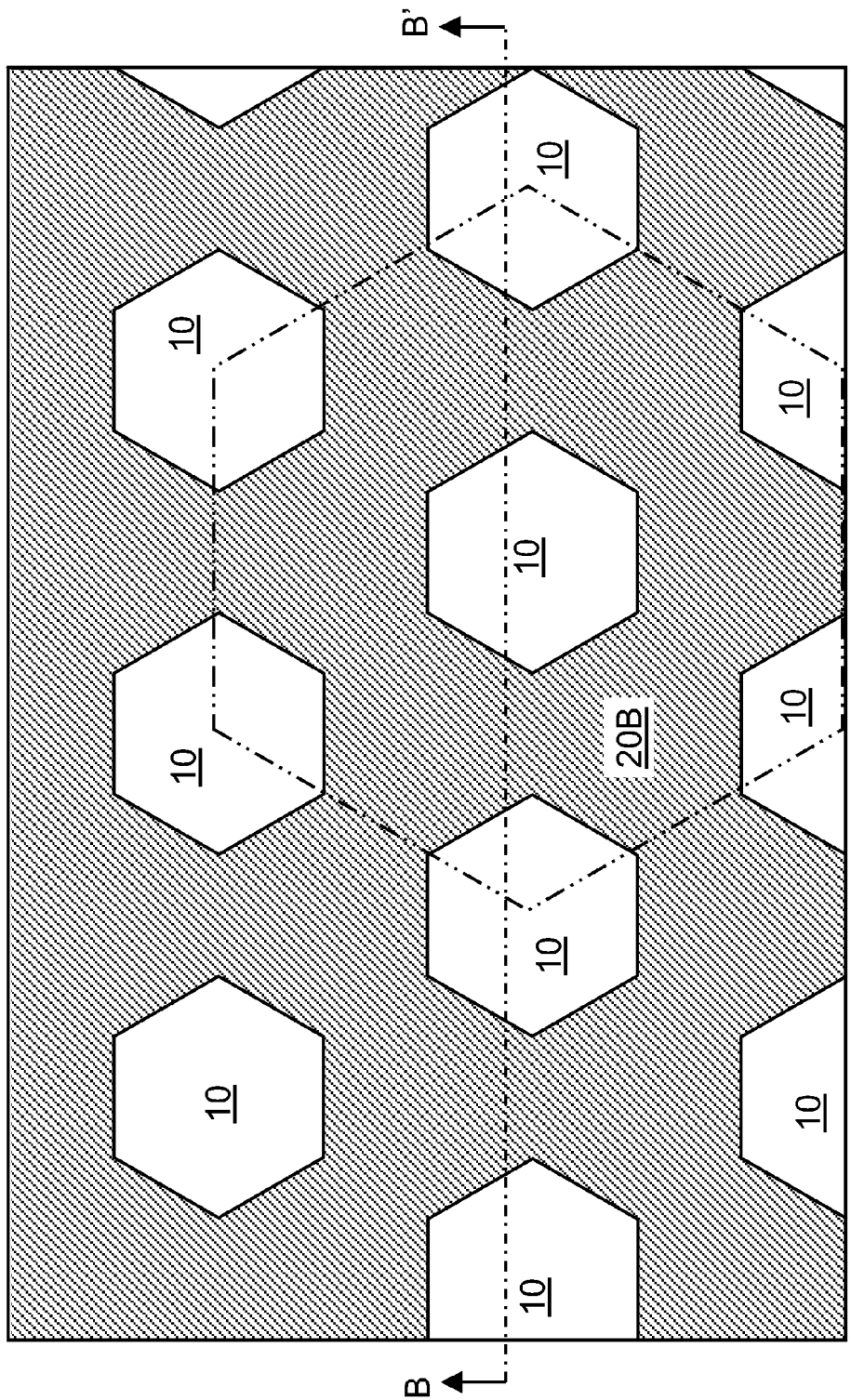
Figure 6B:
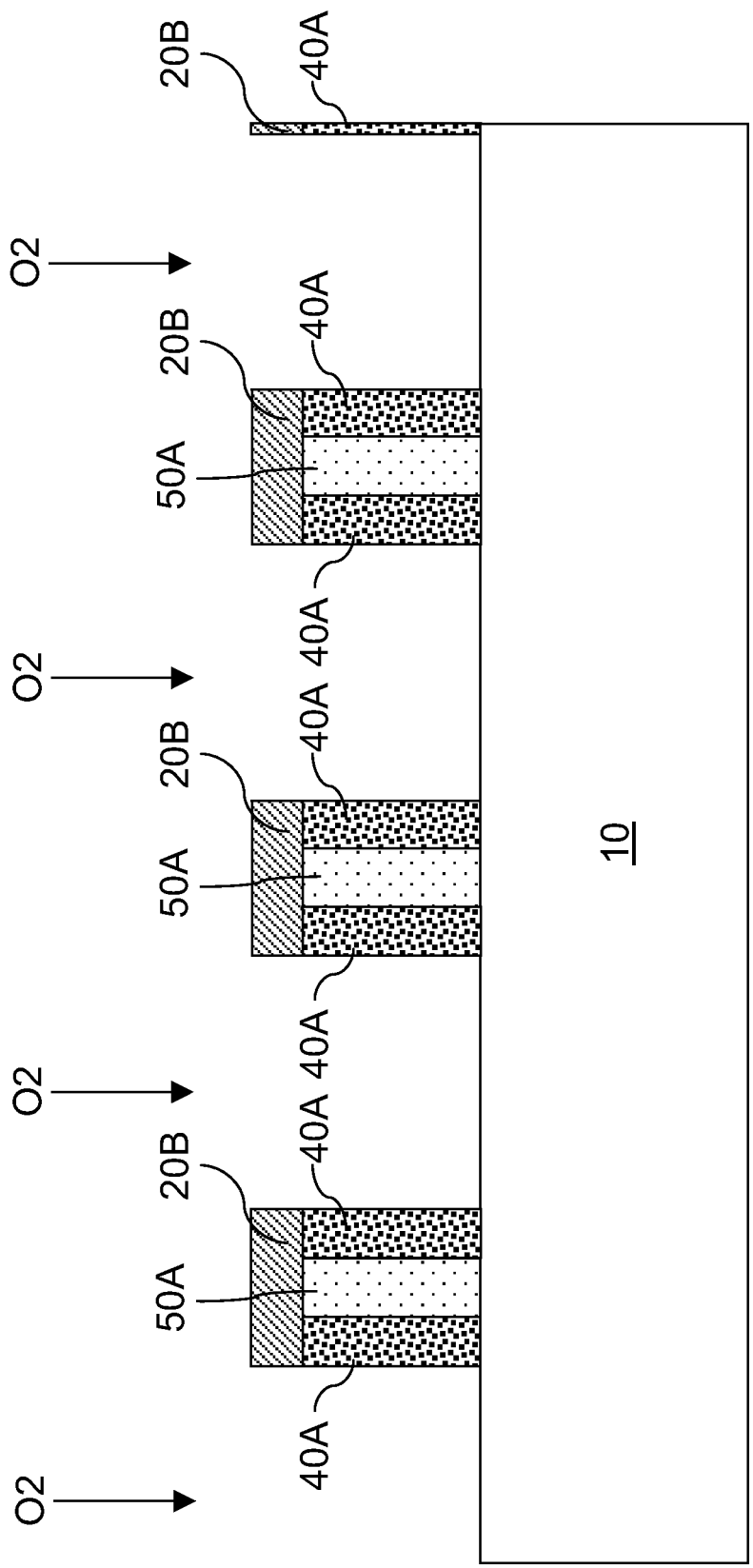

Referring to FIGS. 6A and 6B, the second template layer 20B is subsequently patterned by lithographic methods employing application of a photoresist (not shown), patterning of the photoresist, and an anisotropic etch that transfers the pattern in the photoresist into the second template layer 20B. The pattern contains second openings O2 in the second template layer 20B beneath which the top surface of the substrate 10 is exposed. Each of the second openings O2 has a shape of the regular hexagon, which is the shape of the first openings O1 (See FIG. 1A). Since the second openings O2 are formed by lithographic methods, characteristic dimensions, e.g., the length of a side of the regular hexagon, are lithographic dimensions.

The size and orientation of each of the second openings O2 is identical to the size of each of the first openings O1. The location of the second openings O2 is obtained by shifting the pattern of the first openings O1 by one regular hexagon of the size of one of the first openings O1 in a direction perpendicular to one of the sides of the regular hexagon. Thus, each instance of the second openings O2 does not overlap any of the first openings O1 or any other instance of the second openings O2. A set of one third of the regular hexagons in FIG. 1A comprises the second openings O2 such that each of the regular hexagons in this set is separated from other regular hexagons in the same set. The second openings O2 forms another hexagonal array, a unit hexagon of which is shown by double dotted lines in FIG. 6A. This hexagonal array is herein referred to as a "second hexagonal array." The second hexagonal array is offset from the first hexagonal array by an instance of the regular hexagon. The area of the second openings O2 is approximately one third of the entire area of the top surface of the second template layer 20B prior to patterning.

Figure 7A:
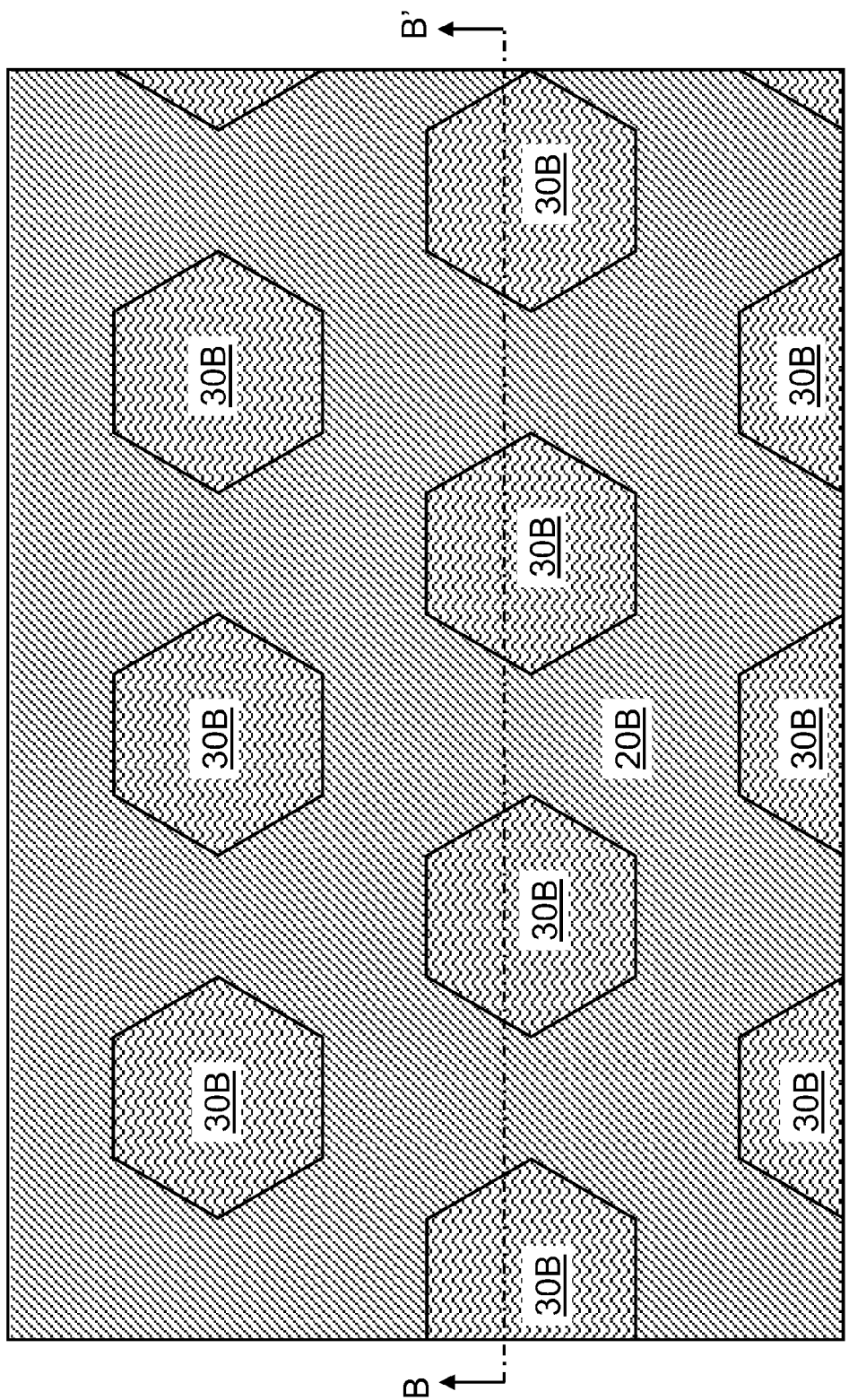
Figure 7B:
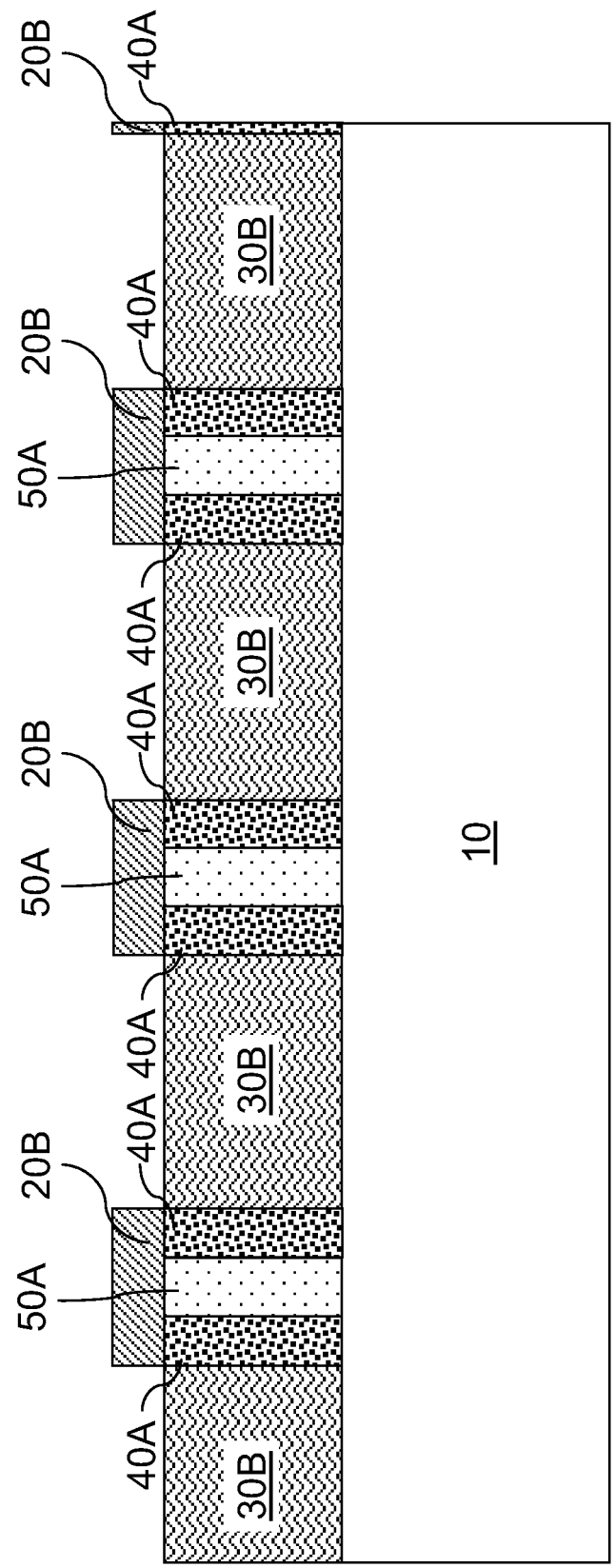

Referring to FIGS. 7A and 7B, a second non-photosensitive polymeric resist is applied within each of the second openings O2 by methods well known in the art, such as spin coating to form second non-photosensitive polymeric resist portions 30B. Preferably, the top surface of the second non-photosensitive polymeric resist portions 30B is recessed below the top surface of the second template layer 20B. Also preferably, the top surface of the second non-photosensitive polymeric resist portions 30B is coplanar with top surfaces of the first nanoscale self-assembled self-aligned structures (40A, 50A). The second non-photosensitive polymeric resist may be applied to be coplanar with, or above, the top surfaces of the second template layer 20B, and then recessed to the height of the top surfaces of the first nanoscale self-assembled self-aligned structures (40A, 50A) by a recess etch or by employing a dilute solution from which subsequent evaporation of a solvent causes volume contraction within each of the second openings O2.

The second non-photosensitive polymeric resist comprises self-assembling block copolymers that are capable of self-organizing into nanometer-scale patterns. Thus, any of the material listed above for the first non-photosensitive polymeric resist may be employed for the second non-photosensitive polymeric resist. The second non-photosensitive polymeric resist may comprise the same material as, or a different material from the first photosensitive polymeric resist. For the purposes of illustrating the present invention, it is assumed that the same material is employed for the first non-photosensitive polymeric resist and the second non-photosensitive polymeric resist.

Figure 8A:
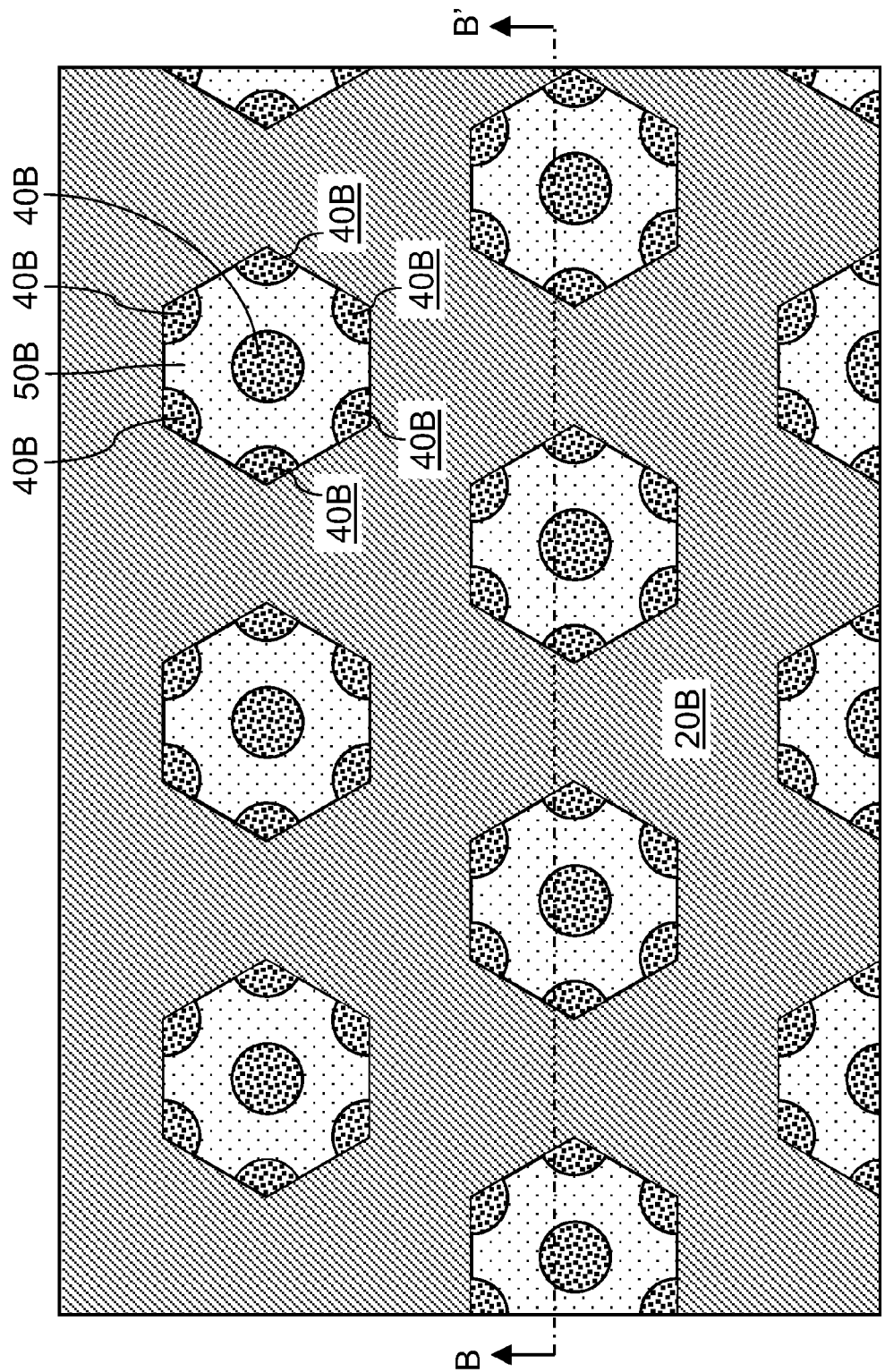
Figure 8B:
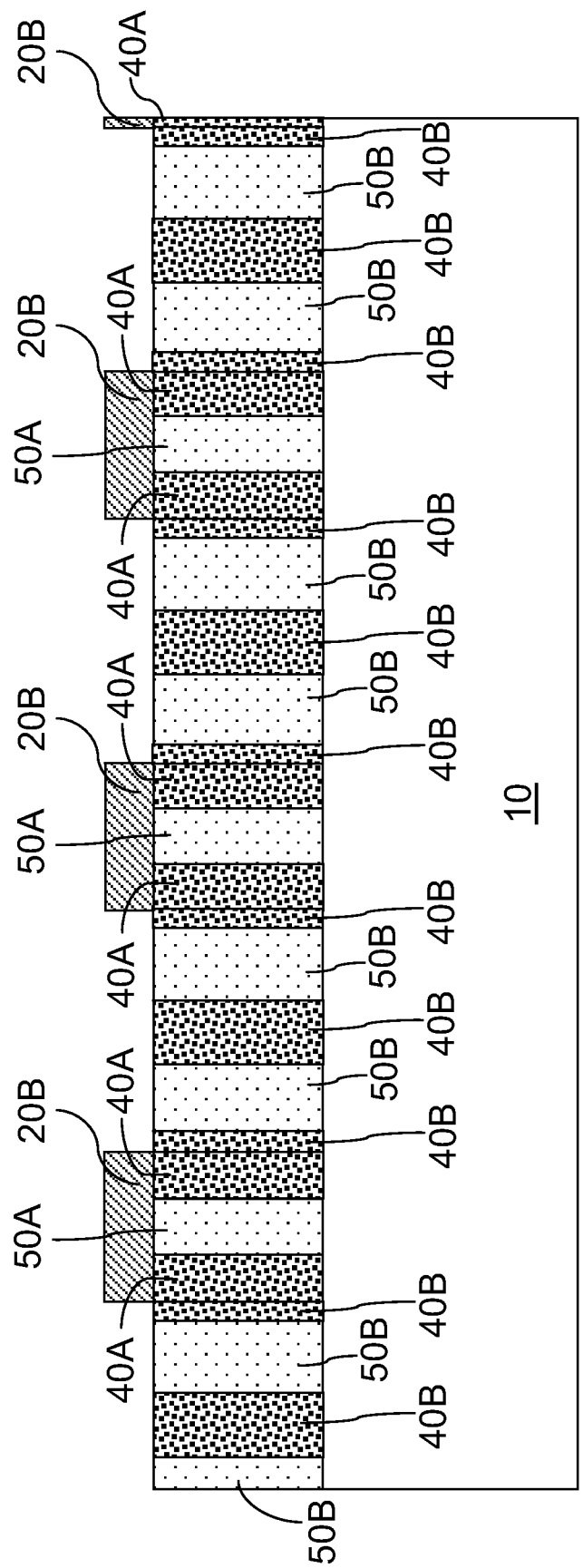

Referring to FIGS. 8A and 8B, a second nanoscale self-assembled self-aligned structure is formed within each of the second openings O2 by causing cross-linking of the self-assembling block copolymers through annealing. The same method employed for the formation of the first nanoscale self-assembled self-aligned structures (40A, 50A) may be employed to form the second nanoscale self-assembled self-aligned structures.

Each of the second nanoscale self-assembled self-aligned structures comprises second columnar polymeric structures 40B and a second polymeric block matrix 50B. The second columnar polymeric structures 40B comprises at least one circular cylinder and six fractional circular cylinders each corresponding to one third of one of the at least one circular cylinder and contains an arc spanning an angle substantially equal to 120 degrees, or $2\pi/3$. Thus, each of the second columnar polymeric structures 40B has the same structure as one of the first columnar polymeric structures 40A described above, and formed by the same methods. The second polymeric matrix 50B comprises the second polymeric block component and laterally abuts each of the second columnar polymeric structures 40B.

The second nanoscale self-assembled self-aligned structures (40B, 50B) are self-assembled and self-aligned in the same sense that the first nanoscale self-assembled self-aligned structures (40A, 50A) are self-assembled and self-aligned, since the same mechanism is employed for the self-assembly and self-alignment of the various components of the second nanoscale self-assembled self-aligned structures (40B, 50B). Thus, each instance of the second columnar polymeric structures 40B comprises the same components and is congruent to an instance of the first columnar polymeric structures 40A, and each instance of the second polymeric matrices 50B comprises the same material and is congruent to an instance of second columnar polymeric matrices 50A.

Figure 9A:
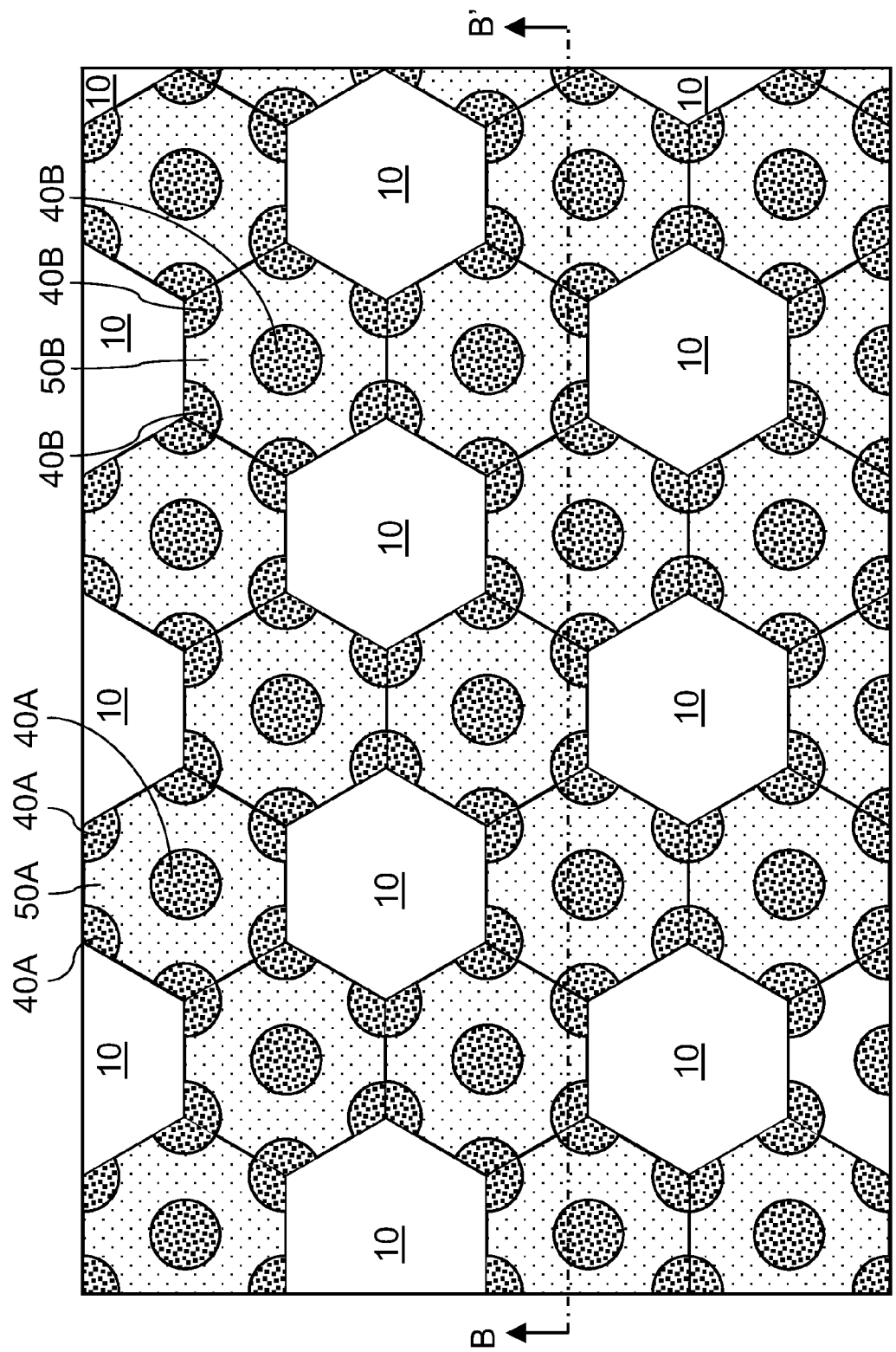
Figure 9B:
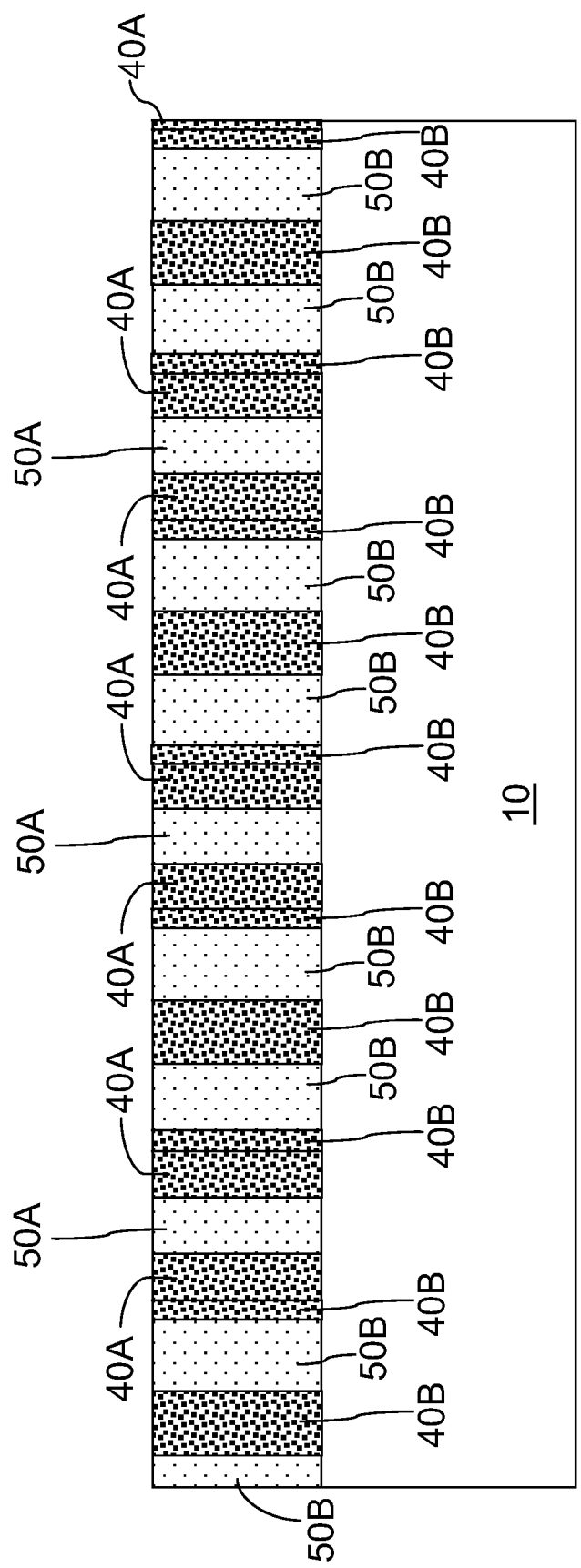

Referring to FIGS. 9A and 9B, the second template layer 20B is removed selective to the first nanoscale self-assembled self-aligned structures (40A, 50A), the second nanoscale self-assembled self-aligned structures (40B, 50B), and the substrate 10. A wet etch or a dry etch may be employed.

Figure 10A:
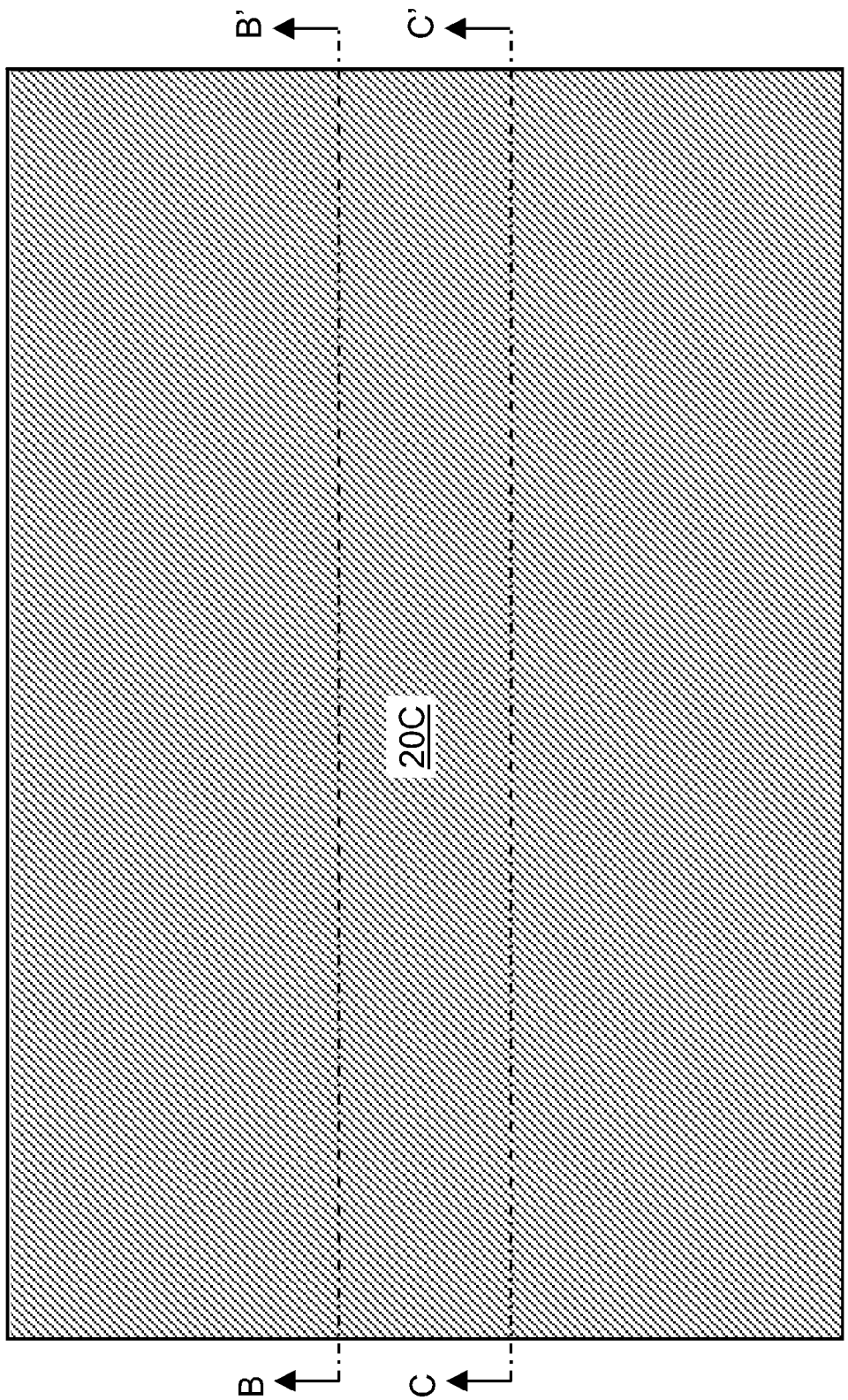
Figure 10B:
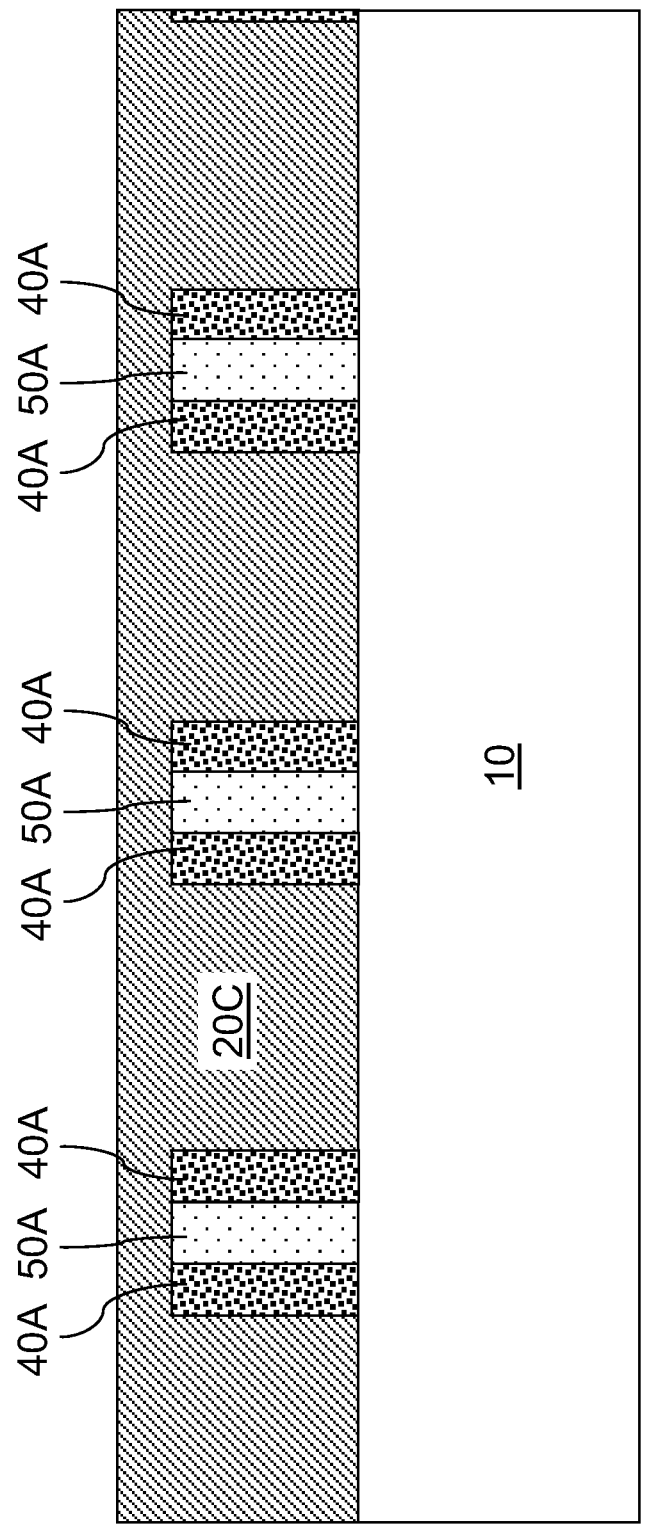
Figure 10C:
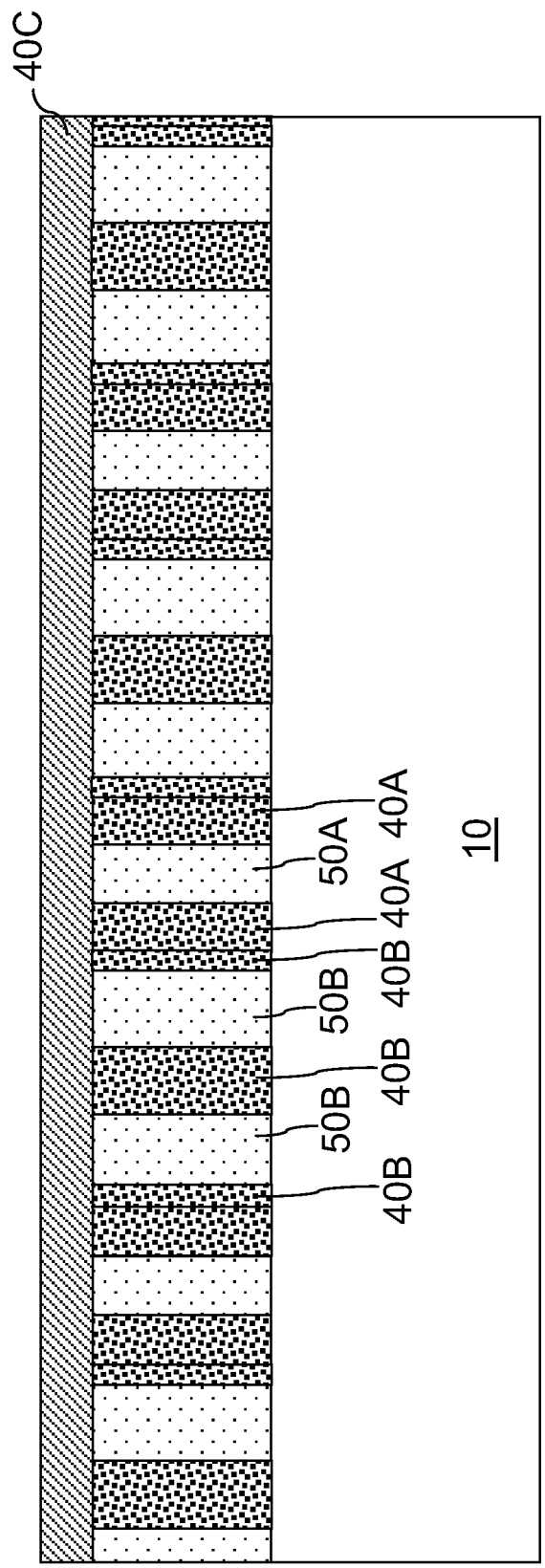

Referring to FIGS. 10A-10C, a third template layer 20C is formed over the first nanoscale self-assembled self-aligned structures (40A, 50A), the second nanoscale self-assembled self-aligned structures (40B, 50B), and the substrate 10. The third template layer 20C may be selected from the materials that may be employed as the first template layer 20A. The third template layer 20C may comprise the same material as, or a different material from, the first template layer 20A. The third template layer 20C covers top surfaces of the first nanoscale self-assembled self-aligned structures (40A, 50A) and the second nanoscale self-assembled self-aligned structures (40B, 50B).

Figure 11A:
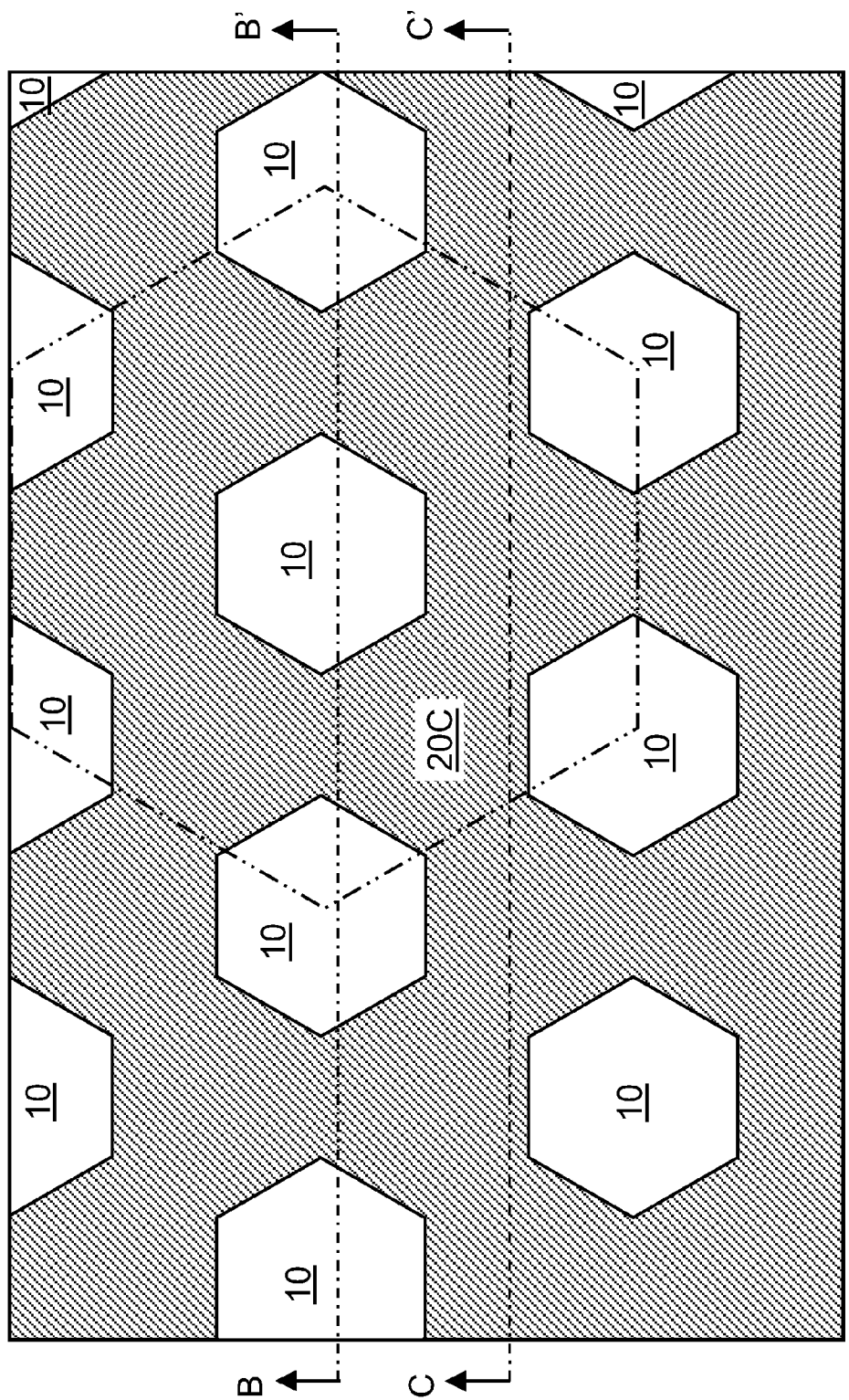
Figure 11B:
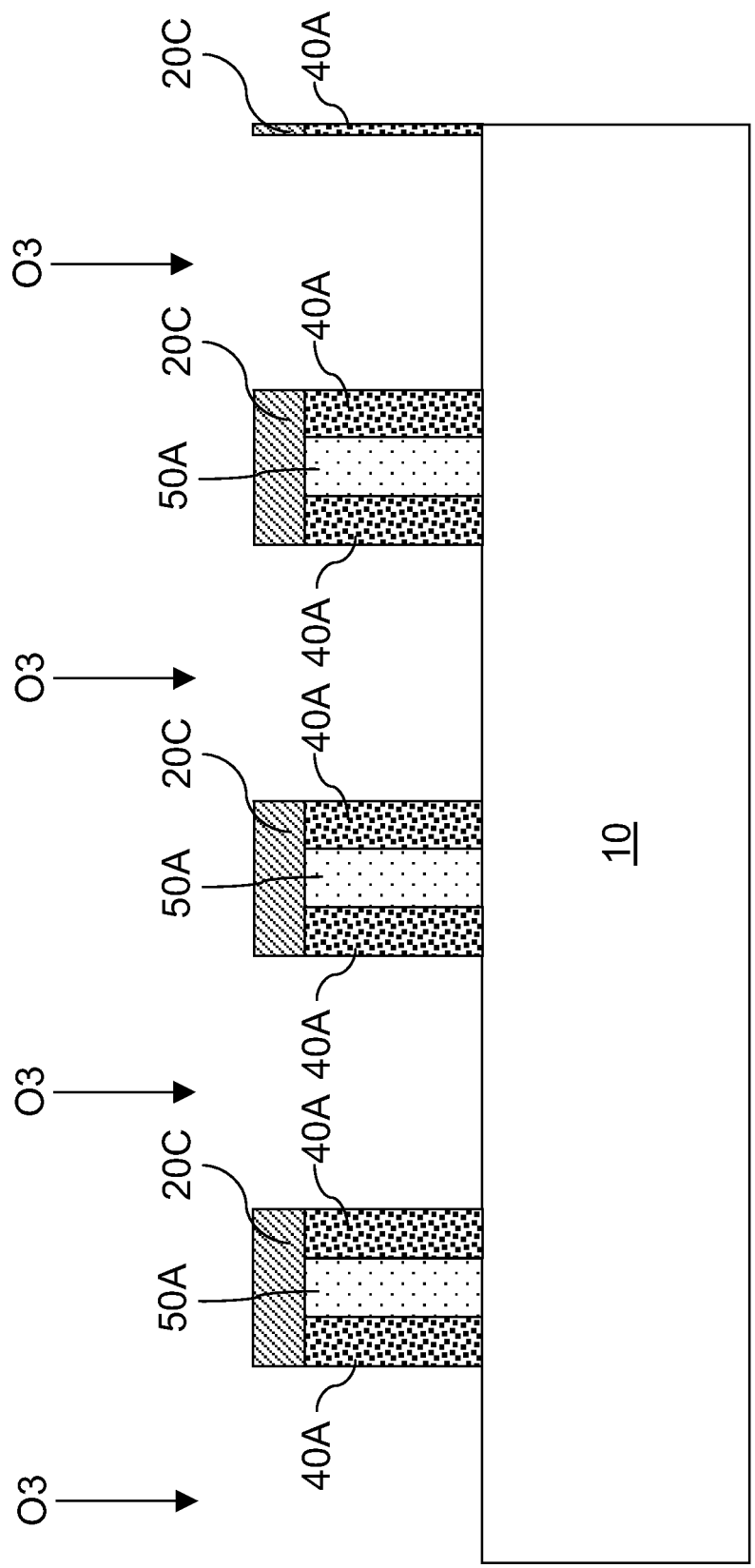
Figure 11C:
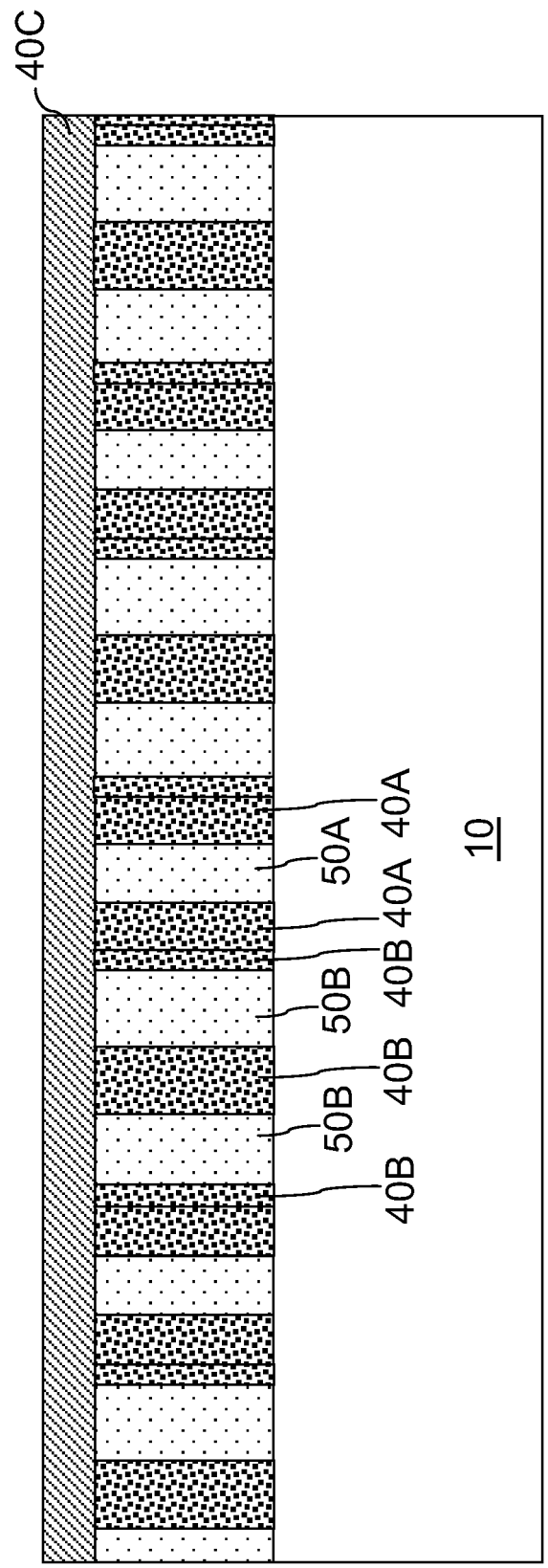

Referring to FIGS. 11A-11C, the third template layer 20C is subsequently patterned by lithographic methods employing application of a photoresist (not shown), patterning of the photoresist, and an anisotropic etch that transfers the pattern in the photoresist into the third template layer 20C. The pattern contains third openings O3 in the third template layer 20C beneath which the top surface of the substrate 10 is exposed. Each of the third openings O3 has a shape of the regular hexagon, which is the shape of the first openings O1 (See FIG. 1A). Since the third openings O3 are formed by lithographic methods, characteristic dimensions, e.g., the length of a side of the regular hexagon, are lithographic dimensions.

The size and orientation of each of the third openings O3 is identical to the size of each of the first openings O1. The location of the third openings O3 is obtained by shifting the pattern of the first openings O1 by one regular hexagon of the size of one of the first openings O1 in a direction perpendicular to one of the sides of the regular hexagon such that the direction of shift is 60 degrees apart from the direction of shift employed to generate the second openings O2 from the first openings O1. Thus, each instance of the third openings O3 does not overlap any of the first openings O1, the second openings O2, or any other instance of the third openings O3. A set of one third of the regular hexagons in FIG. 1A comprises the third openings O3 such that each of the regular hexagons in this set is separated from other regular hexagons in the same set. The third openings O3 forms another hexagonal array, a unit hexagon of which is shown by double dotted lines in FIG. 11A. This hexagonal array is herein referred to as a "third hexagonal array." The third hexagonal array is offset from the first hexagonal array by an instance of the regular hexagon. The third hexagonal array is also offset from the second hexagonal array by another instance of the regular hexagon. The area of the third openings O3 is approximately one third of the entire area of the top surface of the third template layer 20C prior to patterning.

Figure 12A:
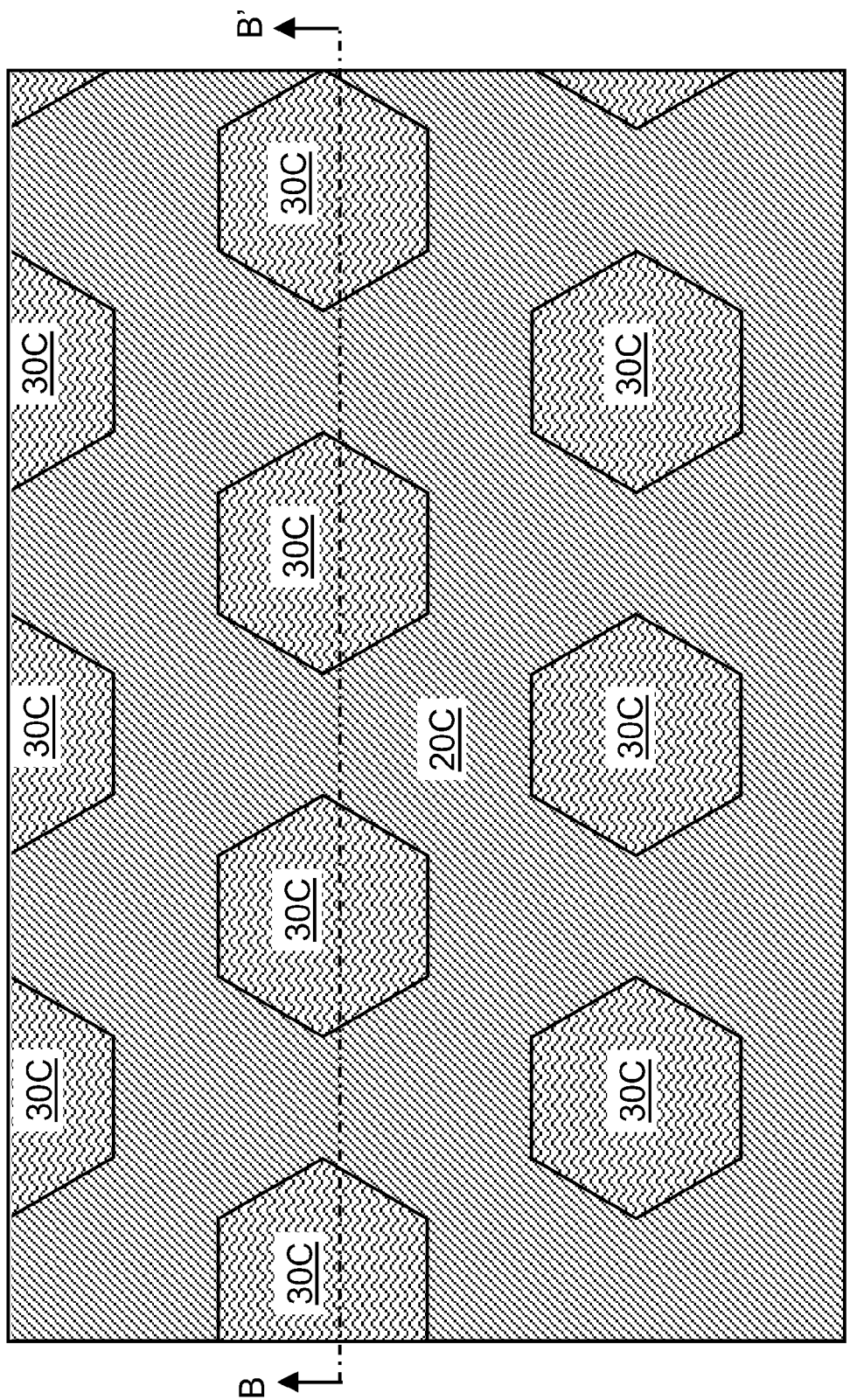
Figure 12B:
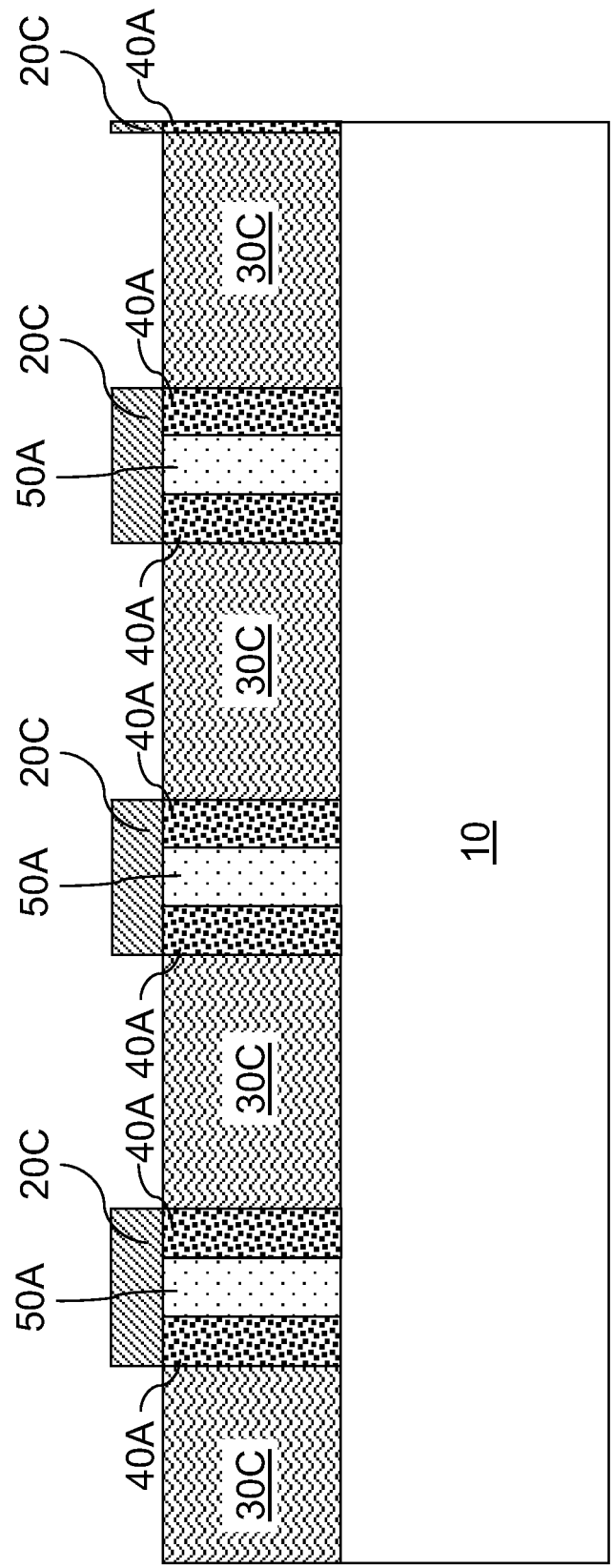

Referring to FIGS. 12A and 12B, a third non-photosensitive polymeric resist is applied within each of the third openings O3 by methods well known in the art, such as spin coating to form third non-photosensitive polymeric resist portions 30C. Preferably, the top surface of the third non-photosensitive polymeric resist portions 30C is recessed below the top surface of the third template layer 20C. Also preferably, the top surface of the third non-photosensitive polymeric resist portions 30C is coplanar with top surfaces of the first nanoscale self-assembled self-aligned structures (40A, 50A) and the second nanoscale self-assembled self-aligned structures (40B, 50B). The third non-photosensitive polymeric resist may be applied to be coplanar with, or above, the top surfaces of the third template layer 30C, and then recessed to the height of the top surfaces of the first nanoscale self-assembled self-aligned structures (40A, 50A) by a recess etch, or by employing a dilute solution from which subsequent evaporation of a solvent causes volume contraction within each of the third openings O3.

The third non-photosensitive polymeric resist comprises self-assembling block copolymers that are capable of self-organizing into nanometer-scale patterns. Thus, any of the material listed above for the first non-photosensitive polymeric resist may be employed for the third non-photosensitive polymeric resist. The third non-photosensitive polymeric resist may comprise the same material as, or a different material from the first photosensitive polymeric resist. For the purposes of illustrating the present invention, it is assumed that the same material is employed for the first non-photosensitive polymeric resist and the third non-photosensitive polymeric resist.

Figure 13A:
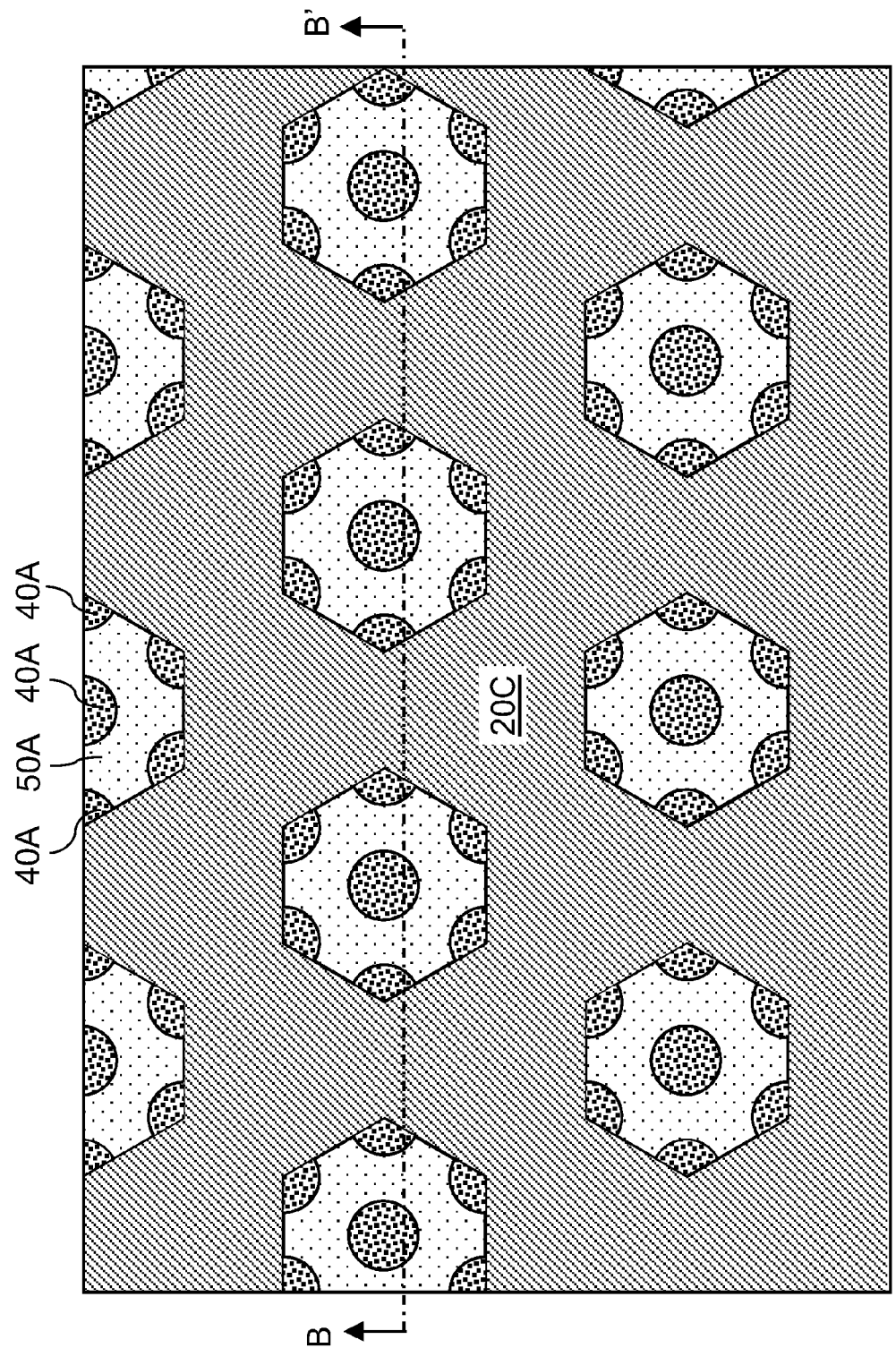
Figure 13B:
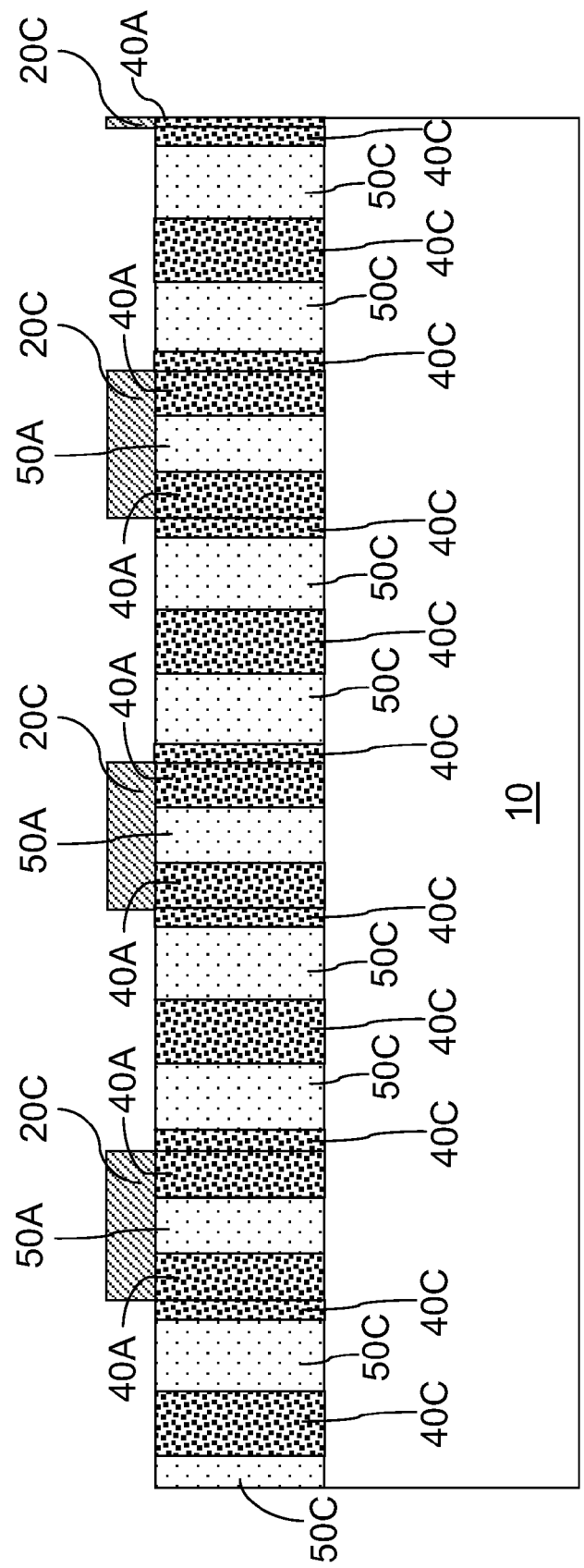

Referring to FIGS. 13A and 13B, a third nanoscale self-assembled self-aligned structure is formed within each of the third openings O3 by causing cross-linking of the self-assembling block copolymers through annealing. The same method employed for the formation of the first third nanoscale self-assembled self-aligned structures (40A, 50A) may be employed to form the third nanoscale self-assembled self-aligned structures.

Each of the third nanoscale self-assembled self-aligned structures comprises third columnar polymeric structures 40C and a second polymeric block matrix 50C. The third columnar polymeric structures 40C comprises at least one circular cylinder and six fractional circular cylinders each corresponding to one third of one of the at least one circular cylinder and contains an arc spanning an angle substantially equal to 120 degrees, or $2\pi/3$. Thus, each of the third columnar polymeric structures 40C has the same structure as one of the first columnar polymeric structures 40A described above, and formed by the same methods. The third polymeric matrix 50C comprises the second polymeric block component and laterally abuts each of the third columnar polymeric structures 40C.

The third nanoscale self-assembled self-aligned structures (40C, 50C) are self-assembled and self-aligned in the same sense that the first nanoscale self-assembled self-aligned structures (40A, 50A) are self-assembled and self-aligned, since the same mechanism is employed for the self-assembly and self-alignment of the various components of the third nanoscale self-assembled self-aligned structures (40C, 50C). Thus, each instance of the third columnar polymeric structures 40C comprises the same components and is congruent to an instance of the first columnar polymeric structures 40A, and each instance of the third polymeric matrices 50C comprises the same material and is congruent to an instance of third columnar polymeric matrices 50A.

Figure 14A:
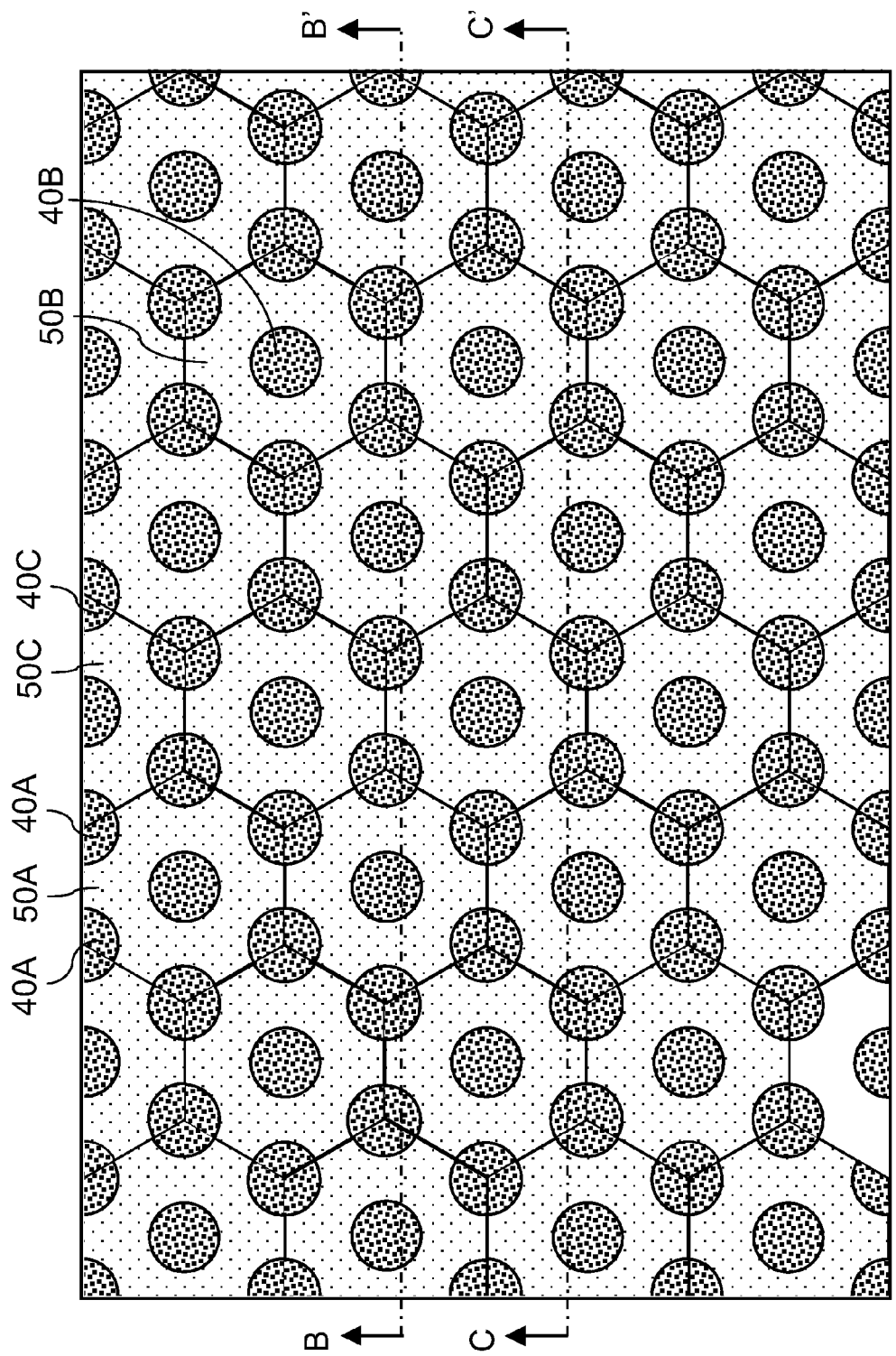
Figure 14B:
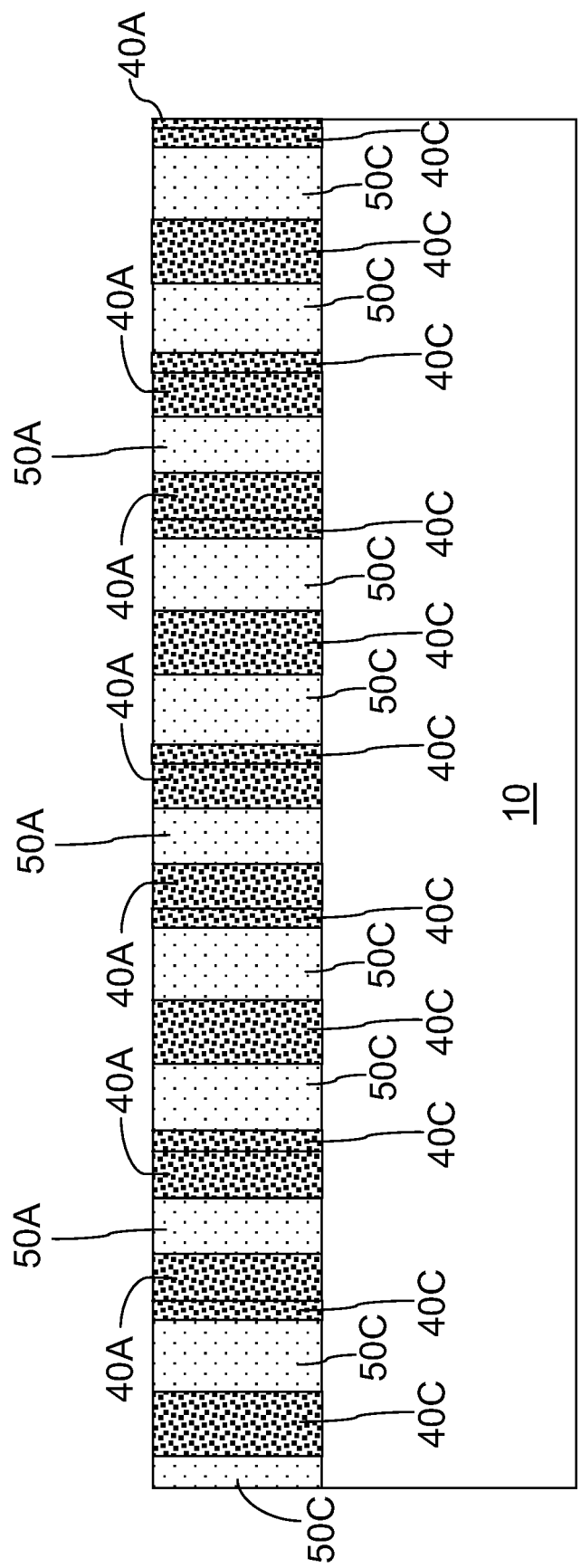
Figure 14C:
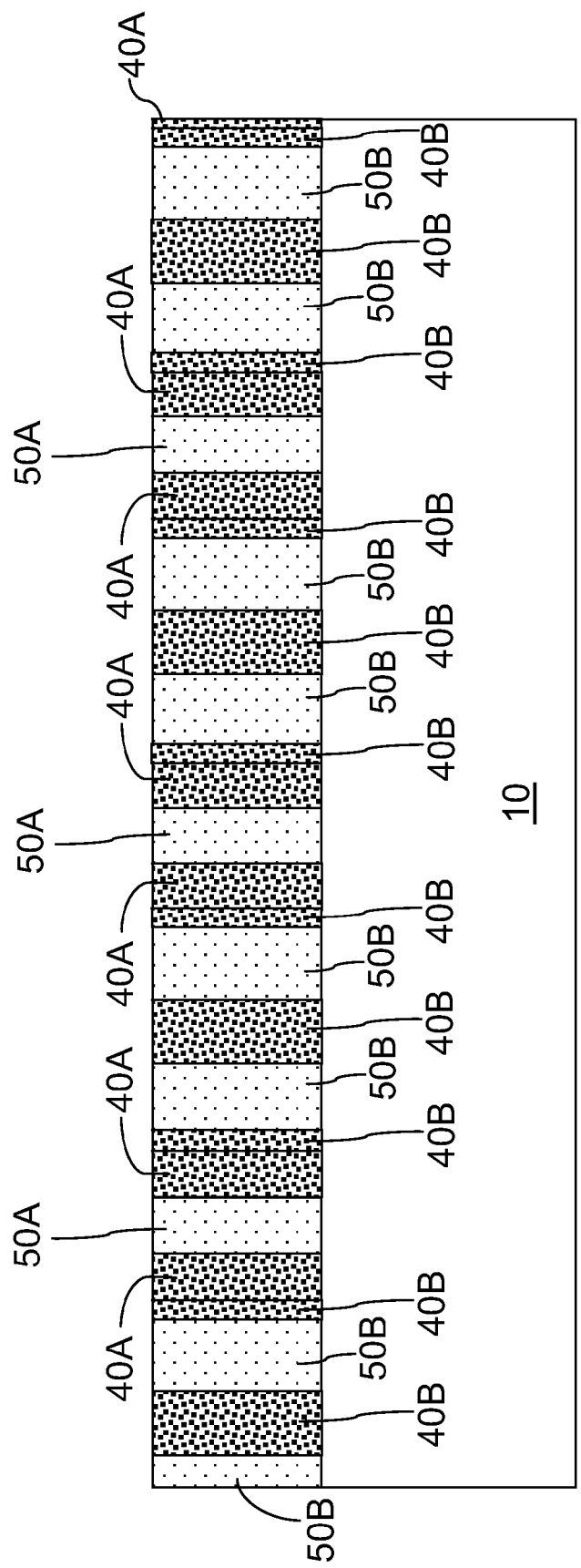

Referring to FIGS. 14A-14C, the third template layer 20C is removed selective to the first nanoscale self-assembled self-aligned structures (40A, 50A), the second nanoscale self-assembled self-aligned structures (40B, 50B), and the third nanoscale self-assembled self-aligned structures (40C, 50C). A wet etch or a dry etch may be employed.

The various fractional circular cylinders and half cylinders, if present, combine to form a full cylinder having a circular horizontal cross-sectional area having the same diameter as cross-sectional areas of the various circular cylinders. Irrespective of whether any cylinder comprising the first polymeric block component is formed from only one of the first, second, and third non-photosensitive polymeric resists or from at least two of the first, second, and third non-photosensitive polymeric resists, all such circular cylinders are herein collectively termed circular polymeric cylinders. In other words, the first, second, and third columnar polymeric structures (40A, 40B, 40C) collectively constitute the circular polymeric cylinders.

Figure 15A:
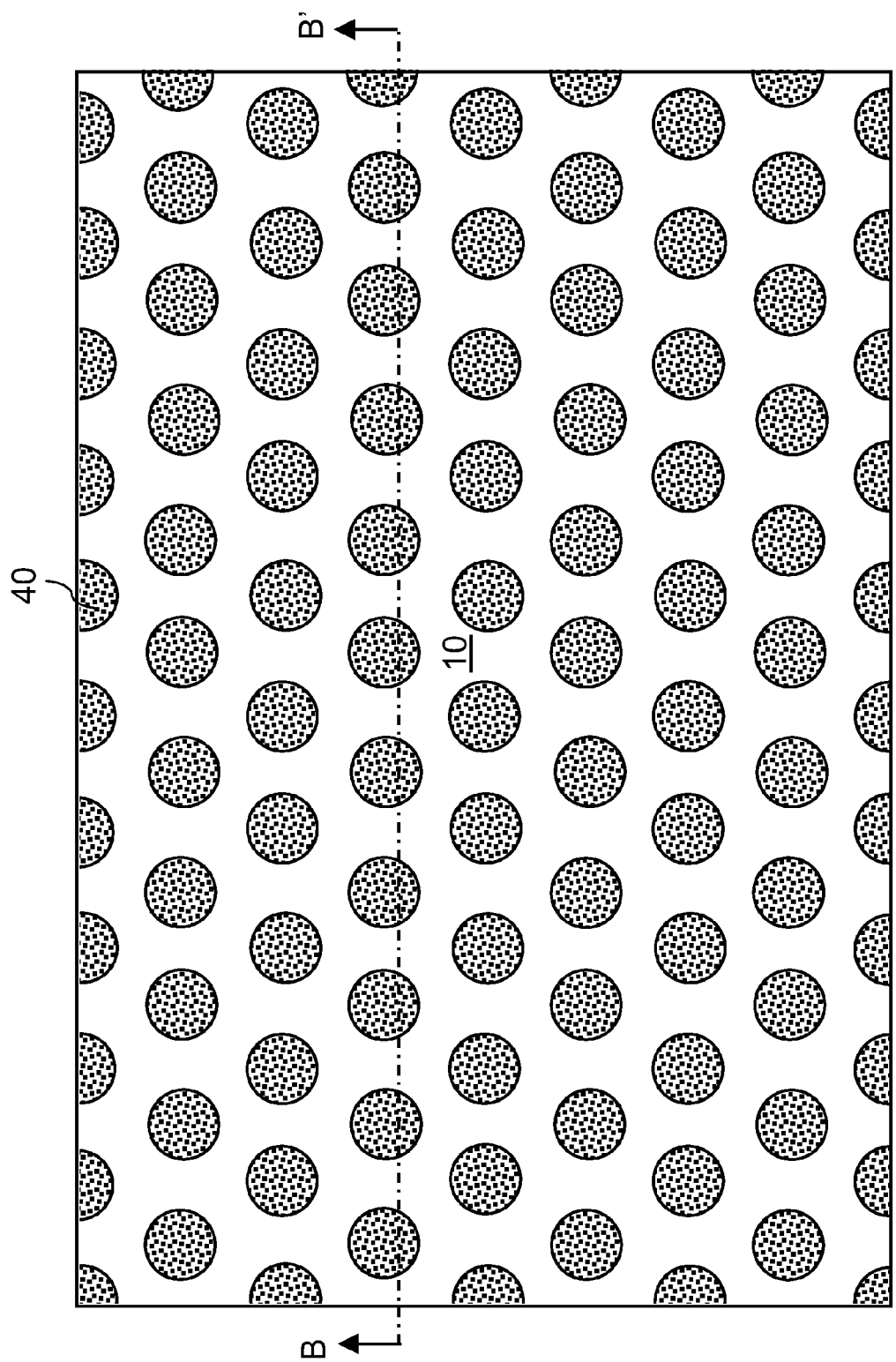
Figure 15B:
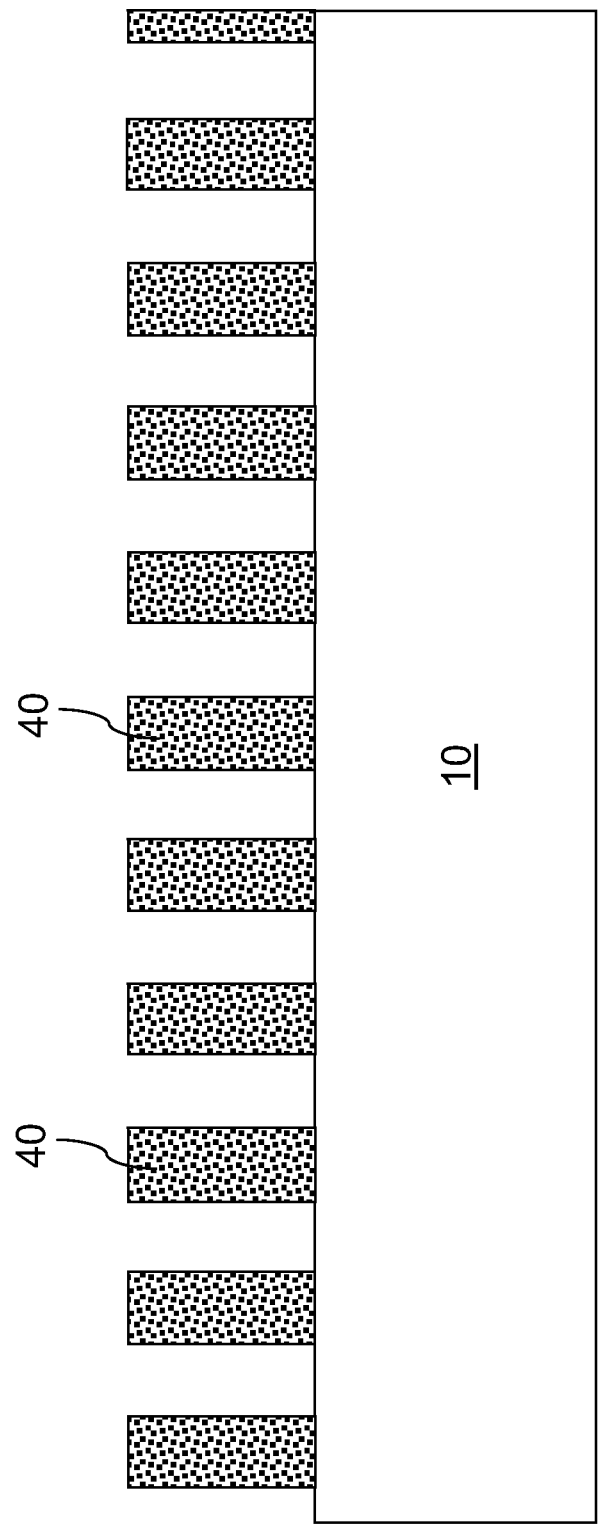

Referring to FIGS. 15A and 15B, the first, second, and third polymeric block matrices (50A, 50B, 50C) are removed selective to the first, second, and third columnar polymeric structures (40A, 40B, 40C) by an etch that removes the second polymeric block component selective to the first polymeric block component. This etch may be isotropic or anisotropic. After removal of the first, second, and third polymeric block matrices (50A, 50B, 50C), an hexagonal array of circular polymeric cylinders 40 is formed on the substrate 10, i.e., the circular polymeric cylinders 40 are arranged to form the hexagonal array in which the periodicity of hexagonal array is the same as the distance between an adjacent pair of axes of the circular polymeric cylinders 40.

Figure 16A:
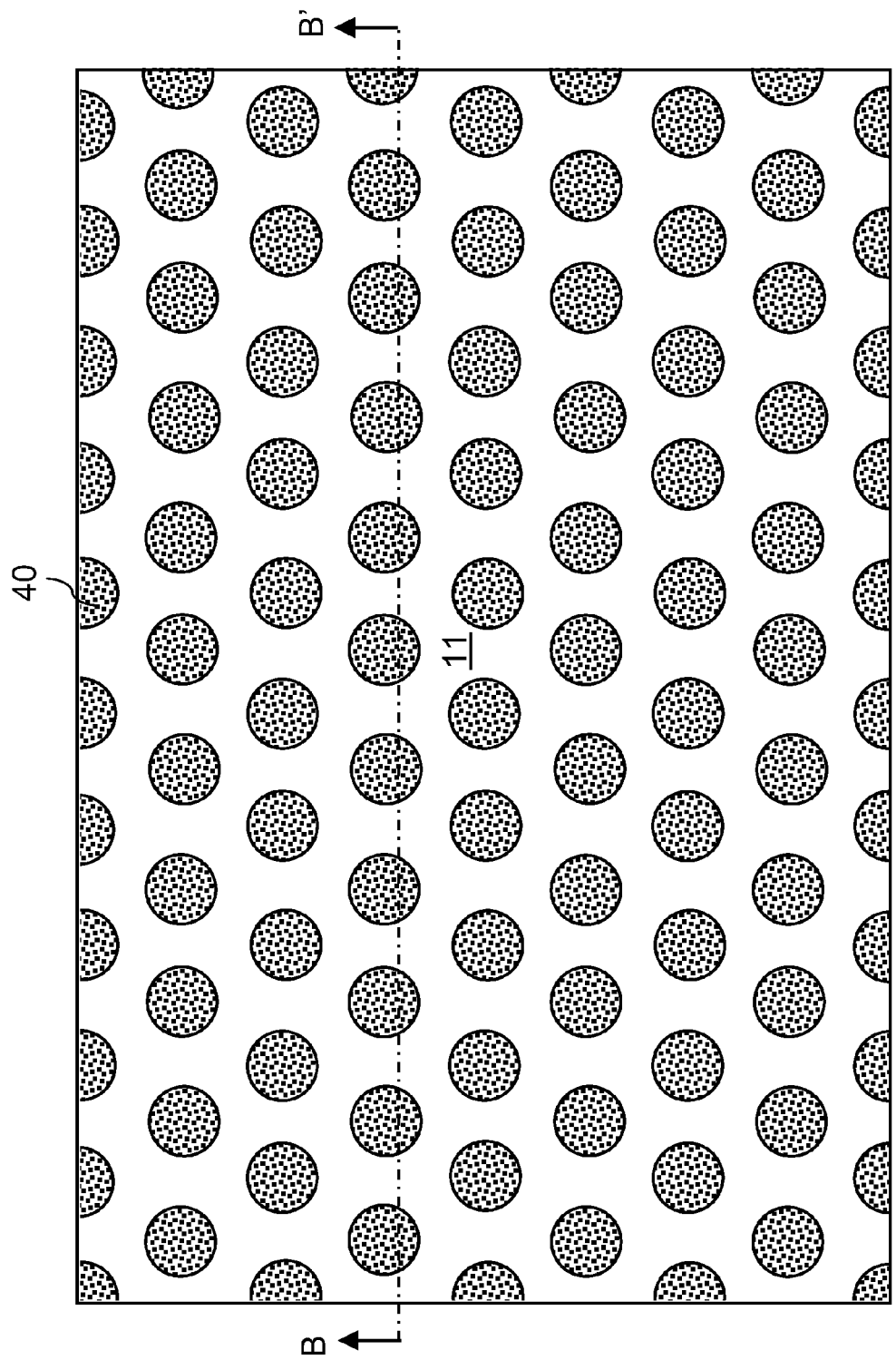

Referring to FIGS. 16A and 16B, the pattern of the hexagonal array of the circular polymeric cylinders 40 is transferred into the substrate 10 by an anisotropic etch that removes exposed portions of the substrate 10 selective to the circular polymeric cylinders 40. A recessed surface 11 of the substrate 10 is exposed underneath the interface between the substrate 10 and the hexagonal array of the circular polymeric cylinders 40. The recessed surface 11 contains a plurality of holes that coincide with the location of the hexagonal array of the circular polymeric cylinders 40. Since the diameter of the circular polymeric cylinders 40 may be sublithographic, the pattern of the recessed surface 11 may contain a sublithographic unit pattern.

Upon removal of the hexagonal array of the circular polymeric cylinders 40 selective to the substrate 10, a structure comprising the substrate 10 is provided, in which the substrate 10 has a pattern of protrusion from a substantially planar surface, which is the recessed surface 11. The pattern comprises a hexagonal array of a unit pattern, which is a circular cylinder having a substantially the same diameter as one of the circular polymeric cylinders 40. The hexagonal array may have a minimum periodicity of a sublithographic dimension.

Figure 17A:
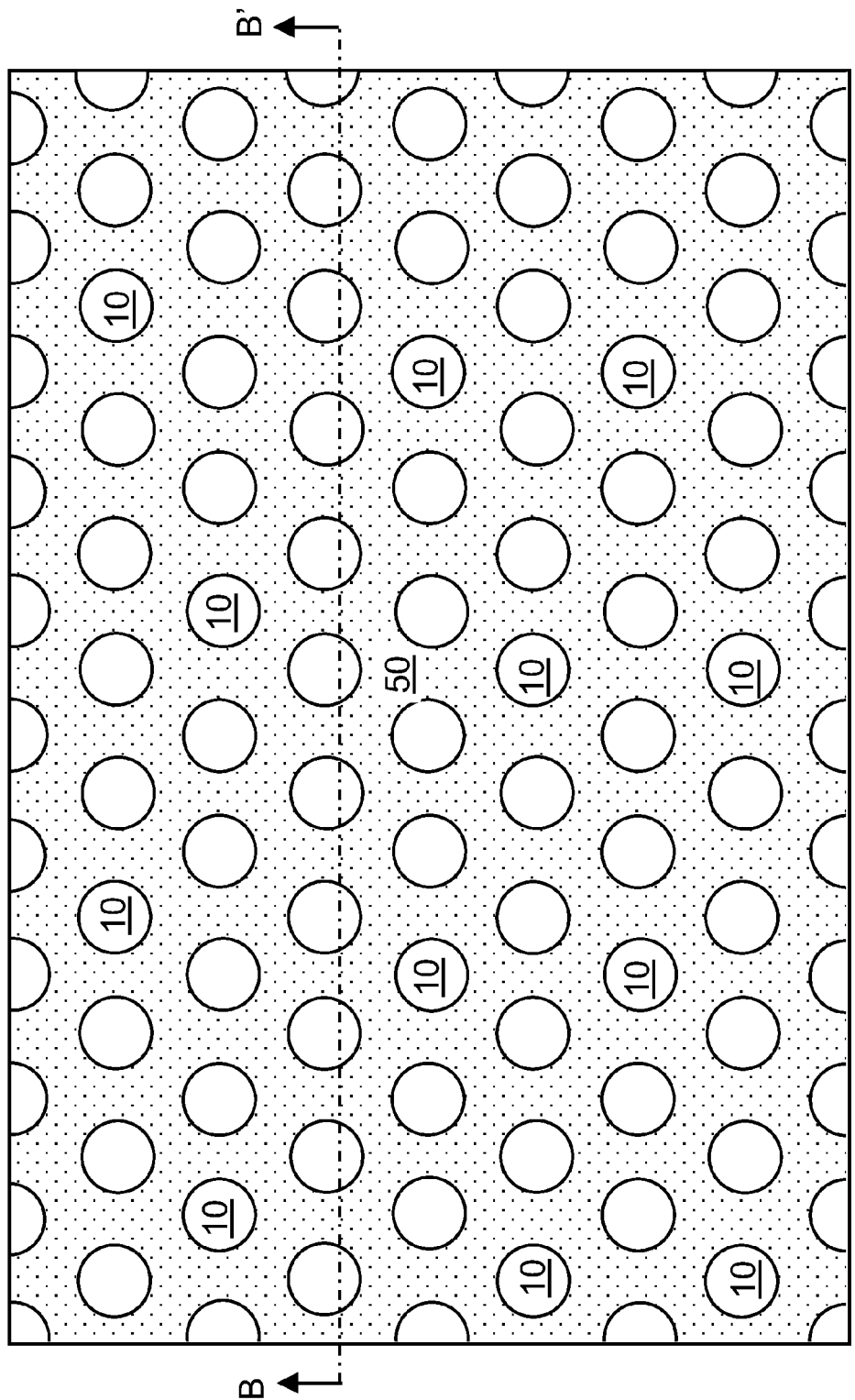
FIGS. 17A-18B are sequential view of a variation of the first exemplary nanoscale structure according to the first embodiment of the present invention.
Figure 17B:
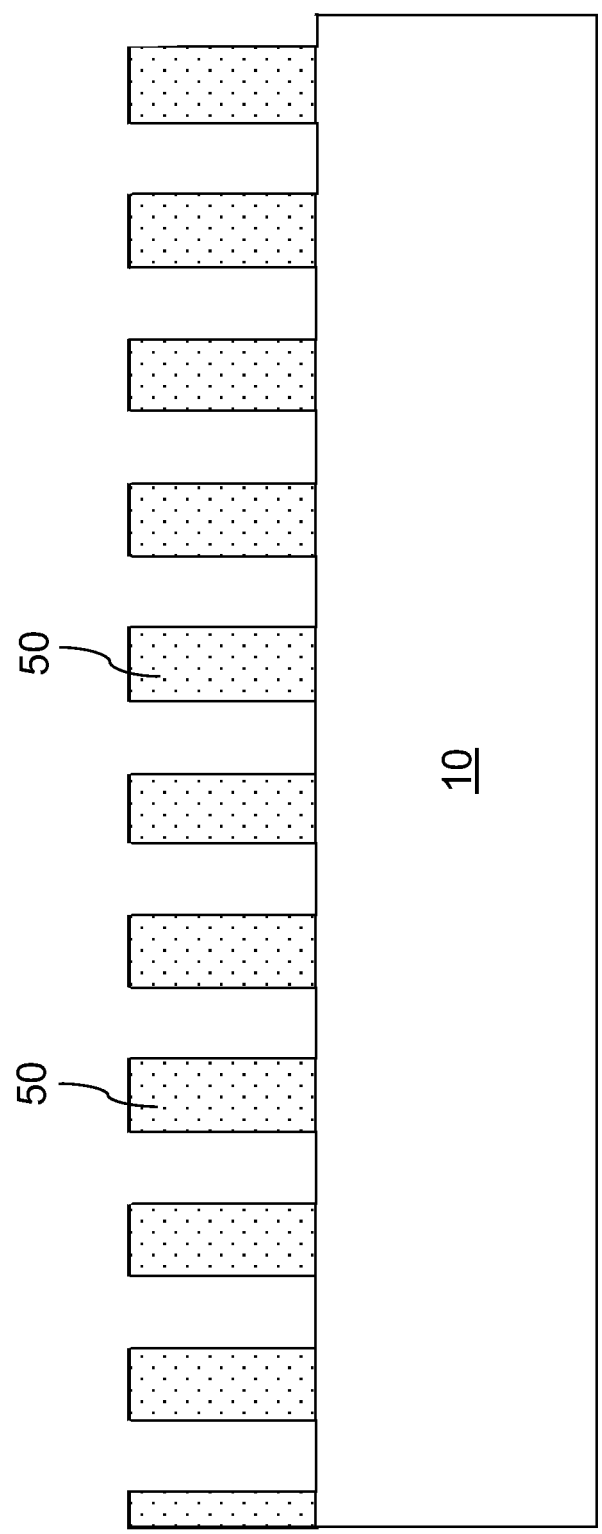

Referring to FIGS. 17A and 17B, a variation of the first exemplary nanoscale structure is formed from the first exemplary nanoscale structure of FIGS. 14A-14C by removing the first, second, and third columnar polymeric structures (40A, 40B, 40C) selective to the combination of the first, second, and third polymeric block matrices (50A, 50B, 50C), which is herein referred to as a combined polymeric block matrices 50. An etch that removes the first polymeric block component selective to the second polymeric block component is employed. This etch may be isotropic or anisotropic.

After removal of the first, second, and third columnar polymeric structures (40A, 40B, 40C), a hexagonal array of cylindrical cavities is formed in the combined polymeric block matrices 50. In other words, the cylindrical cavities in the combined polymeric block matrices 50 are arranged to form the hexagonal array in which the periodicity of hexagonal array is the same as the distance between an adjacent pair of axes of the cylindrical cavities.

Figure 18A:
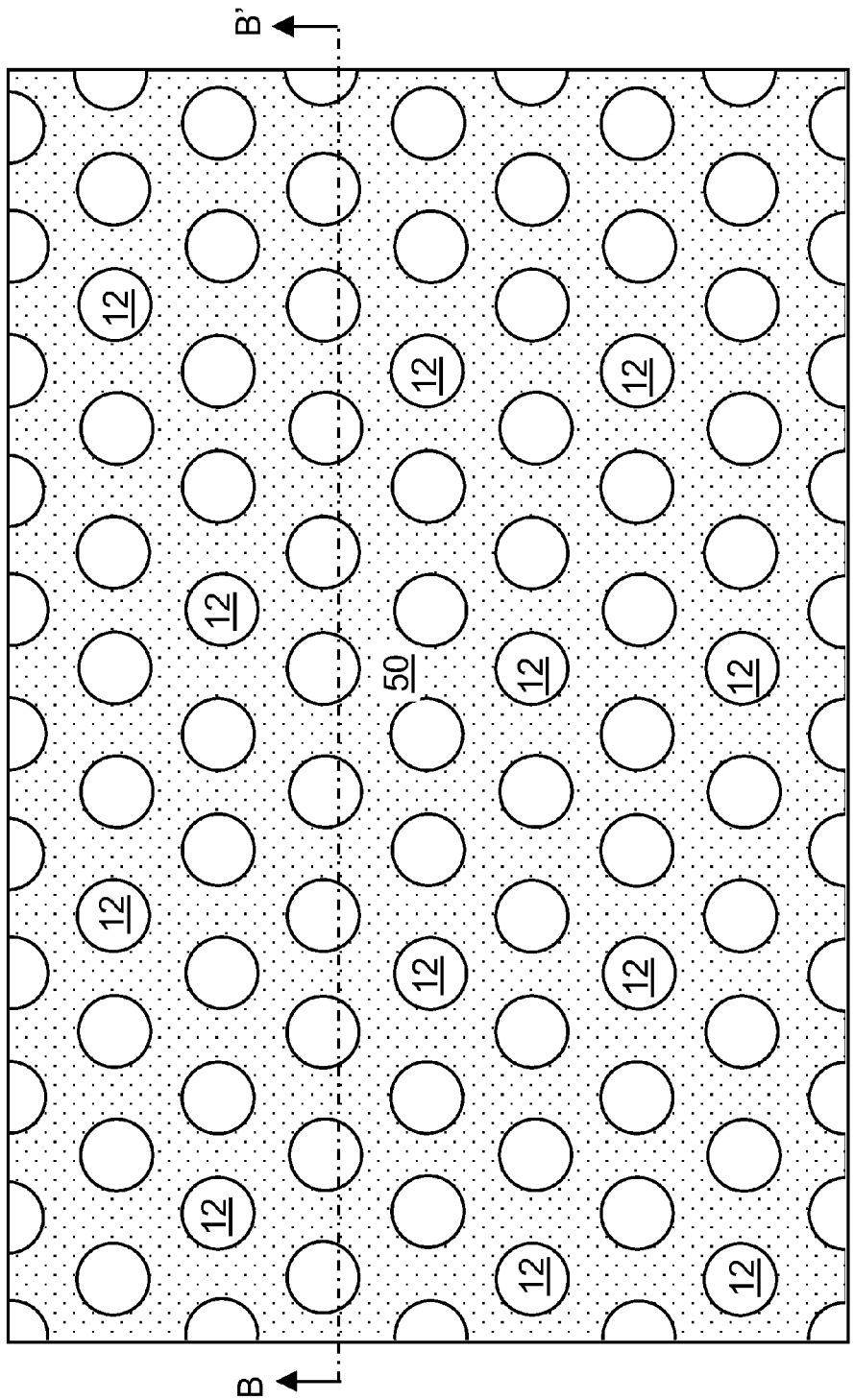

Referring to FIGS. 18A and 18B, the pattern of the hexagonal array of the cylindrical cavities is transferred into the substrate 10 by an anisotropic etch that removes exposed portions of the substrate 10 selective to the combined polymeric block matrices 50. Recessed trench bottom surfaces 12 of the substrate 10 are formed by removal of the material of the substrate from the cylindrical cavities within the combined polymeric block matrices 50. The cylindrical trenches within the substrate 10 are arranged in a hexagonal array. Since the diameter of the cylindrical trenches may be sublithographic, the pattern of the cylindrical trenches may contain a sublithographic unit pattern.

Upon removal of the hexagonal array of the combined polymeric block matrices 50 selective to the substrate 10, a structure comprising the substrate 10 is provided, in which the substrate 10 has a pattern of recess from a substantially planar surface, which is the recessed trench bottom surfaces 12. The pattern comprises a hexagonal array of a unit pattern, which is a circular trench having a substantially the same diameter as one of the circular polymeric cylinders 40. The hexagonal array may have a minimum periodicity of a sublithographic dimension.

According to a second embodiment of the present invention, a second exemplary nanoscale structure is derived from the first exemplary nanoscale structure of FIGS. 1A-2B. To form the second exemplary nanoscale structure, however, the wetting characteristics of the first and second polymeric block components are modified such that the first polymeric block component does not wet the surface of the first template layer 20A, while the second polymeric block component wets the surface of the first template layer 20A.

Figure 19A:
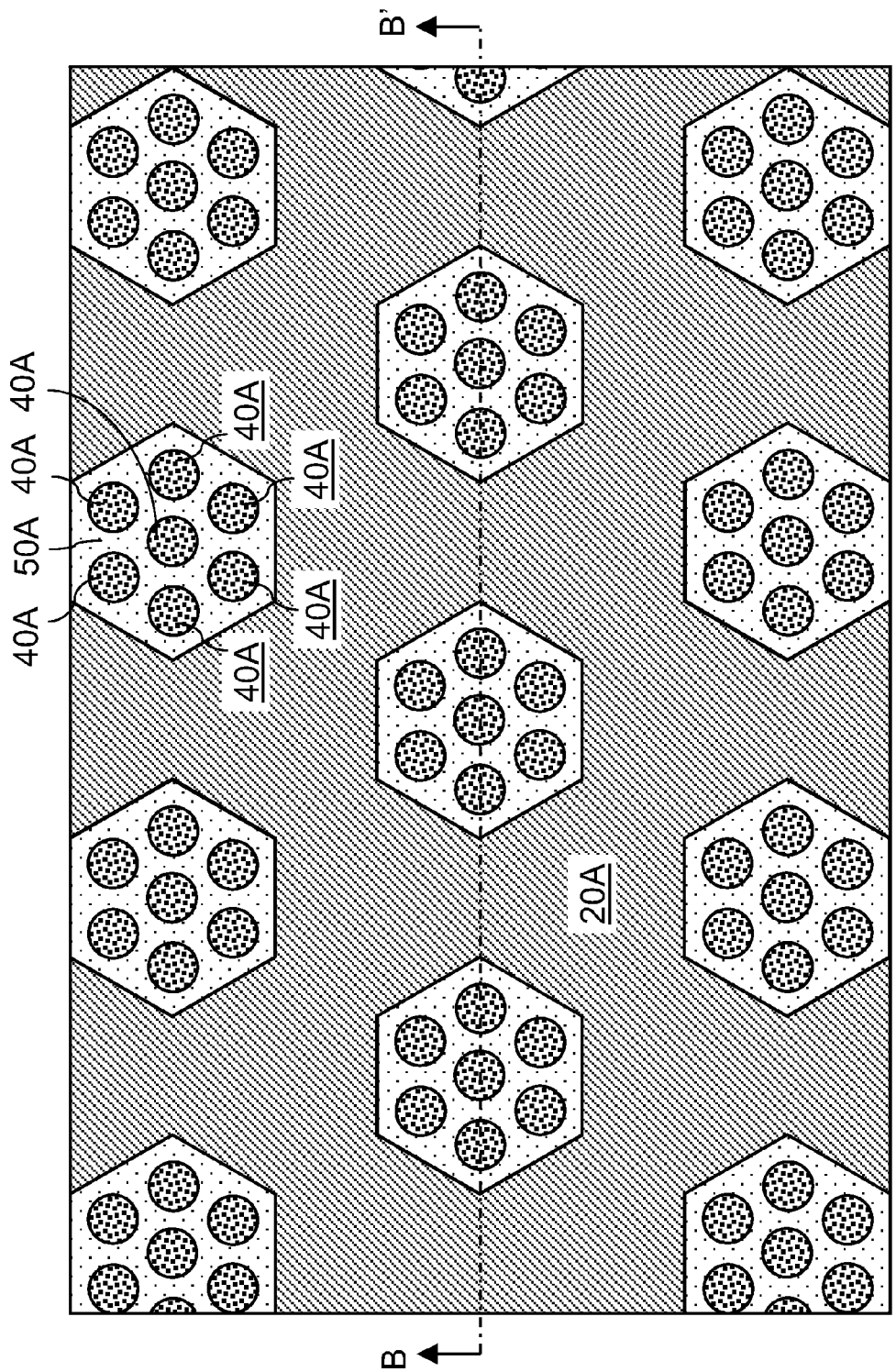
FIGS. 19A-23B are sequential view of a variation of a second exemplary nanoscale structure according to a second embodiment of the present invention.
Figure 19B:
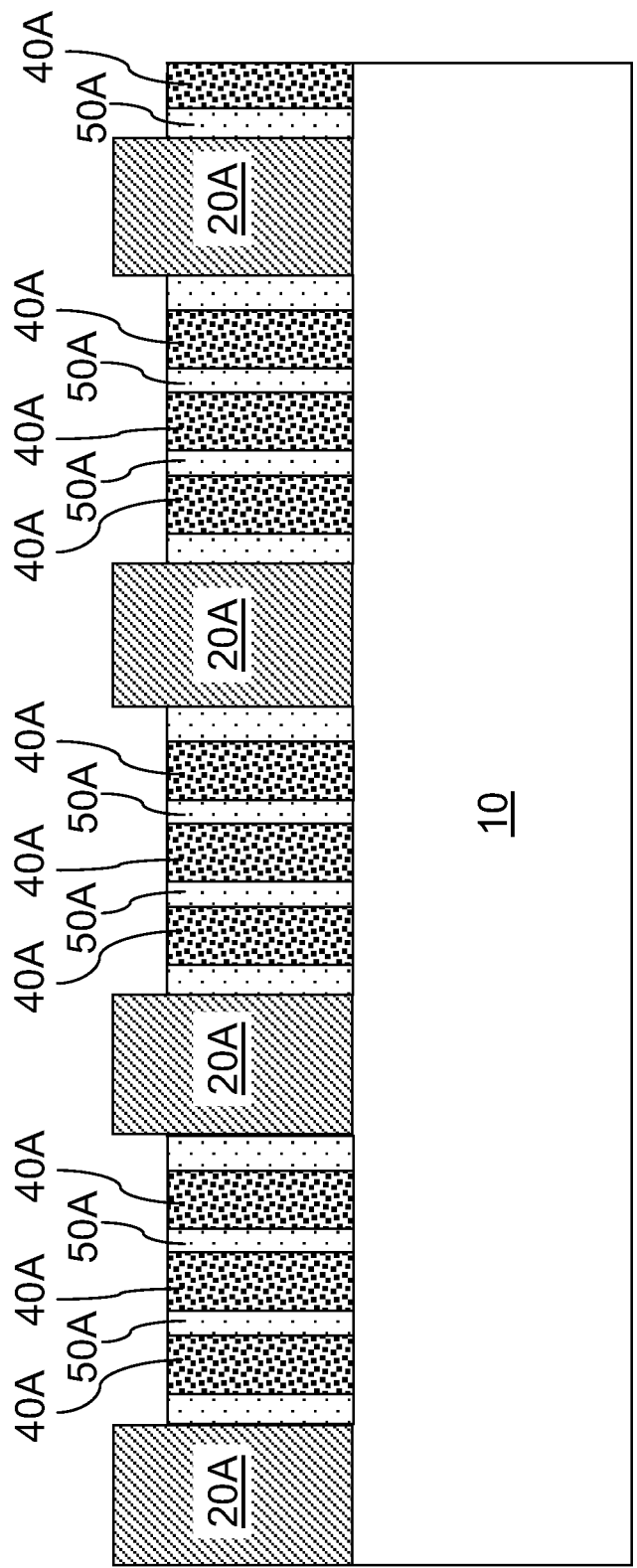

Referring to FIGS. 19A and 19B, a first nanoscale self-assembled self-aligned structure is formed within each of the first openings O1 (See FIGS. 1A and 1B) by causing cross-linking of the self-assembling block copolymers through annealing. The same annealing process may be employed as in the first embodiment. The first nanoscale self-assembled self-aligned structure is formed within each of the first openings O1 by causing cross-linking of the self-assembling block copolymers through annealing. Specifically, the first non-photosensitive polymeric resist is annealed by ultraviolet treatment or by thermal annealing at an elevated temperature to form first columnar polymeric structures 40A comprising the first polymeric block component and a first polymeric matrix 50A comprising the second polymeric block component and laterally abutting the sidewalls of the first columnar polymeric structures 40A. The first columnar polymeric structures 40A do not contact the sidewalls of the first openings O1, while the first polymeric matrix 50A abuts sidewalls of the first template layer 20A in each of the first openings O1. The first nanoscale self-assembled self-aligned structures (40A, 50A) are "self-assembled" and "self-aligned" due to the same mechanism as in the first embodiment.

Figure 20A:
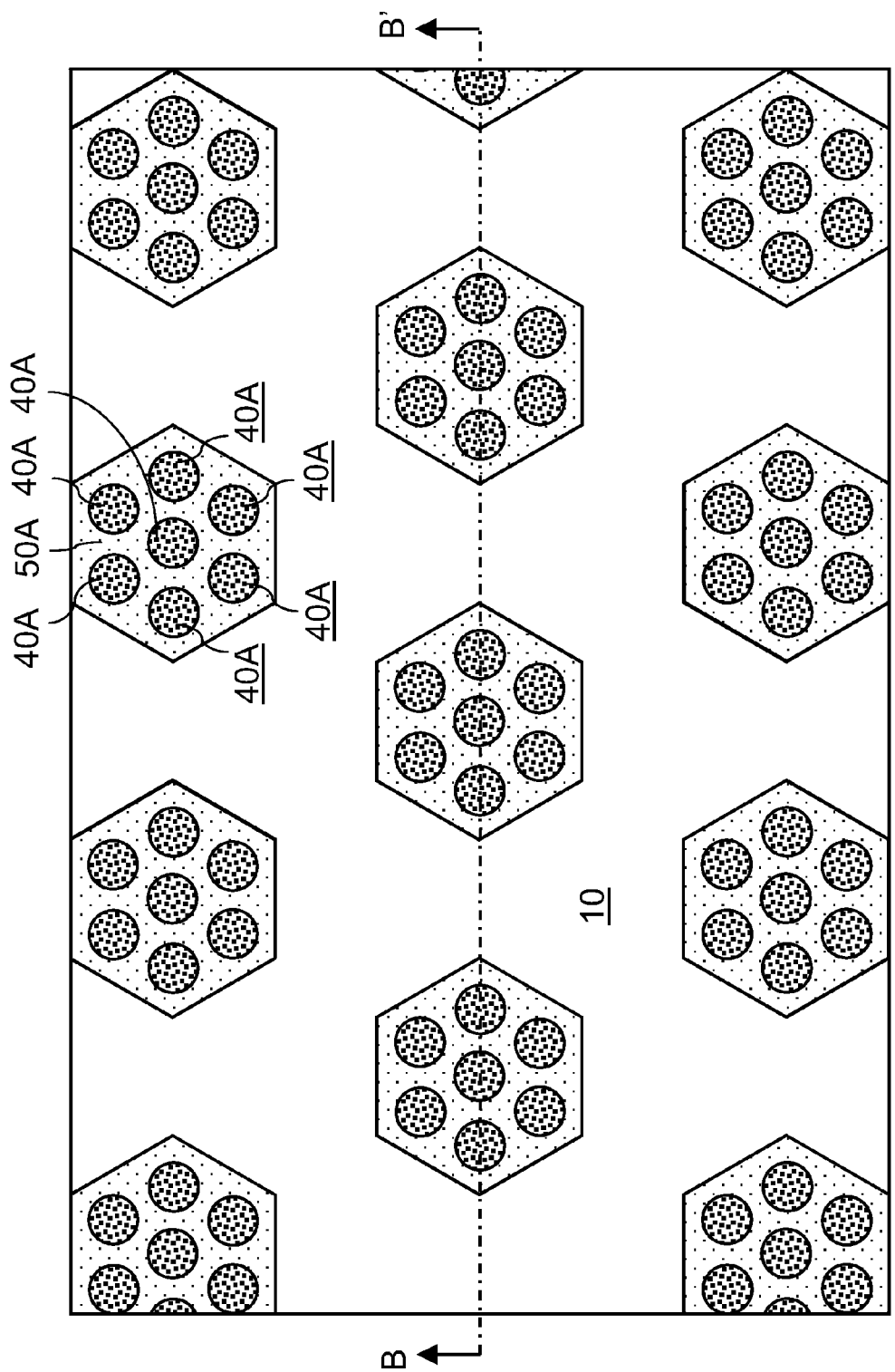
Figure 20B:
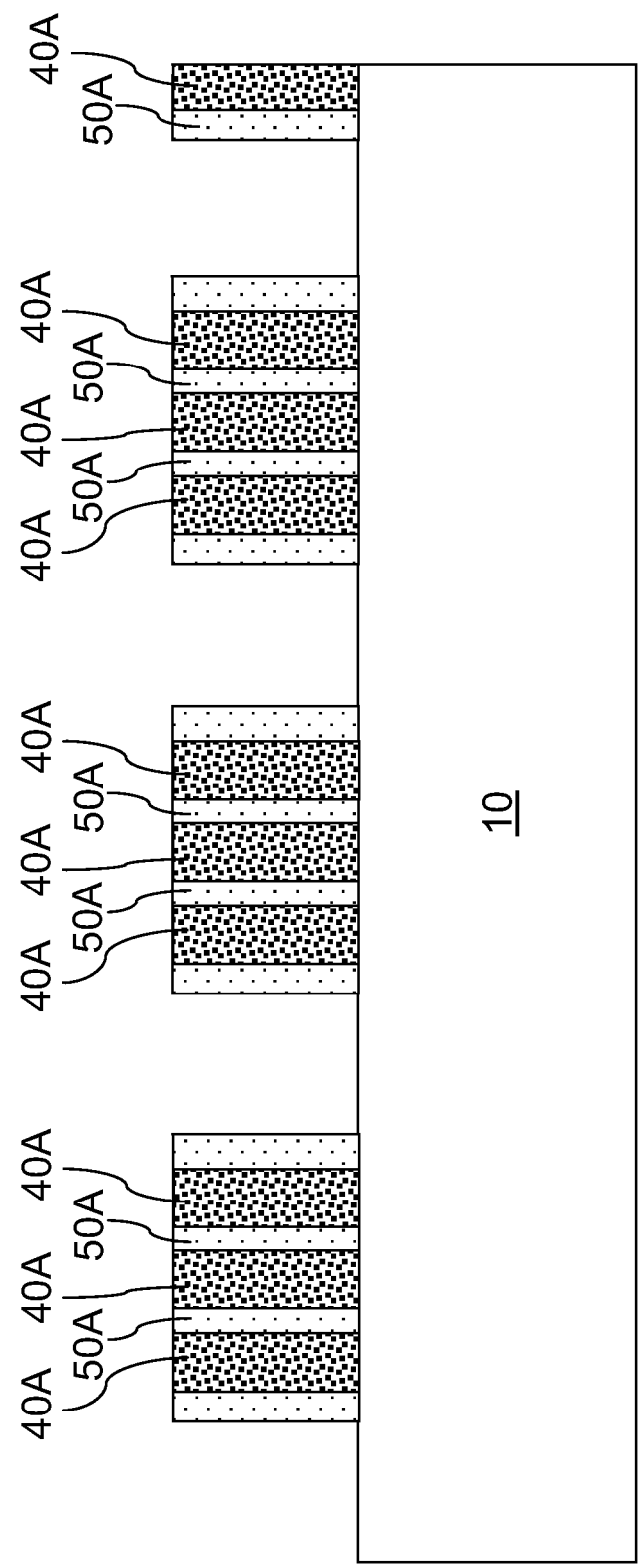

Referring to FIGS. 20A and 20B, the first template layer 20A is removed selective to the first nanoscale self-assembled self-aligned structures (40A, 50A) and the substrate 10. A wet etch or a dry etch may be employed. The collection of the first nanoscale self-assembled self-aligned structures (40A, 50A) constitutes a hexagonal array, in which a unit cell comprises one instance of the first nanoscale self-assembled self-aligned structures (40A, 50A) and a space not containing any of the first nanoscale self-assembled self-aligned structures (40A, 50A) and having a volume equal to two instances of the first nanoscale self-assembled self-aligned structures (40A, 50A).

Figure 21A:
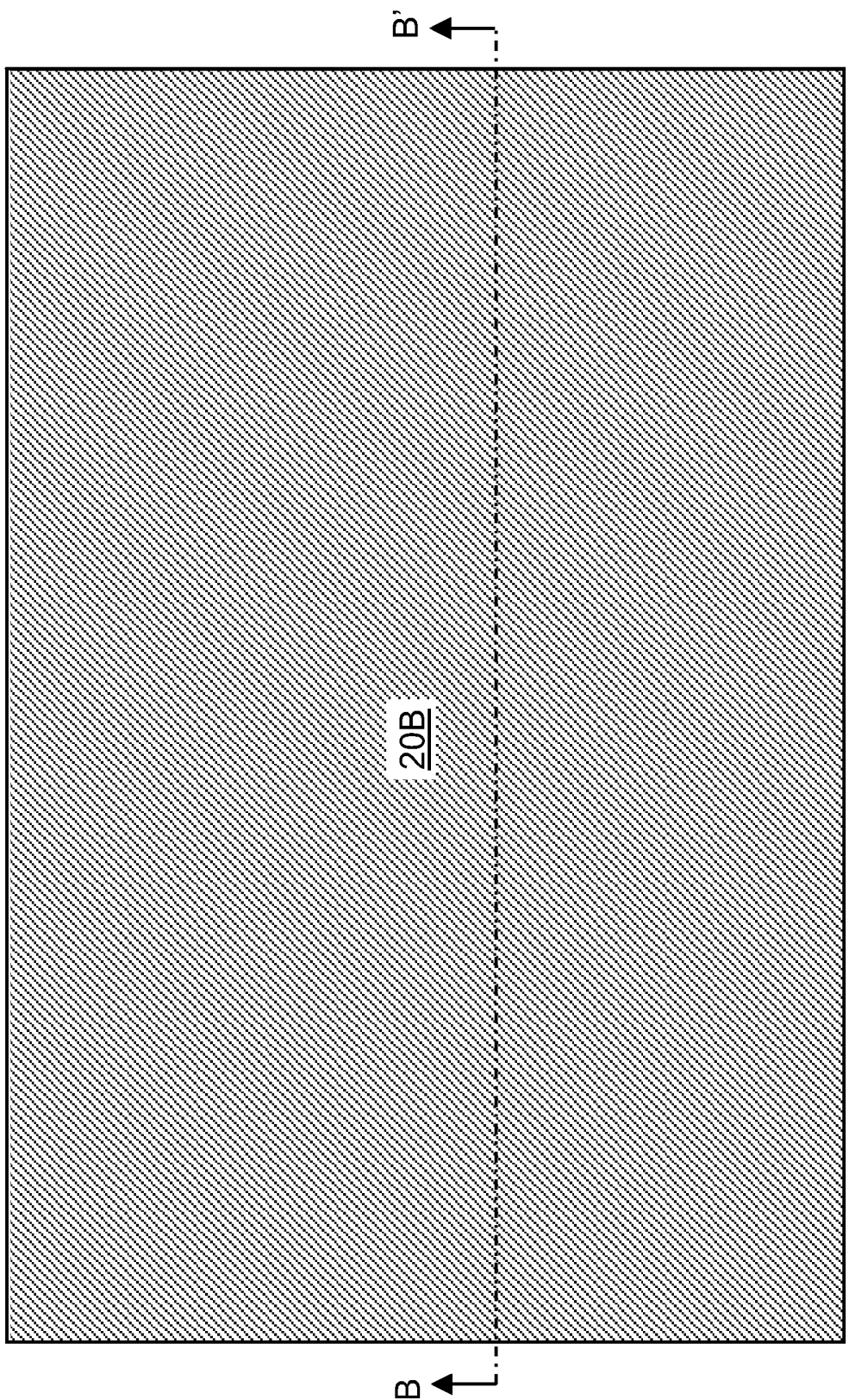
Figure 21B:
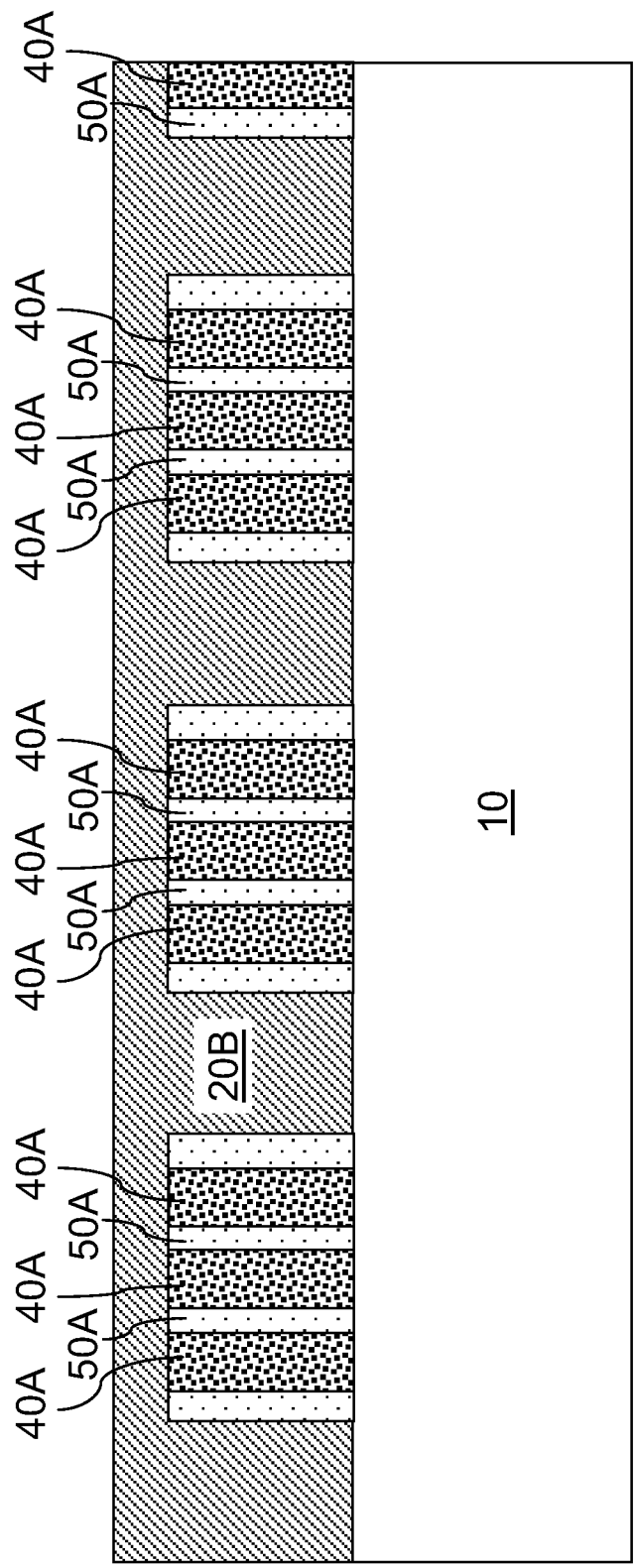

Referring to FIGS. 21A and 21B, a second template layer 20B is formed over the first nanoscale self-assembled self-aligned structures (40A, 50A) and the substrate 10. The second template layer 20B may be selected from the materials that may be employed as the first template layer 20A. The second template layer 20B may comprise the same material as, or a different material from, the first template layer 20A. The second template layer 20B is formed as a blanket layer and covers top surfaces of the first nanoscale self-assembled self-aligned structures (40A, 50A).

Processing steps corresponding to FIGS. 6A-13B of the first embodiment are performed to form second nanoscale self-assembled self-aligned structures (40B, 50B) and third nanoscale self-assembled self-aligned structures (40C, 50C). By modulating the wetting characteristics of the first and second polymeric block components, the second columnar polymeric structures 40B do not contact the sidewalls of the second openings O2, while each of the second polymeric matrices 50B abuts sidewalls of the second template layer 20B in each of the second openings O2. Likewise, the third columnar polymeric structures 40B do not contact the sidewalls of the third openings O3, while each of the third polymeric matrices 50B abuts sidewalls of the third template layer 20C in each of the third openings O3.

Figure 22A:
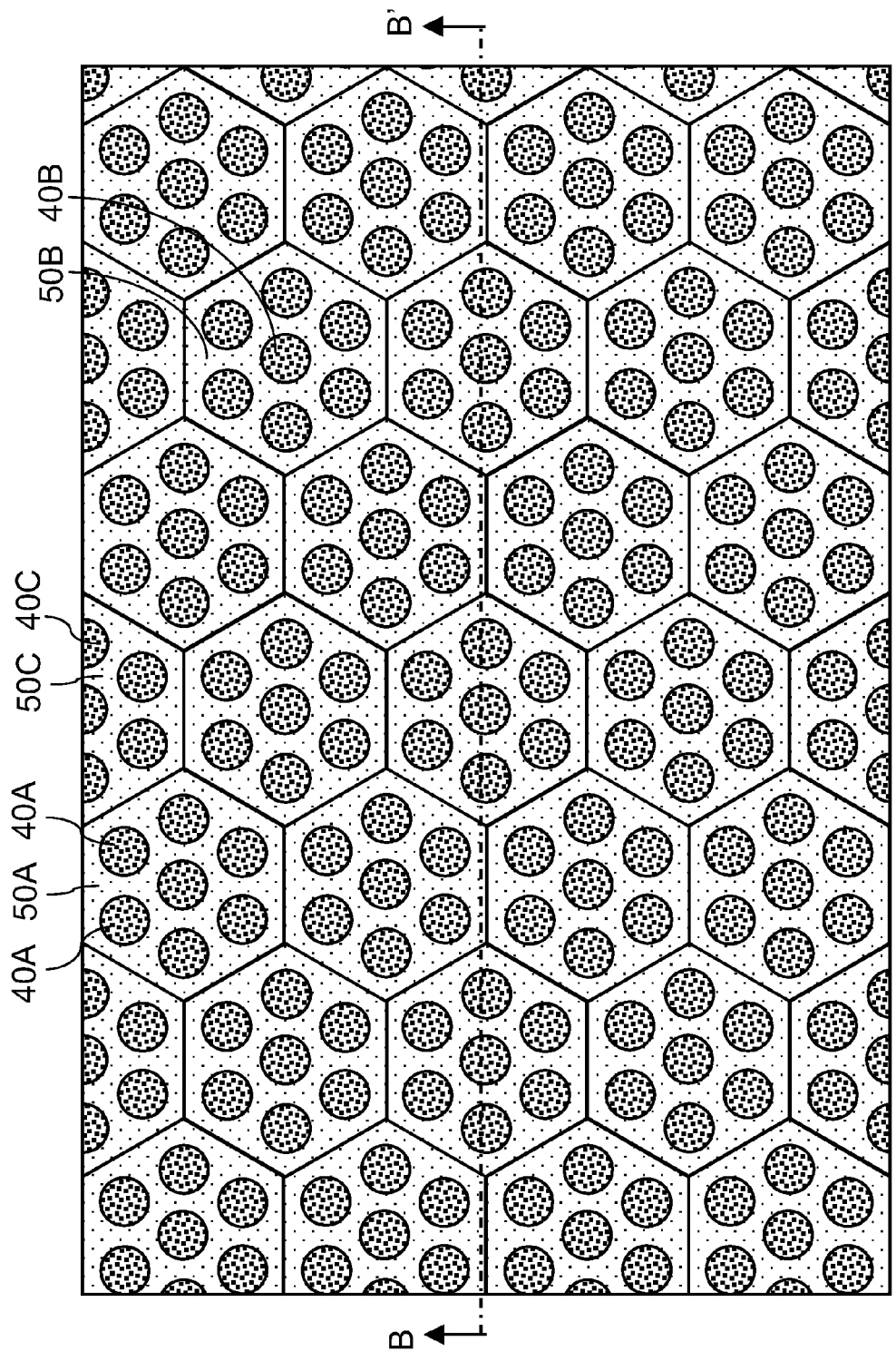
Figure 22B:
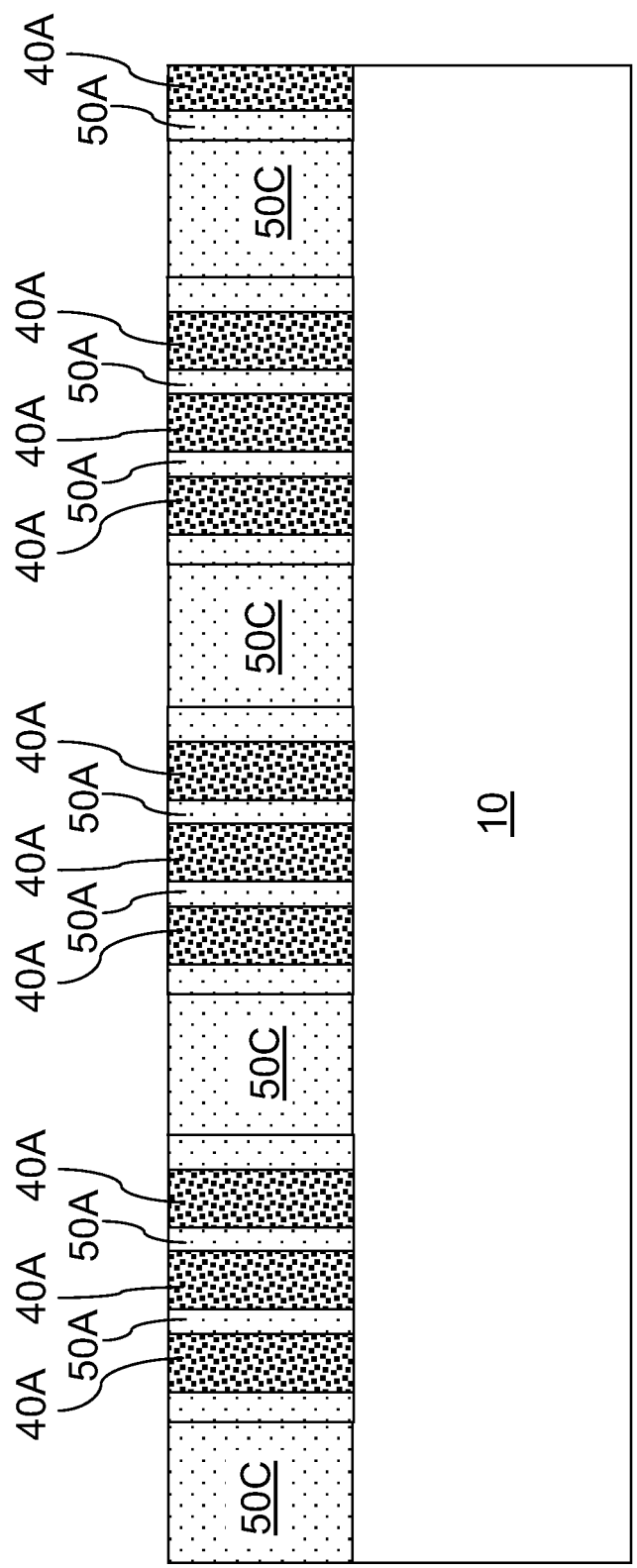

Referring to FIGS. 22A and 22B, the third template layer 20C is removed selective to the first nanoscale self-assembled self-aligned structures (40A, 50A), the second nanoscale self-assembled self-aligned structures (40B, 50B), and the third nanoscale self-assembled self-aligned structures (40C, 50C). A wet etch or a dry etch may be employed.

Figure 23A:
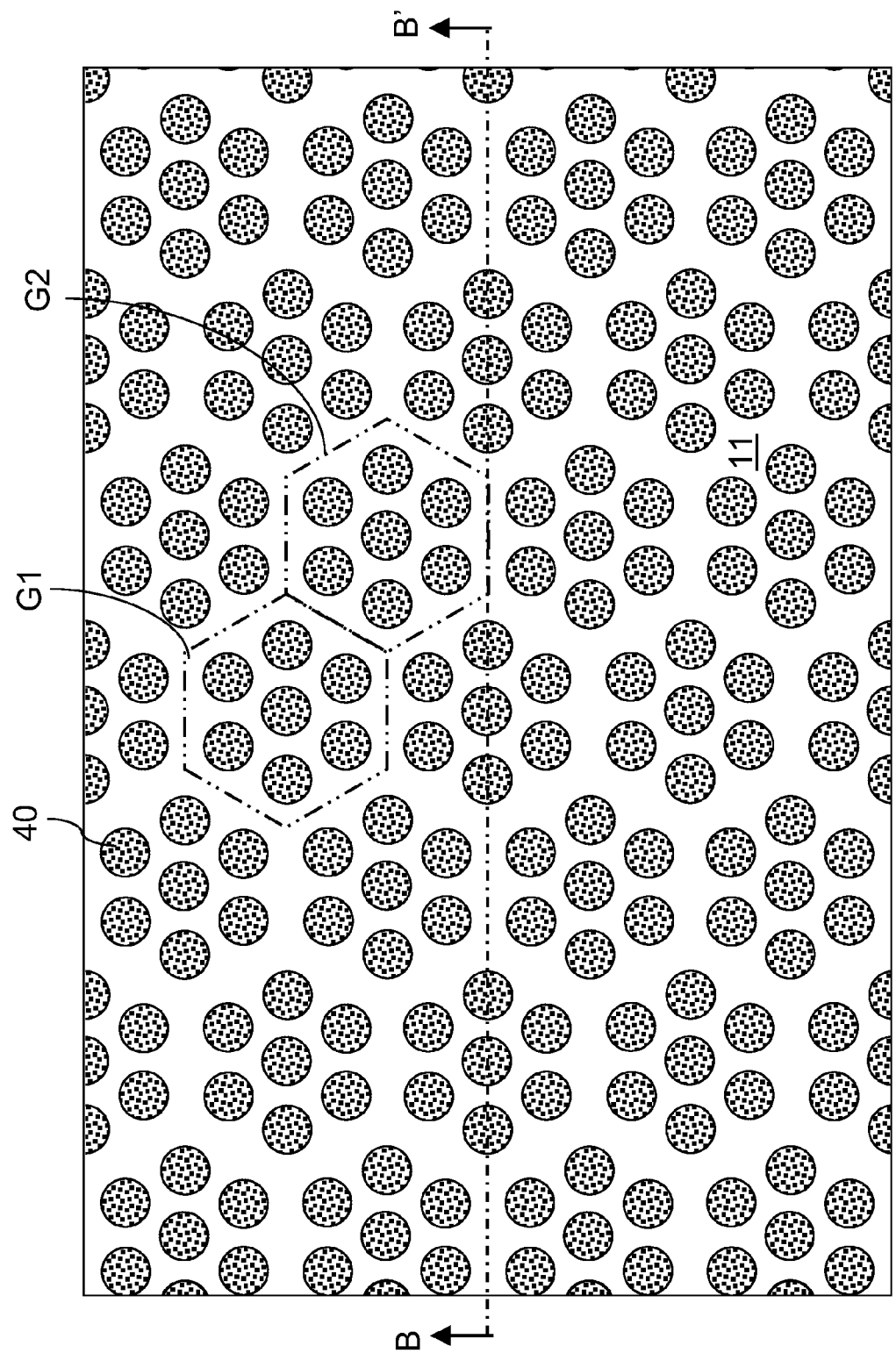
Figure 23B:
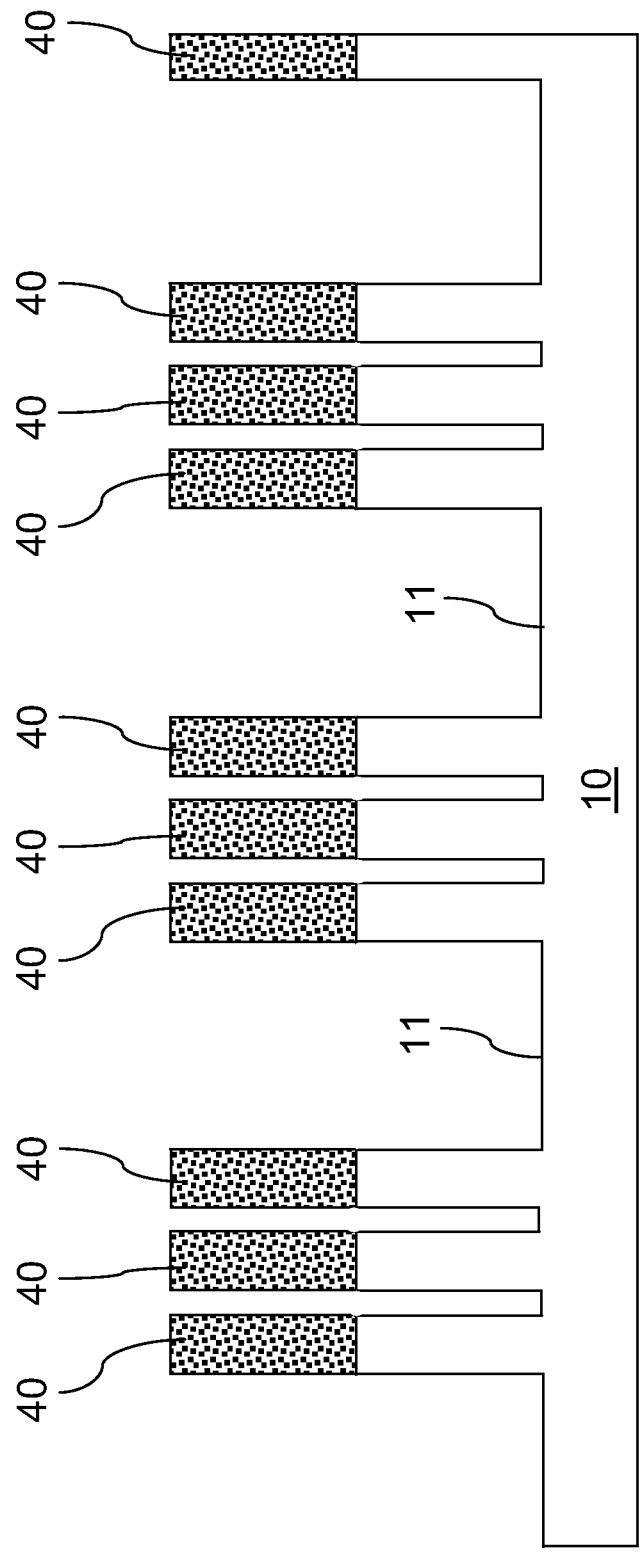

Referring to FIGS. 23A and 23B, the first, second, and third polymeric block matrices (50A, 50B, 50C) are removed selective to the first, second, and third columnar polymeric structures (40A, 40B, 40C) by an etch that removes the second polymeric block component selective to the first polymeric block component. This etch may be isotropic or anisotropic. The first, second, and third columnar polymeric structures (40A, 40B, 40C) collectively constitute circular polymeric cylinders 40. The circular polymeric cylinders 40 are arranged to form a hexagonal array. However, the periodicity of the hexagonal array is not the same as the distance between an adjacent pair of axes of the circular polymeric cylinders 40. Instead, the hexagonal array has a unit cell having the same size as each of the first openings O1, second openings O2, third openings O3 (See FIGS. 1A, 6A, and 11A, respectively) and contains a plurality of circular polymeric cylinders 40. Two exemplary unit cells of the hexagonal array are labeled "G1" and "G2".

The pattern of the hexagonal array of the circular polymeric cylinders 40 is transferred into the substrate 10 by an anisotropic etch that removes exposed portions of the substrate 10 selective to the circular polymeric cylinders 40. A recessed surface 11 of the substrate 10 is exposed underneath the interface between the substrate 10 and the hexagonal array of the circular polymeric cylinders 40. The recessed surface 11 contains a plurality of holes that coincide with the location of the hexagonal array of the circular polymeric cylinders 40. Since the diameter of the circular polymeric cylinders 40 may be sublithographic, the pattern of the recessed surface 11 may contain a sublithographic unit pattern.

Upon removal of the hexagonal array of the circular polymeric cylinders 40 selective to the substrate 10, a structure comprising the substrate 10 is provided, in which the substrate 10 has a pattern of protrusion from a substantially planar surface, which is the recessed surface 11. The pattern comprises a hexagonal array of a unit pattern, e.g., G1 or G2, which comprises a plurality of circular cylinders of integral construction with the substrate 10, i.e., being a part of the substrate 10, and having a substantially the same diameter as one of the circular polymeric cylinders 40. The hexagonal array has a minimum periodicity of a lithographic dimension. The unit pattern, e.g., G1 or G2, has a shape of a regular hexagon and comprises circles of a same diameter, which is the diameter of each of the circular polymeric cylinders 40. However, a collection of the circles from two neighboring instances of the unit pattern does not have hexagonal periodicity. For example, the collection of circles in the union set of G1 and G2 does not have hexagonal periodicity since the coherency of any hexagonal periodicity of the circular polymeric cylinders 40 does not extend beyond an area of one of the first, second, and third openings (O1, O2, O3).

Figure 24A:
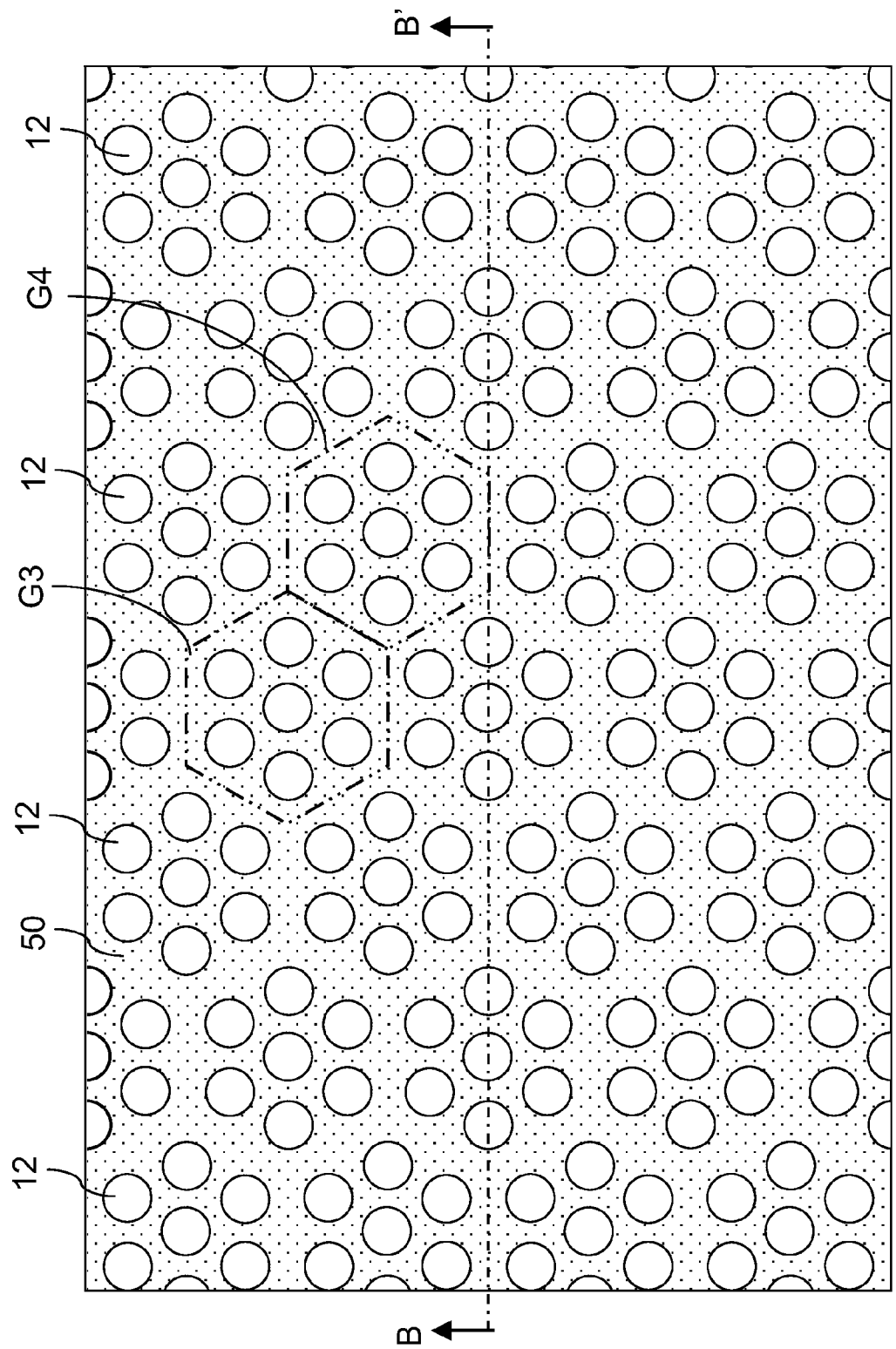
FIGS. 24A and 24B are sequential view of a variation of the second exemplary nanoscale structure according to the second embodiment of the present invention.
Figure 24B:
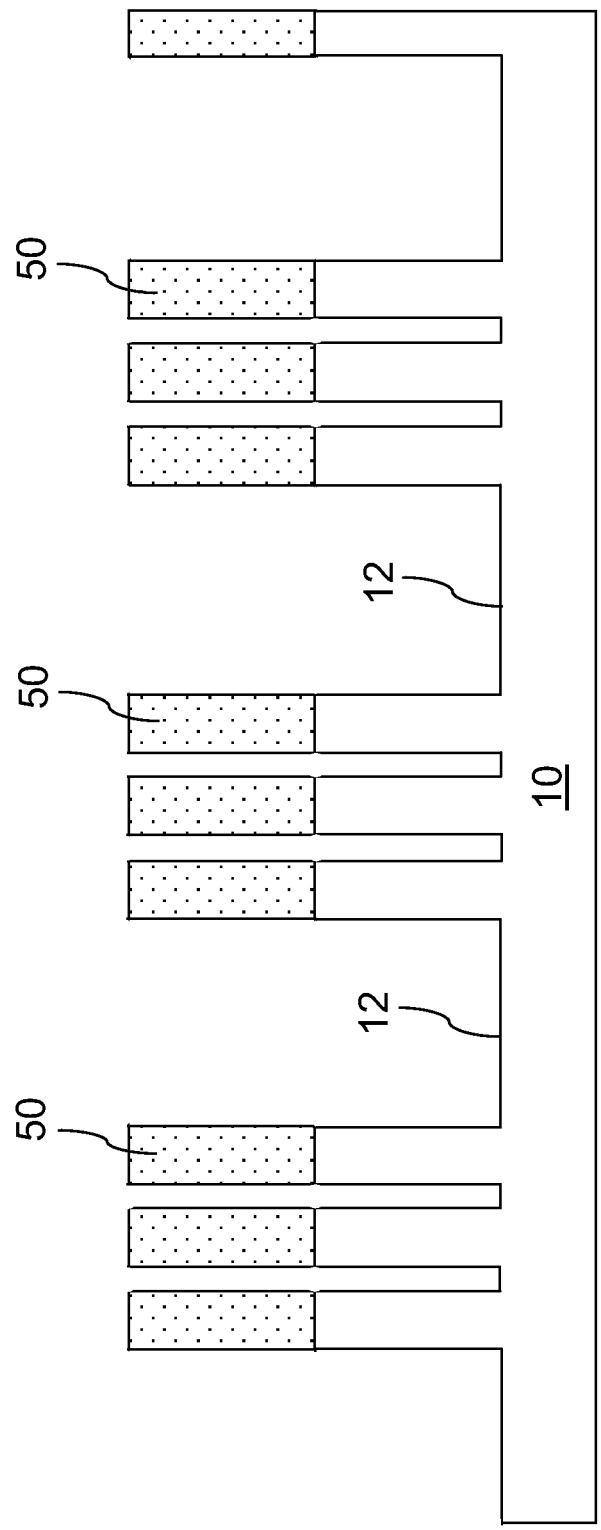

Referring to FIGS. 24A and 24B, a variation of the second exemplary nanoscale structure is formed from the second exemplary nanoscale structure of FIGS. 22A-22B by removing the first, second, and third columnar polymeric structures (40A, 40B, 40C) selective to the combination of the first, second, and third polymeric block matrices (50A, 50B, 50C), which is herein referred to as a combined polymeric block matrices 50. An etch that removes the first polymeric block component selective to the second polymeric block component is employed. This etch may be isotropic or anisotropic.

After removal of the first, second, and third columnar polymeric structures (40A, 40B, 40C), an array of cylindrical cavities is formed in the combined polymeric block matrices 50. The pattern of the array of the cylindrical cavities is transferred into the substrate 10 by an anisotropic etch that removes exposed portions of the substrate 10 selective to the combined polymeric block matrices 50. Recessed trench bottom surfaces 12 of the substrate 10 are formed by removal of the material of the substrate from the cylindrical cavities within the combined polymeric block matrices 50. The cylindrical trenches within the substrate 10 are arranged to form a hexagonal array. However, the periodicity of the hexagonal array is not the same as the distance between an adjacent pair of axes of the cylindrical trenches. Instead, the hexagonal array has a unit cell having the same size as each of the first openings O1, second openings O2, third openings O3 (See FIGS. 1A, 6A, and 11A, respectively) and contains a plurality of cylindrical trenches. Two exemplary unit cells of the hexagonal array are labeled "G3" and "G4".

Upon removal of the combined polymeric block matrices 50 selective to the substrate 10, a structure comprising the substrate 10 is provided, in which the substrate 10 has a pattern of recess from a substantially planar surface, which is the top surface of the substrate 10, i.e., the former interface between the substrate 10 and the combined polymeric block matrices 50. The pattern comprises a hexagonal array of a unit pattern, e.g., G3 or G4, which comprises a plurality of the cylindrical trenches with the substrate 10, i.e., and having a substantially the same diameter as one of the circular polymeric cylinders 40. The hexagonal array has a minimum periodicity of a lithographic dimension. The unit pattern, e.g., G3 or G4, has a shape of a regular hexagon and comprises circles of a same diameter, which is the diameter of each of the circular cylindrical trenches. However, a collection of the circles from two neighboring instances of the unit pattern does not have hexagonal periodicity. For example, the collection of circles in the union set of G3 and G4 does not have hexagonal periodicity since the coherency of any hexagonal periodicity of the cylindrical trenches does not extend beyond an area of one of the first, second, and third openings (O1, O2, O3).

Figure 25A:
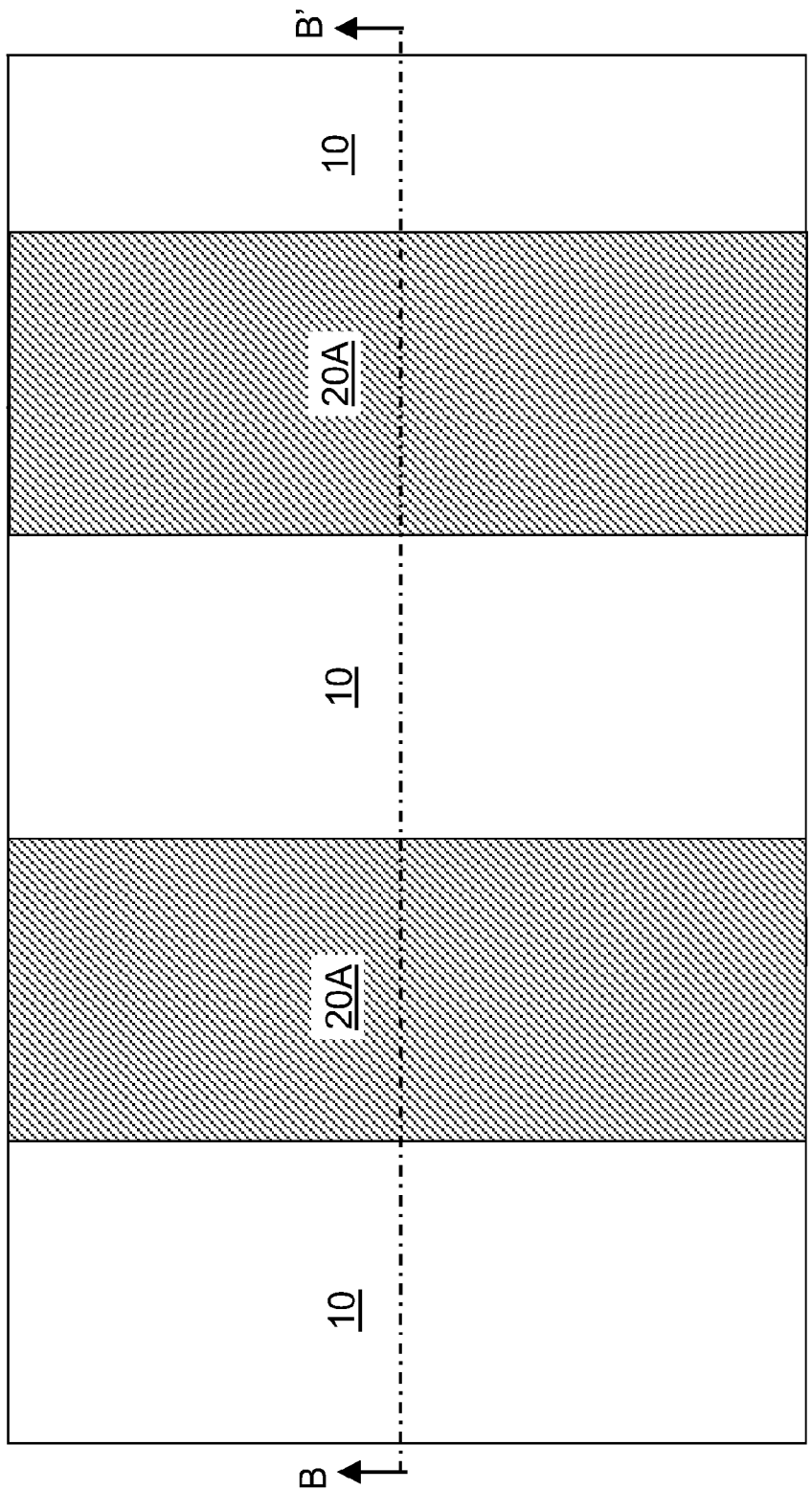
FIGS. 25A-33B are sequential view of a third exemplary nanoscale structure according to a third embodiment of the present invention.
Figure 25B:
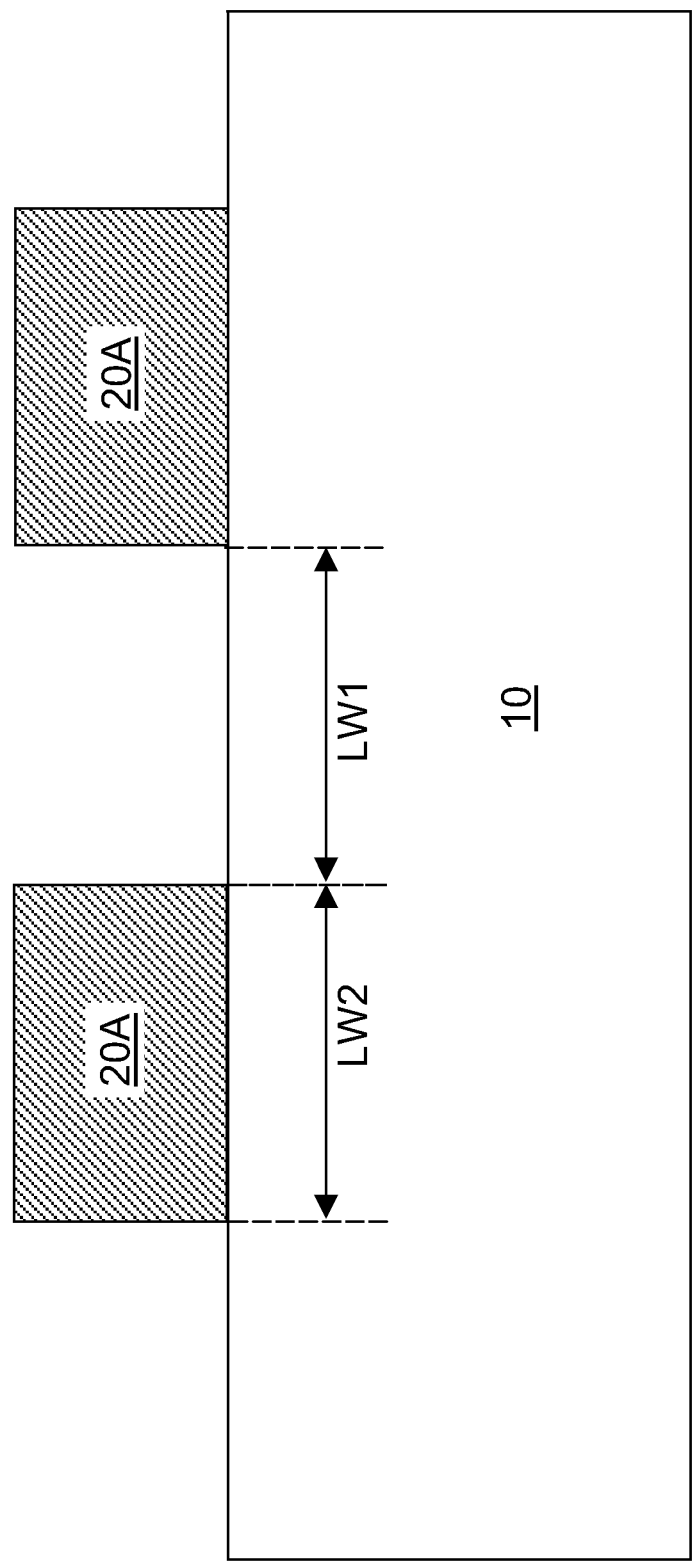

Referring to FIGS. 25A and 25B, a third exemplary nanoscale structure according to a third embodiment of the present invention is shown, which comprises a substrate 10 and a first template layer 20A. The lateral extent of the first template layer 20A and the substrate 10 may exceed lateral range of order of non-photosensitive polymeric resists to be subsequently employed. The substrate 10 and the first template layer 20A may comprise the same materials as, and may be formed by the same methods as, in the first embodiment.

The first template layer 20A is patterned with first rectangular openings to expose the substrate 10. The lateral width of each first rectangular opening is lithographic. Further, the spacing between adjacent first rectangular openings is also lithographic. While the widths of the first rectangular openings may vary from opening to opening, the same lateral width of the first rectangular openings are assumed to be the same for the purposes of description of the present invention, which is herein referred to as a first lateral width LW1 Likewise, the spacing between adjacent first rectangular openings is assumed to be the same for the purposes of description of the present invention, which is herein referred to as a second lateral width LW2. Embodiments in which the first rectangular openings have different lateral widths and/or the adjacent first rectangular openings have different spacings are explicitly contemplated herein.

The lengthwise direction of each first rectangular opening is sufficiently greater than the first lateral width LW1 to cause subsequent formation of self-aligned patterns along the lengthwise direction of the first rectangular openings, i.e., in the direction perpendicular to the direction of the lateral widths of the first rectangular openings.

Figure 26A:
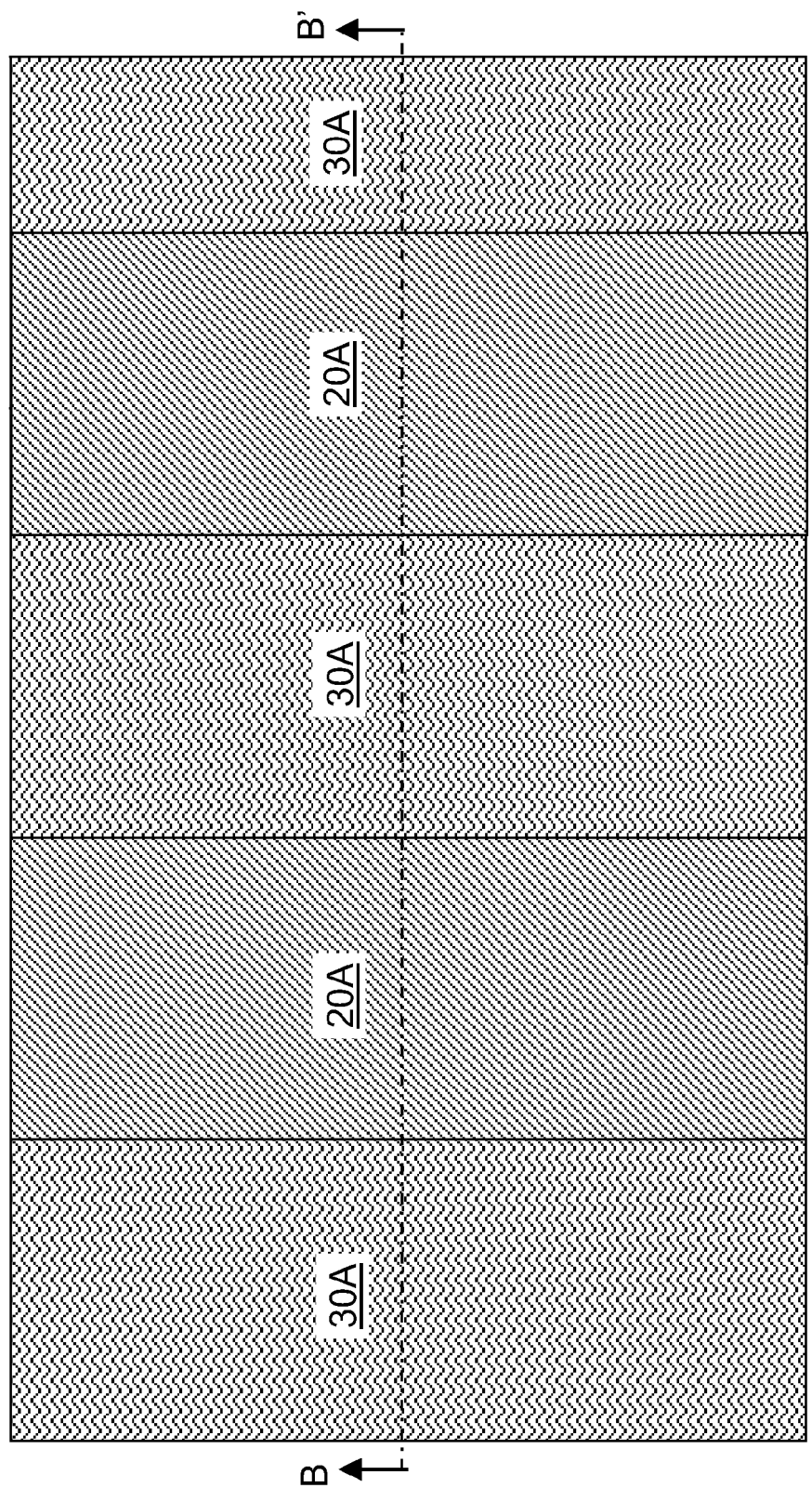
Figure 26B:
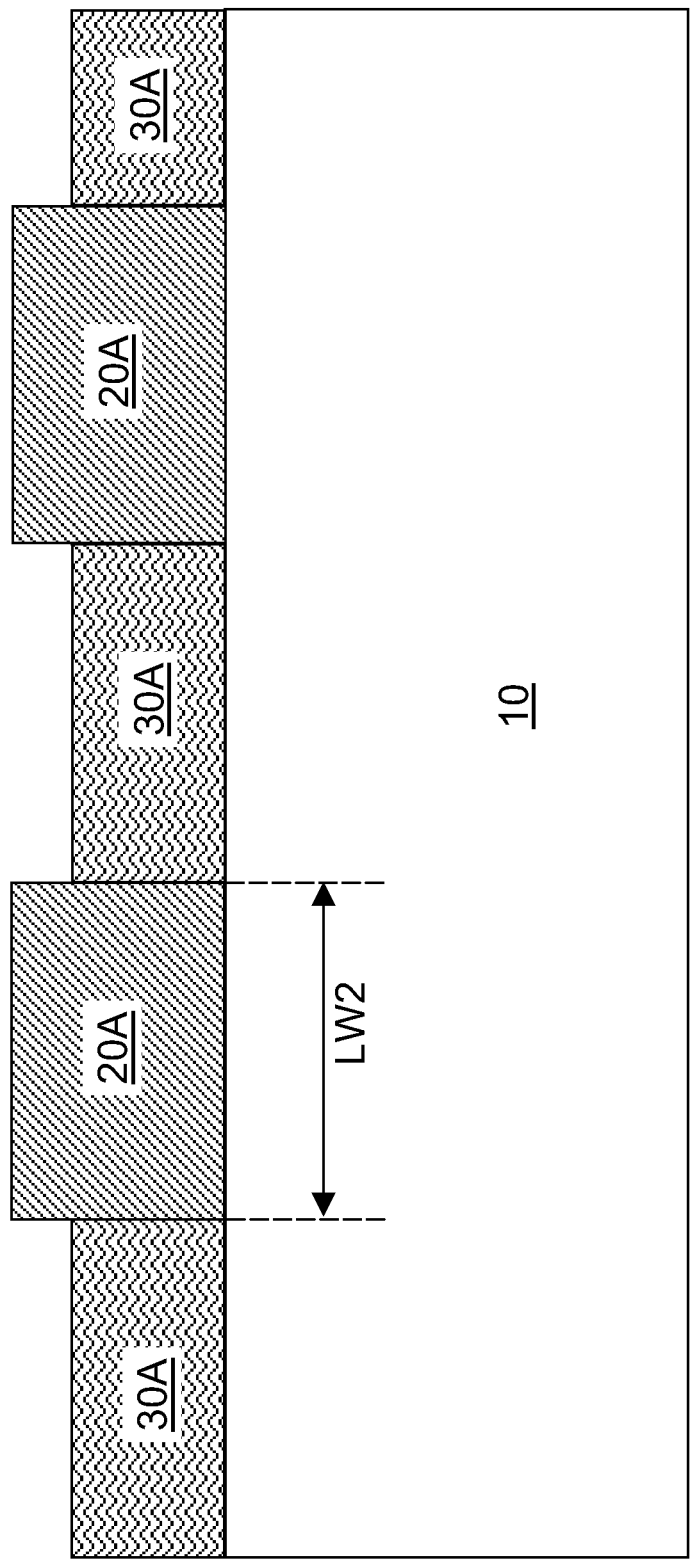

Referring to FIGS. 26A and 26B, a first non-photosensitive polymeric resist is applied within each of the first rectangular openings by methods well known in the art, such as spin coating to form first non-photosensitive polymeric resist portions 30A. Preferably, the top surface of the first non-photosensitive polymeric resist portions 30A is coplanar with the top surface of the first template layer 20A or recessed below the top surface of the first template layer 20A. The first non-photosensitive polymeric resist comprises self-assembling block copolymers that are capable of self-organizing into nanometer-scale patterns.

The first non-photosensitive polymeric resist comprises a first polymeric block component and a second polymeric block component that are immiscible with each other. The non-photosensitive polymeric resist may be self-planarizing. Alternatively, the non-photosensitive polymeric resist may be planarized by chemical mechanical planarization, a recess etch, or a combination thereof. The same material may be employed for the first polymeric block component and the second polymeric block component as in the first embodiment. Also, the same application method may be employed as in the first embodiment.

Figure 27A:
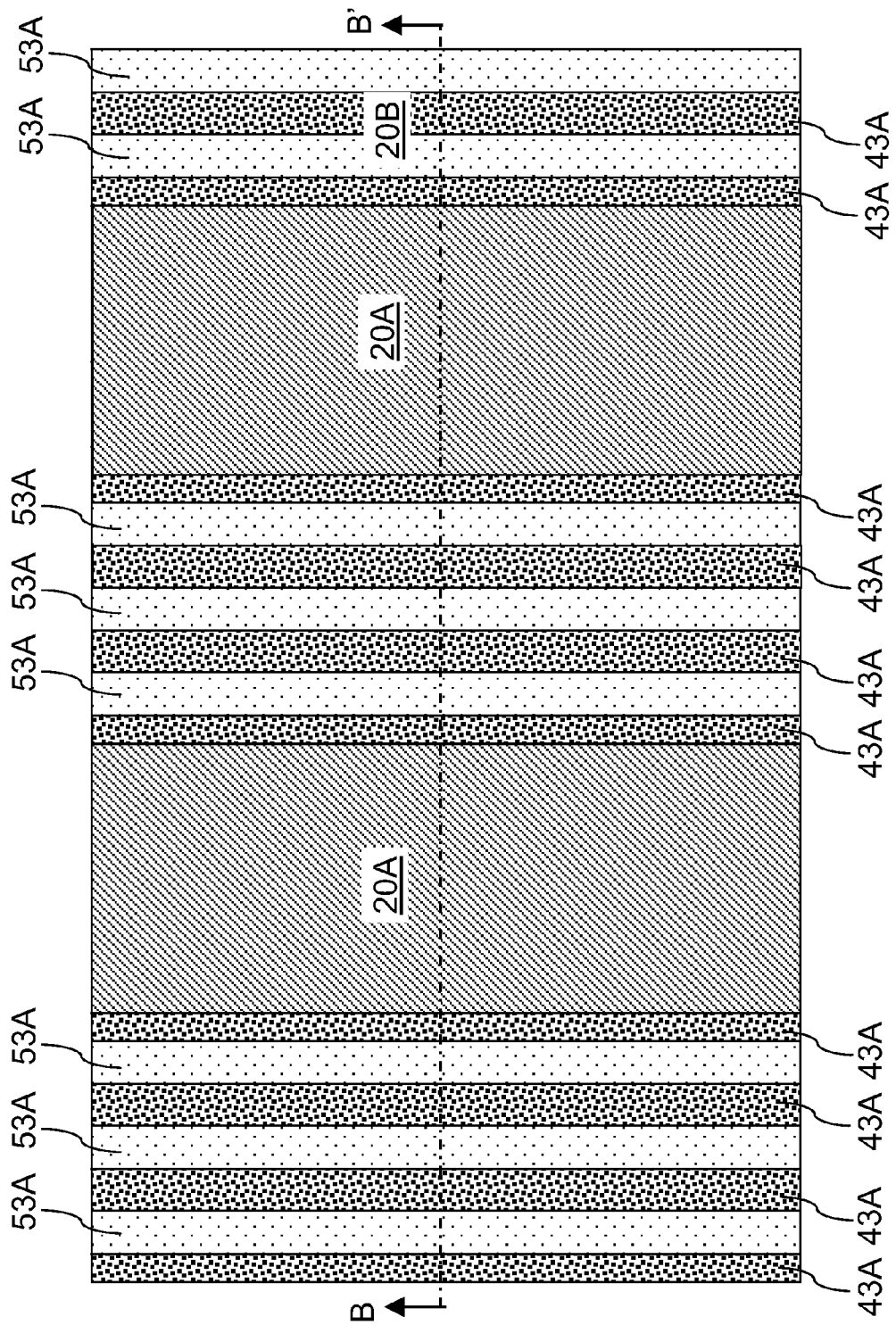
Figure 27B:
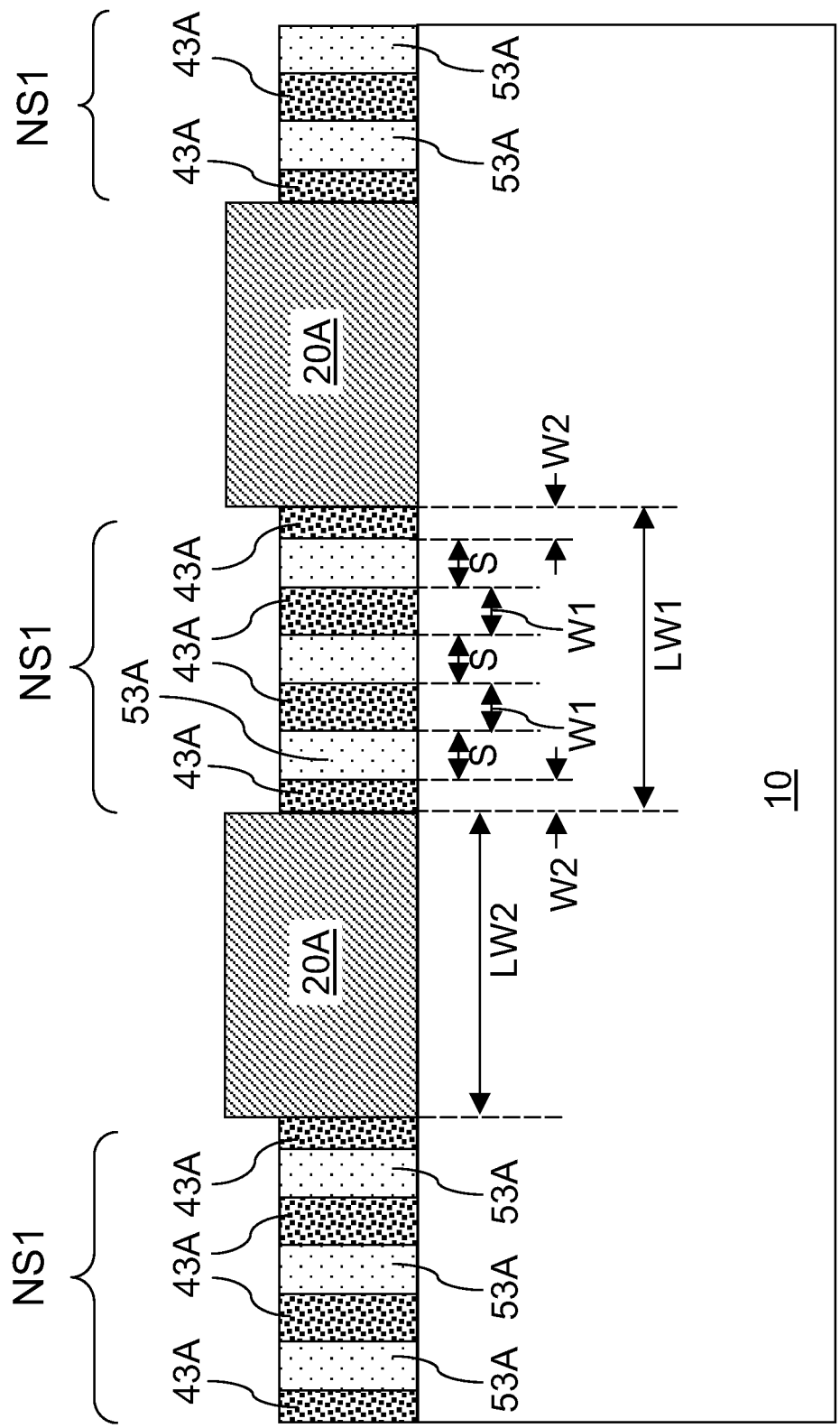

Referring to FIGS. 27A and 27B, a first nanoscale self-assembled self-aligned structure NS1 is formed within each of the first rectangular openings by causing cross-linking of the self-assembling block copolymers through annealing. Specifically, the first non-photosensitive polymeric resist is annealed by ultraviolet treatment or by thermal annealing at an elevated temperature to form first primary lamellar structures 43A comprising the first polymeric block component and first complementary lamellar structures 53A comprising the second polymeric block component. The first primary lamellar structure 43A and the first complementary lamellar structures 53A alternate with periodicity in the direction of the first lateral width LW1.

The composition and wetting properties of the first non-photosensitive polymeric resist is adjusted such that some of the first primary lamellar structures 43A abut the sidewalls of the first template layer 20A, while the first complementary lamellar structures 53A are disjoined from the sidewalls of the first template layer 20A. The wetting characteristics of the first polymeric block component is tuned so that the width of a first primary lamellar structure 43A depends on whether the first primary lamellar structure 43A contacts the sidewalls of the first template layer 20A or not. The width of the first primary lamellar structure 43A that does not contact the sidewalls of the first template layer 20A is herein referred to as a first width W1. The width of the first primary lamellar structure 43A that contacts the sidewalls of the first template layer 20A is herein referred to as a second width W2. The first width W1 and the second width W2 may be both sublithographic, for example, in the range from about 1 nm to about 40 nm, and typically from about 5 nm to about 30 nm. The first width W1 is greater than the second width W2. The first width W1 may be greater than, equal to, or less than, twice the second width W2. The width of the first complementary lamellar structures 53A is the same, and is herein referred to as a lamellar spacing S, which may be sublithographic. The sum of the first width W1 and the lamellar spacing S may also be sublithographic.

The first nanoscale self-assembled self-aligned structures NS1 are "self-assembled." The chemical composition of the first non-photosensitive polymeric resist is such that the immiscibility of the first and second polymeric block components enable self assembly of the first polymeric block component into the first primary lamellar structures 43A and the second polymeric block component assembles into the first complementary lamellar structures 53A.

The first nanoscale self-assembled self-aligned structures NS1 are "self-aligned" to the walls of the first template layer 20A that define the rectangular openings. The first primary lamellar structures 43A and first complementary lamellar structures 53A run along the lengthwise direction of the rectangular openings in the first template layer 20A.

The first template layer 20A is subsequently removed selective to the first nanoscale self-assembled self-aligned structures NS1 and the substrate 10. A wet etch or a dry etch may be employed.

Figure 28A:
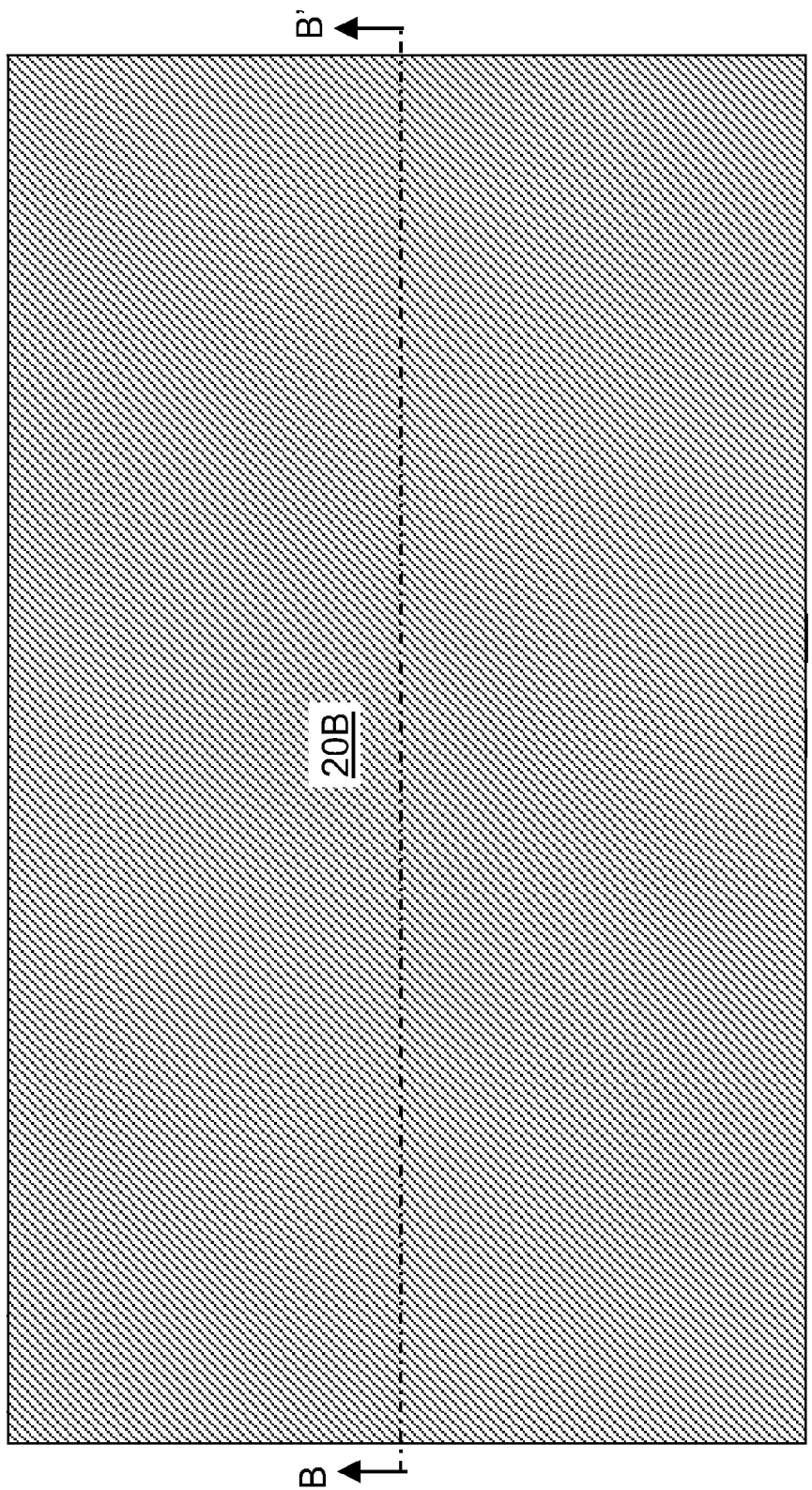
Figure 28B:
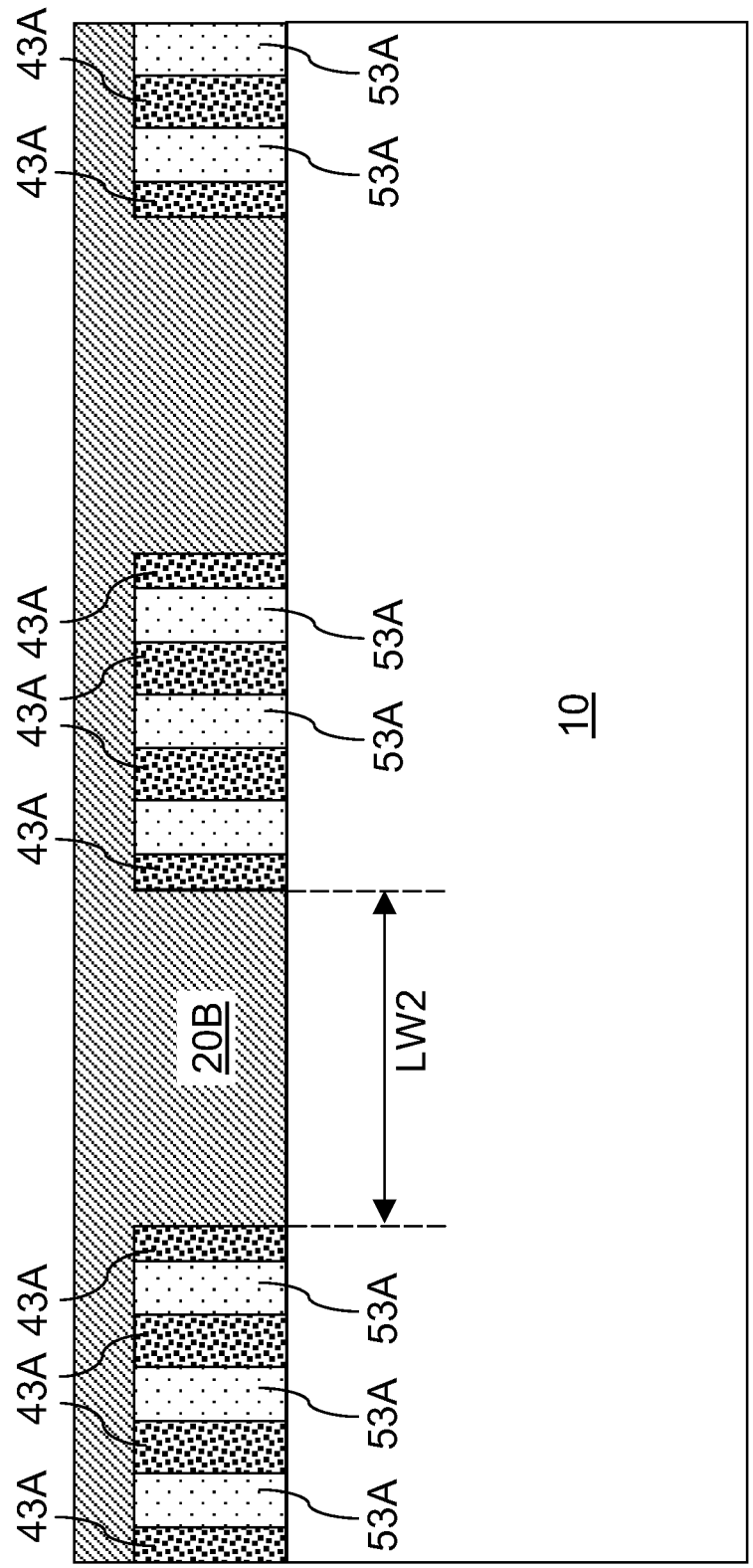

Referring to FIGS. 28A and 28B, a second template layer 20B is formed over the first nanoscale self-assembled self-aligned structures NS1 and the substrate 10. The second template layer 20B may be selected from the materials that may be employed as the first template layer 20A. The second template layer 20B may comprise the same material as, or a different material from, the first template layer 20A. The second template layer 20B is formed as a blanket layer and covers top surfaces of the first nanoscale self-assembled self-aligned structures NS1.

The second template layer 20B is lithographically patterned by applying a photoresist (not shown), lithographic patterning of the photoresist, and transfer of the pattern in the photoresist into the second template layer by an anisotropic etch. A set of second rectangular openings, which covers a complementary area of the first rectangular openings, is formed in the second template layer 20B. Thus, the second rectangular openings are formed between the first nanoscale self-assembled self-aligned structures NS1, and the boundaries of the second rectangular openings substantially coincide with the boundaries of the first nanoscale self-assembled self-aligned structures NS1. The width of each of the second rectangular openings is the second lateral width LW2, which is a lithographic dimension, and may be the same as, or different from, the first lateral width LW1.

Figure 29A:
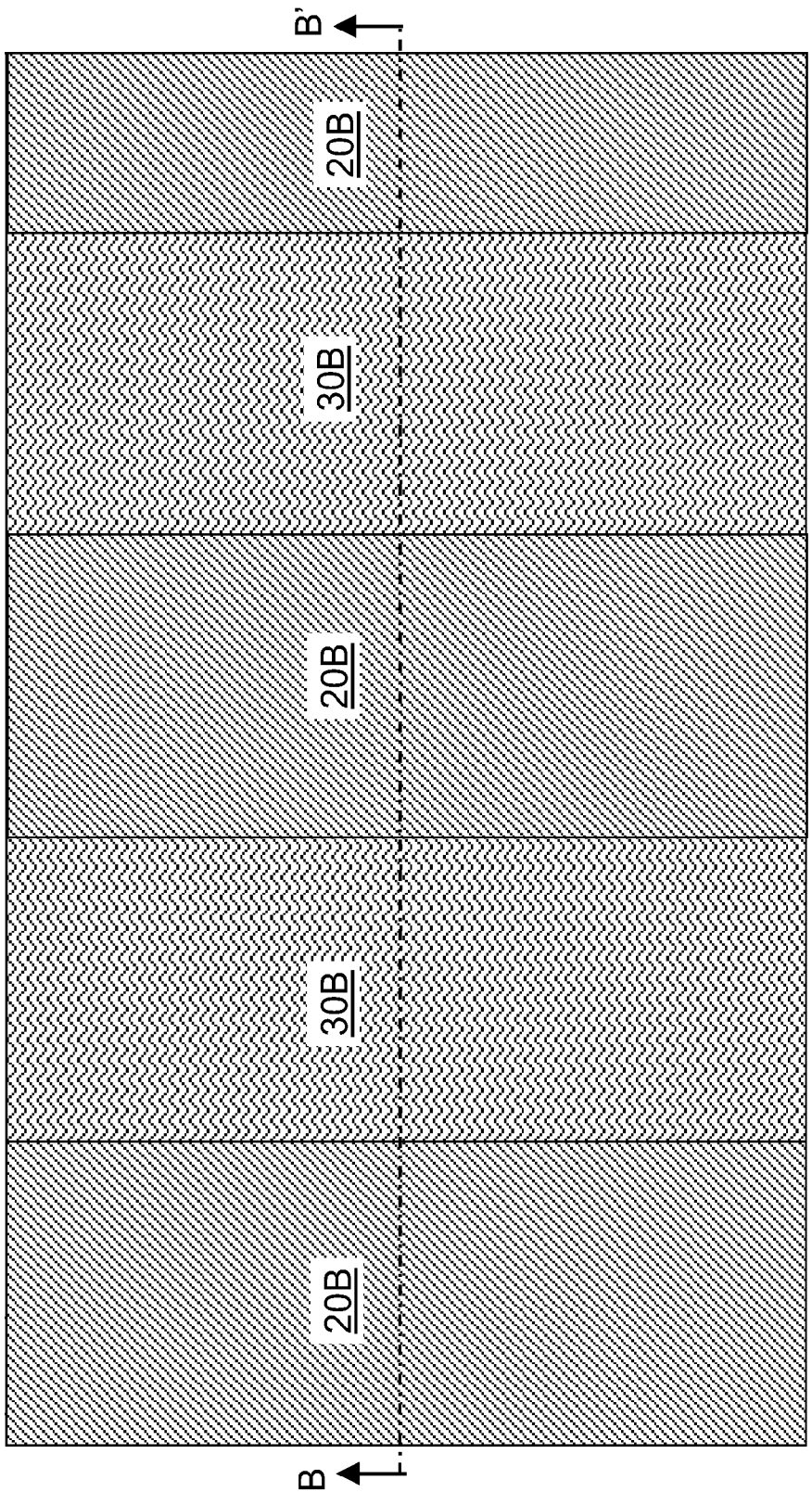
Figure 29B:
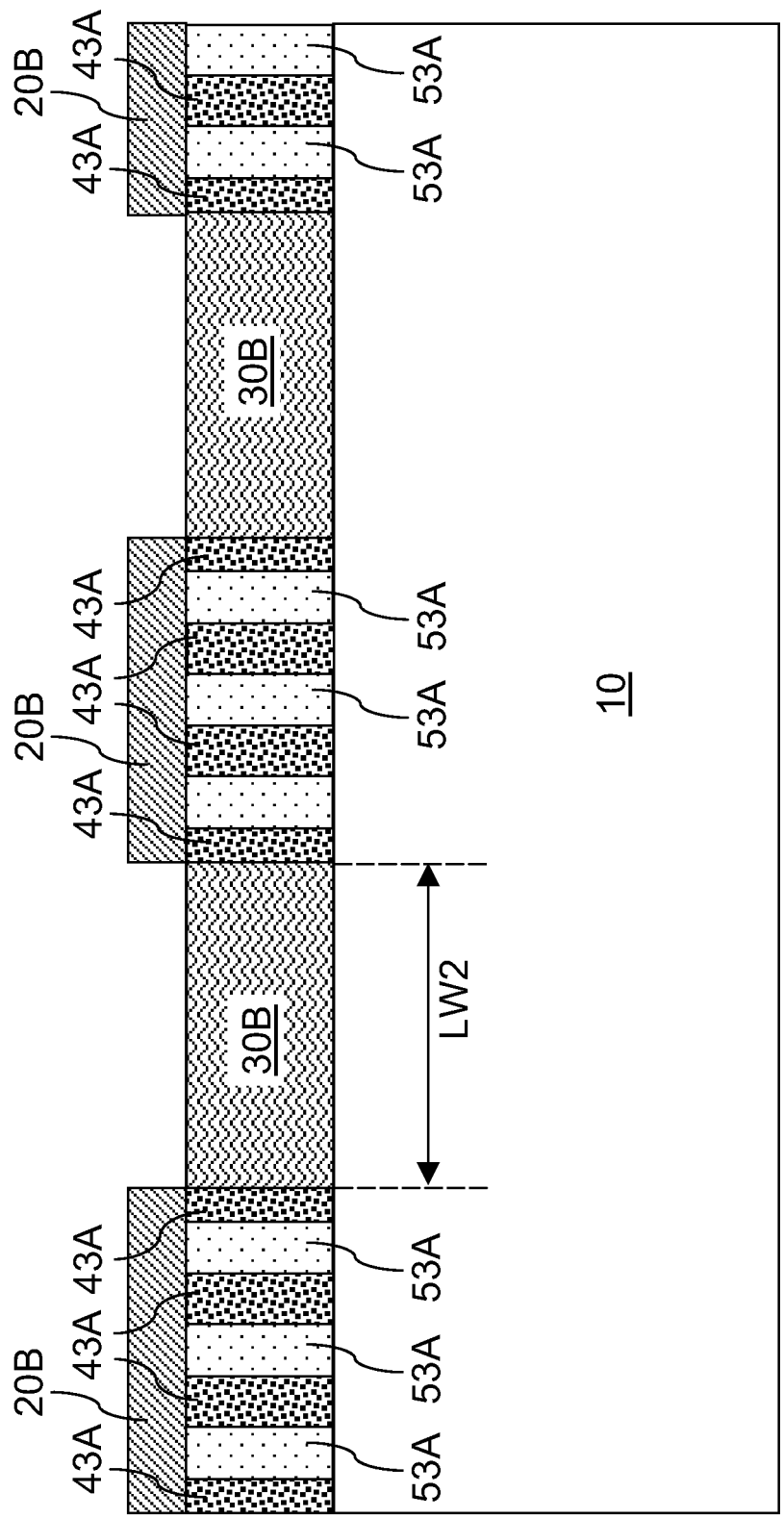

Referring to FIGS. 29A and 29B, a second non-photosensitive polymeric resist is applied within each of the second rectangular openings by methods well known in the art, such as spin coating to form second non-photosensitive polymeric resist portions 30B. Preferably, the top surface of the second non-photosensitive polymeric resist portions 30B is recessed below the top surface of the second template layer 20B. Also preferably, the top surface of the second non-photosensitive polymeric resist portions 30B is coplanar with top surfaces of the first nanoscale self-assembled self-aligned structures NS1. The second non-photosensitive polymeric resist may be applied to be coplanar with, or above, the top surfaces of the second template layer 20B, and then recessed to the height of the top surfaces of the first nanoscale self-assembled self-aligned structures NS1 by a recess etch or by employing a dilute solution from which subsequent evaporation of a solvent causes volume contraction within each of the second rectangular openings.

The second non-photosensitive polymeric resist comprises self-assembling block copolymers that are capable of self-organizing into nanometer-scale patterns. Thus, any of the material listed above for the first non-photosensitive polymeric resist may be employed for the second non-photosensitive polymeric resist. The second non-photosensitive polymeric resist may comprise the same material as, or a different material from the first photosensitive polymeric resist. For the purposes of illustrating the present invention, it is assumed that the same material is employed for the first non-photosensitive polymeric resist and the second non-photosensitive polymeric resist.

Figure 30A:
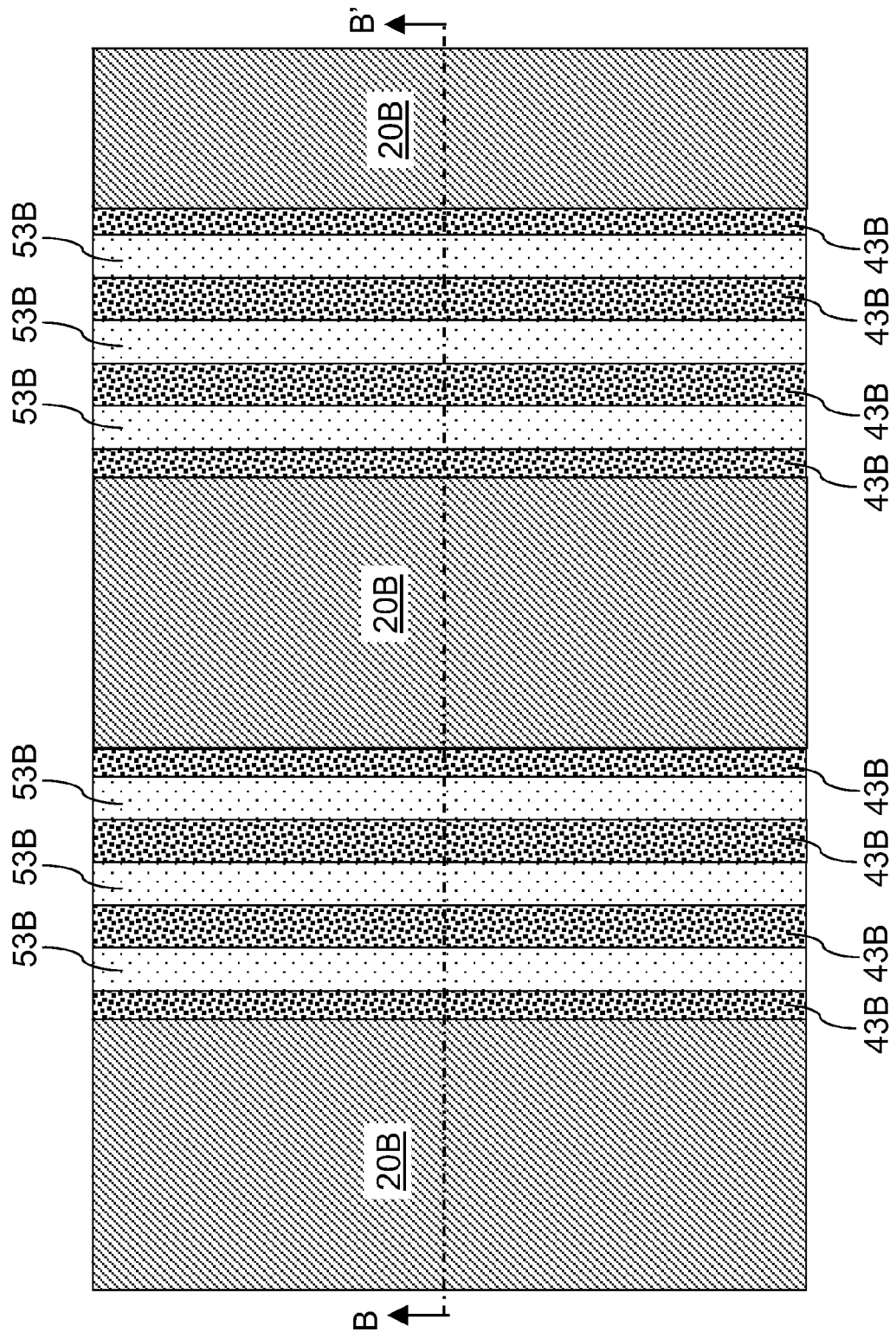
Figure 30B:
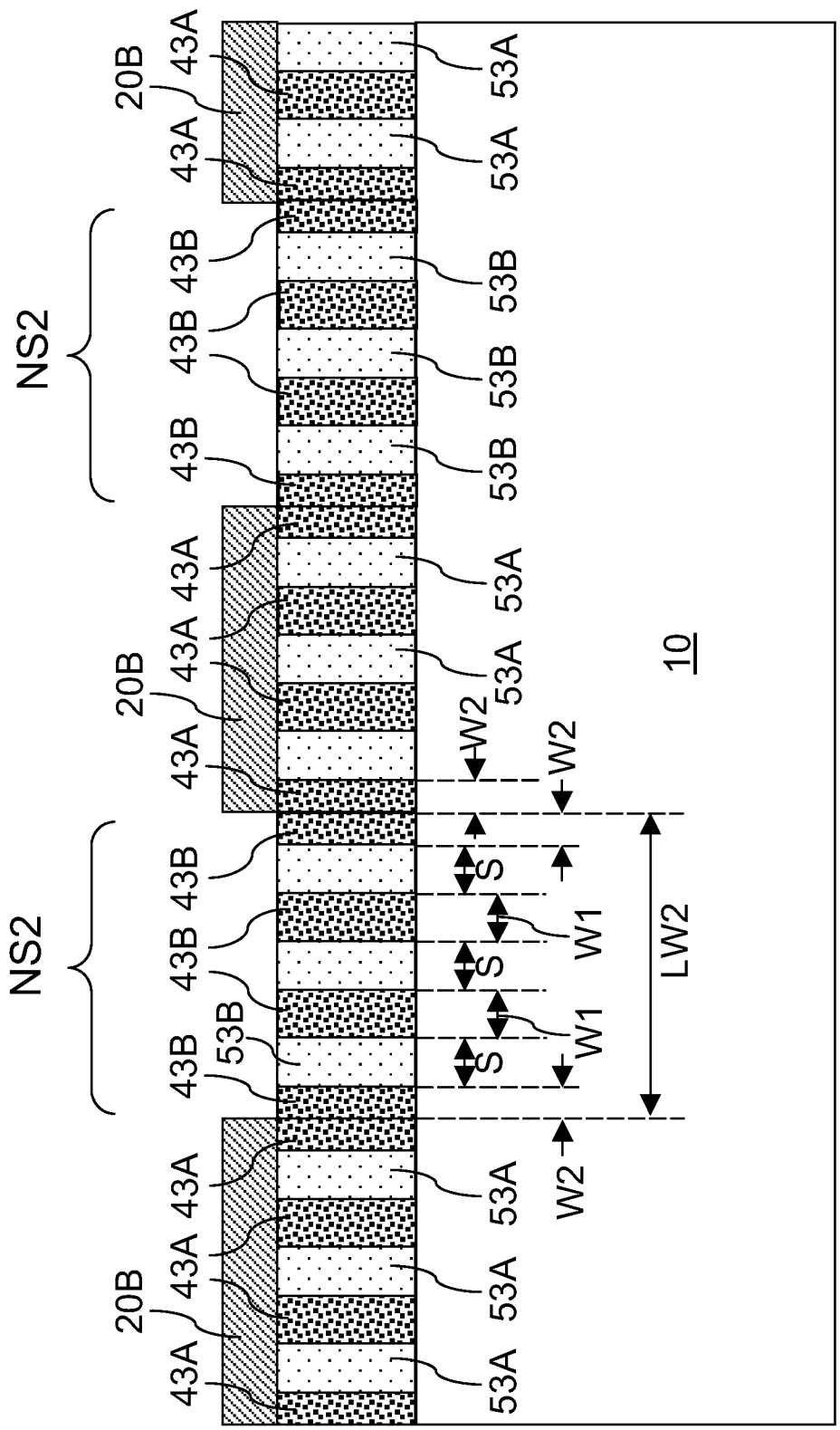

Referring to FIGS. 30A and 30B, a second nanoscale self-assembled self-aligned structure NS2 is formed within each of the second rectangular openings by causing cross-linking of the self-assembling block copolymers through annealing. The same method employed for the formation of the first nanoscale self-assembled self-aligned structure NS1 may be employed to form the second nanoscale self-assembled self-aligned structures NS2.

Specifically, the second non-photosensitive polymeric resist is annealed by ultraviolet treatment or by thermal annealing at an elevated temperature to form second primary lamellar structures 43B comprising the first polymeric block component and second complementary lamellar structures 53B comprising the second polymeric block component. The second primary lamellar structure 43B and the second complementary lamellar structures 53B alternate with periodicity in the direction of the second lateral width LW2.

The composition and wetting properties of the second non-photosensitive polymeric resist is adjusted such that some of the second primary lamellar structures 43B abut the exposed sidewalls of the first primary lamellar structures 43A, while the second complementary lamellar structures 53B are disjoined from the sidewalls of the first primary lamellar structures 53B. The wetting characteristics of the first polymeric block component is tuned so that the width of a second primary lamellar structure 43B depends on whether the second primary lamellar structure 43B contacts the sidewalls of the first primary lamellar structures 43A or not. Preferably, the width of the second primary lamellar structure 43B that does not contact the sidewalls of a first primary lamellar structure 43A is the same as the first width W1. The width of the second primary lamellar structure 43B that contacts the sidewalls of a first primary lamellar structure 43A may, or may not, be the same as the second width W2. The width of the second complementary lamellar structures 53B is the same among themselves, and may be the same as, or different from, the lamellar spacing S, which is the width of a first complementary lamellar structure 53A.

The second nanoscale self-assembled self-aligned structures NS2 are self-assembled and self-aligned in the same sense that the first nanoscale self-assembled self-aligned structures NS1 are self-assembled and self-aligned, since the same mechanism is employed for the self-assembly and self-alignment of the various components of the second nanoscale self-assembled self-aligned structures NS2.

Figure 31A:
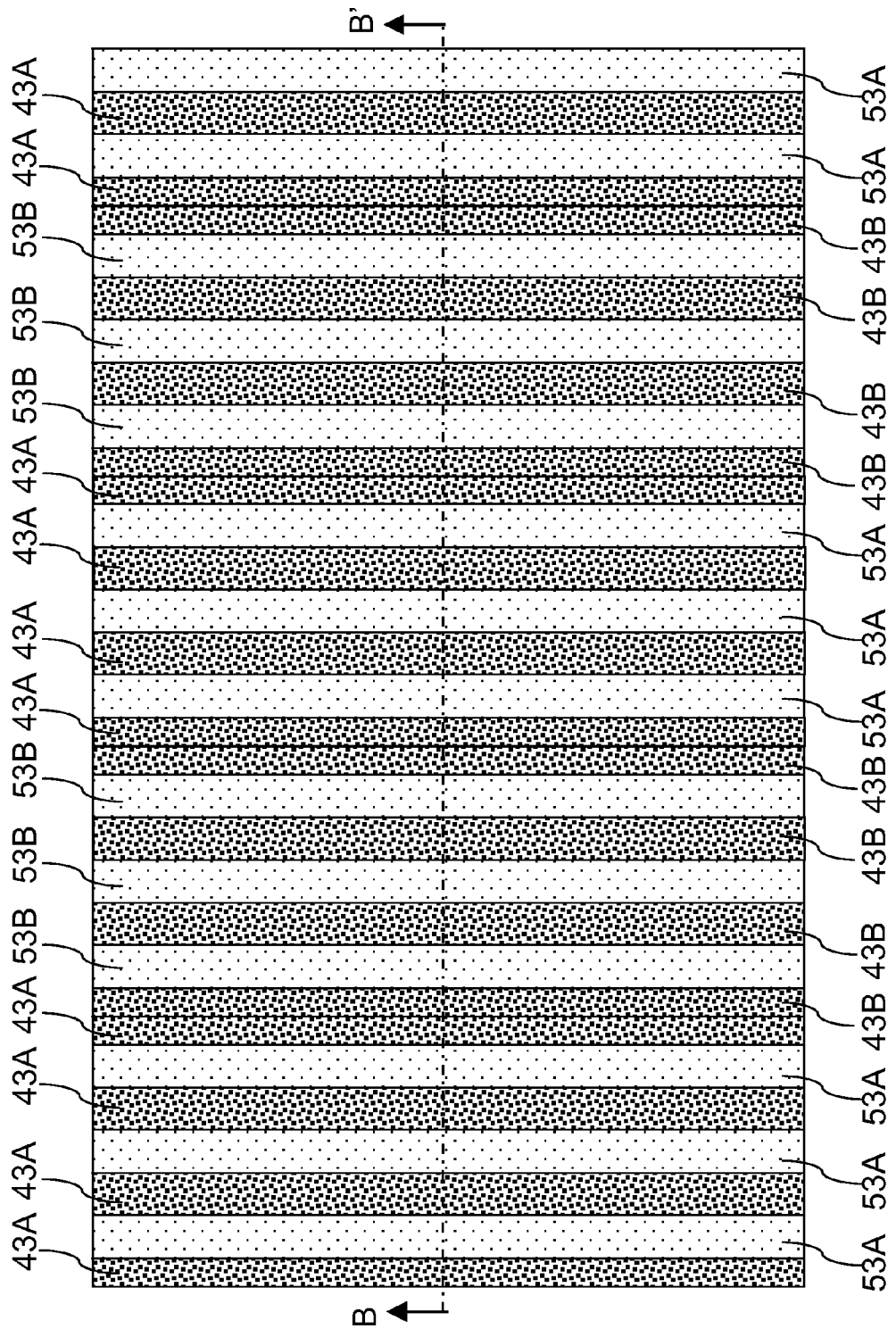
Figure 31B:
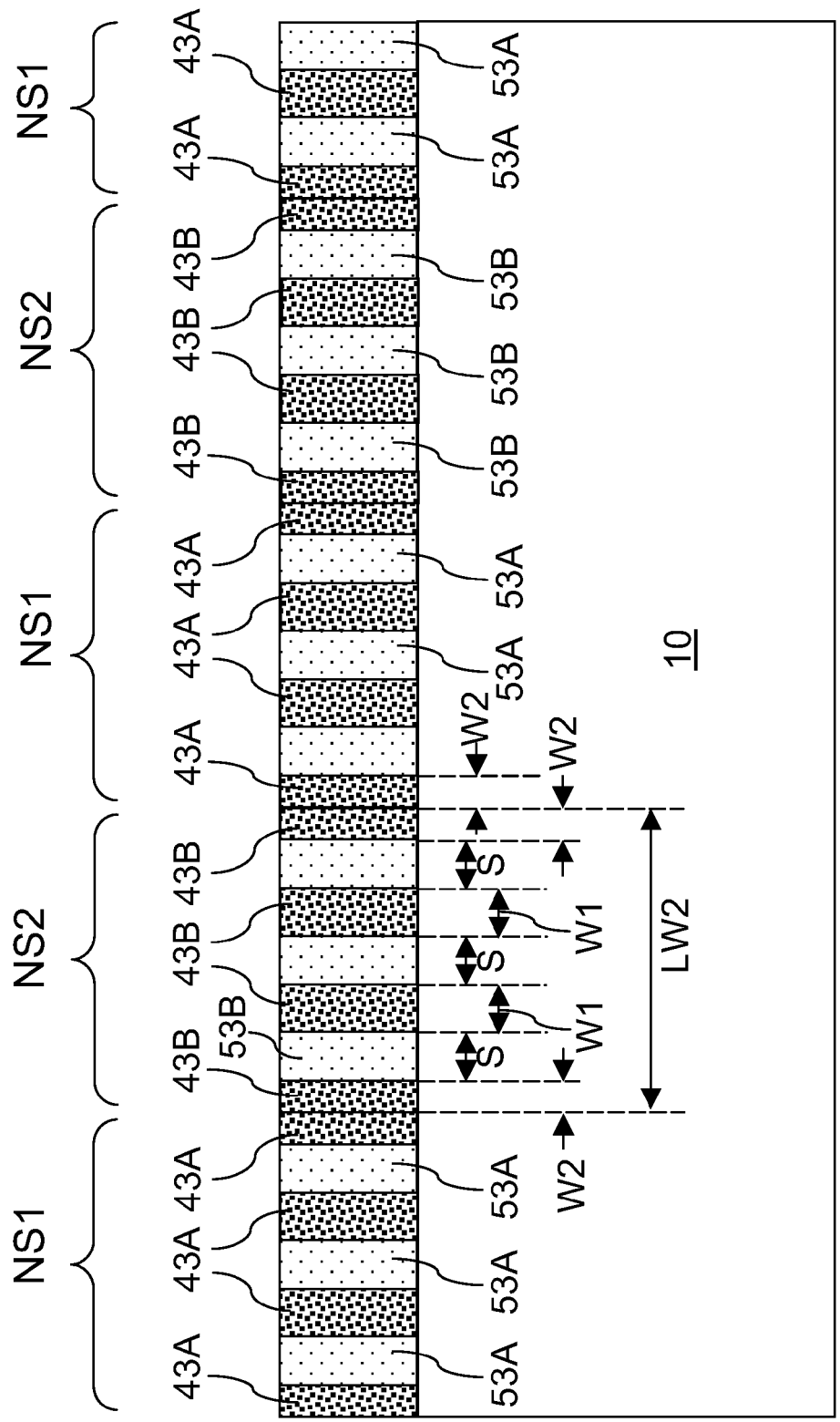

Referring to FIGS. 31A and 31B, the second template layer 20B is removed selective to the first nanoscale self-assembled self-aligned structures NS1, the second nanoscale self-assembled self-aligned structures NS2, and the substrate 10. A wet etch or a dry etch may be employed.

Figure 32A:
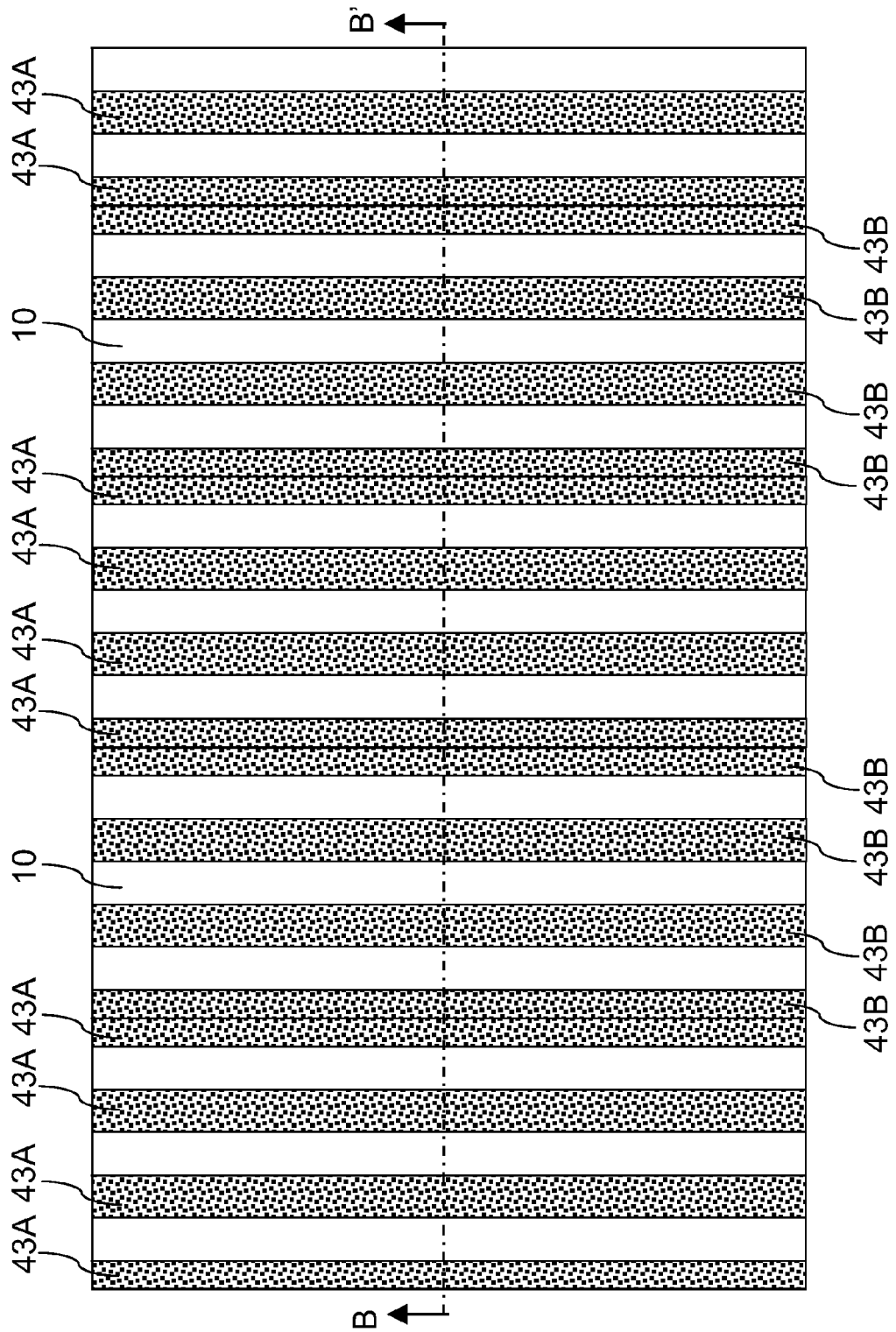
Figure 32B:
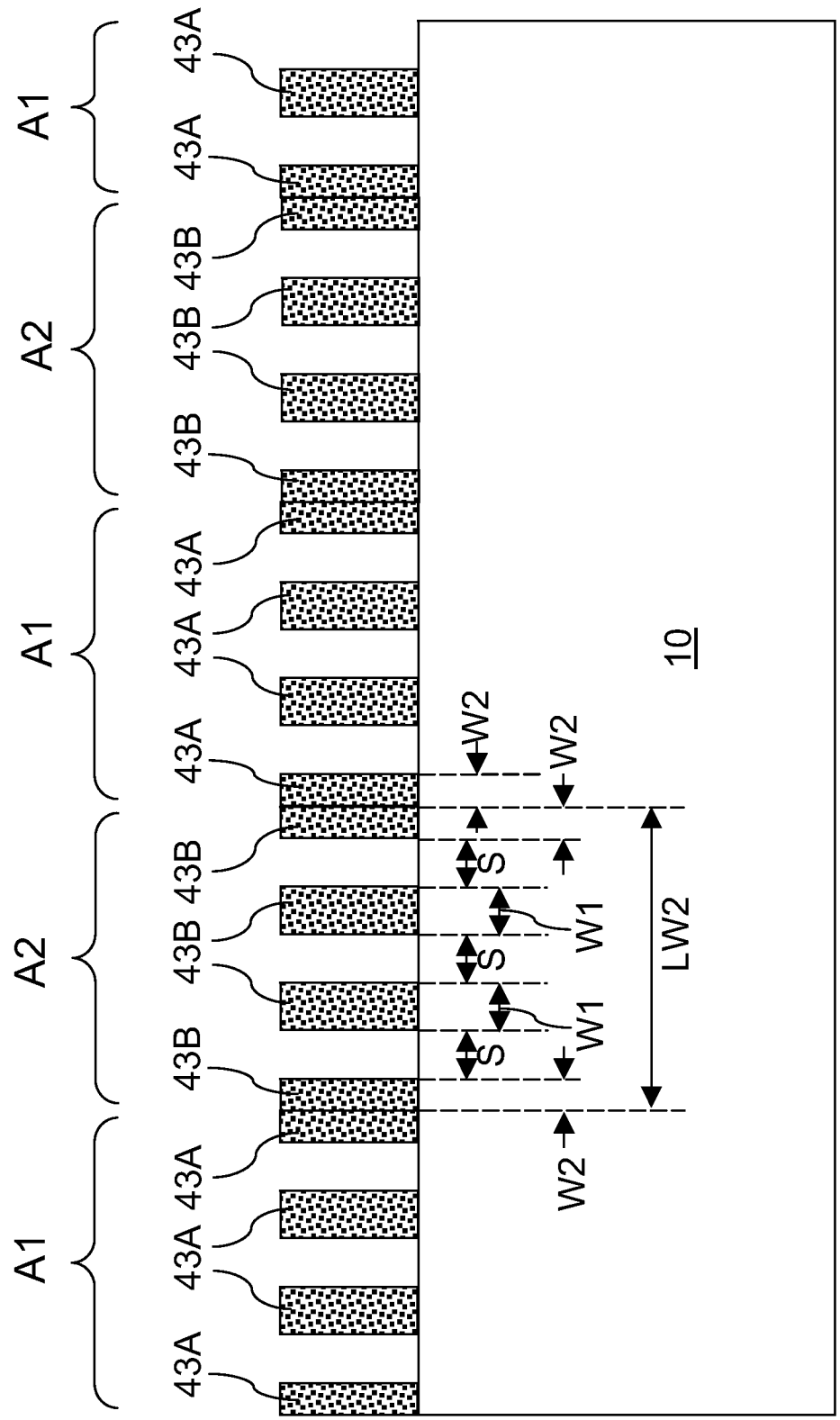

Referring to FIGS. 32A and 32B, the first and second complementary lamellar structures (53A, 53B) are removed selective to the first and second primary lamellar structures (43A, 43B) by an anisotropic etch that removes the second polymeric block component selective to the first polymeric block component. The set of first primary lamellar structures 43A from the same first rectangular opening constitutes a first one dimensional arrays A1 having a spacing of the lamellar spacing S. Likewise, the set of second primary lamellar structures 43B from the same second rectangular opening constitutes a second one dimensional arrays A2 having a spacing of the lamellar spacing S. However, an adjacent pair of a first one dimensional array A1 and a second one dimensional array A2 may, or may not, be coherent, i.e., constitute another one dimensional array with periodicity. If the second width W2 is one half of the first width, the collection of the first one dimensional arrays A1 and the second one dimensional arrays A2 constitute an extended one dimensional array having a periodicity of the sum of the first width W1 and the lamellar spacing S. However, if the second width W2 is not equal to one half of the first width W1, the extended one dimensional array comprising a plurality of the first one dimensional arrays A1 and the second one dimensional arrays A2 has a periodicity of the sum of the first lateral width LW1 and the second lateral width LW2. Thus, the minimum periodicity is a lithographic dimension.

Figure 33A:
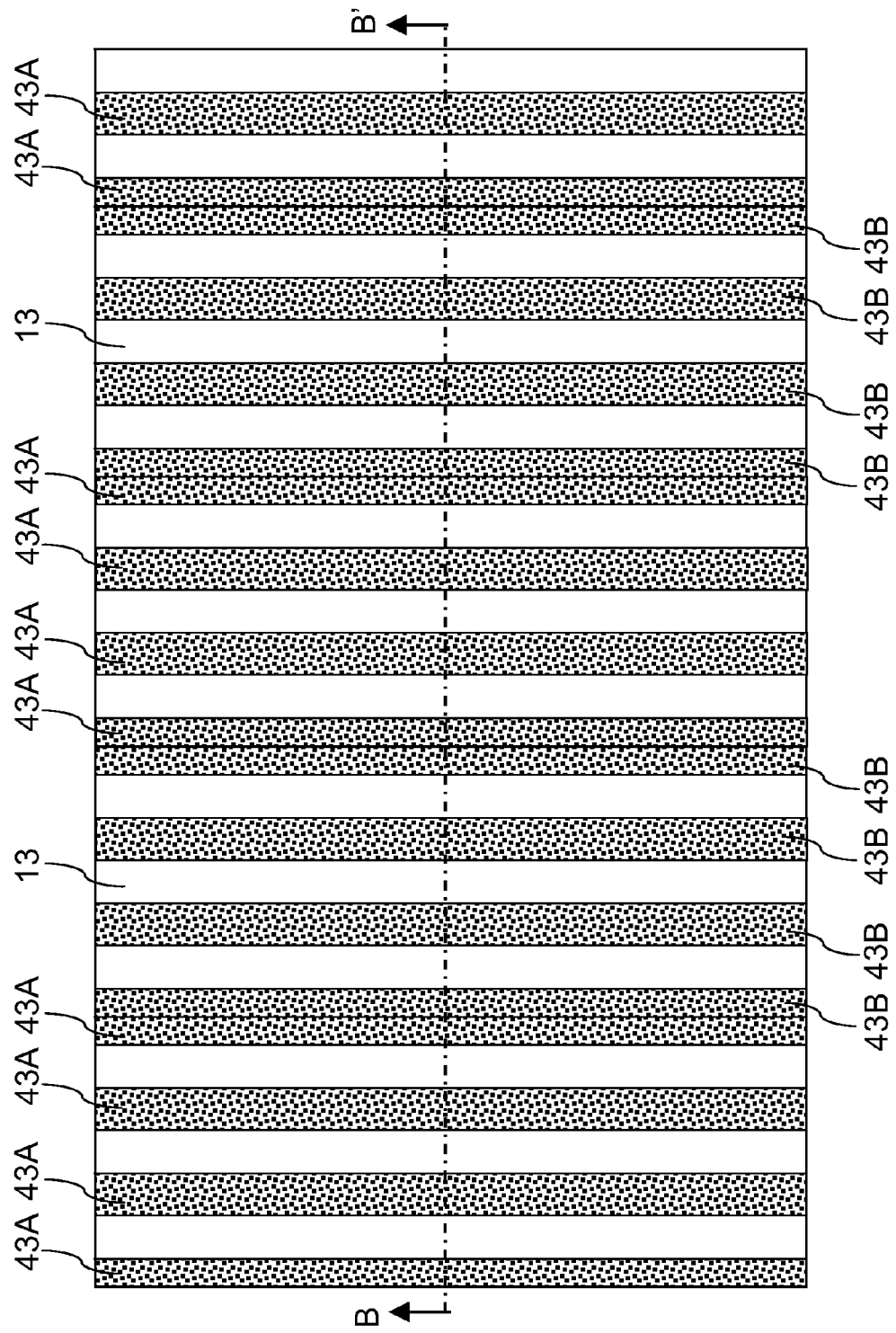
Figure 33B:
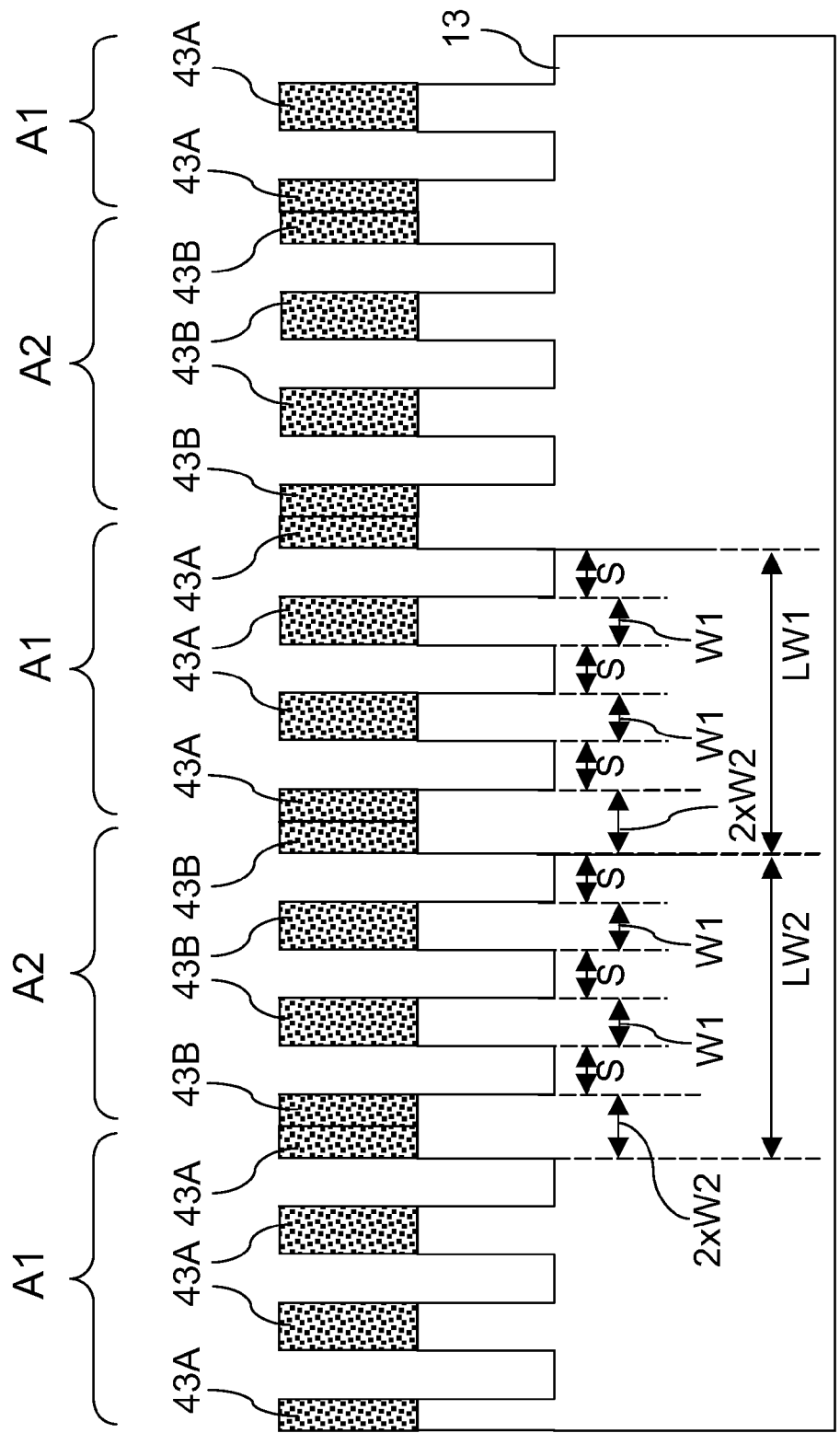

Referring to FIGS. 33A and 33B, the pattern of the extended array comprising the first one dimensional arrays A1 and the second one dimensional arrays A2 is transferred into the substrate 10 by an anisotropic etch that removed exposed portions of the substrate 10 selective to the first and second primary lamellar structures (43A, 43B). Linear trenches are formed within the substrate to expose trench bottom surfaces 13 at the bottom of the linear trenches. The first and second primary lamellar structures (43A, 43B) may be subsequently removed.

The third exemplary nanoscale structure comprises a substrate 10 having a one dimensional periodic repetition of a unit pattern. The unit pattern comprises protrusion of at least one first line and a second line on a substantially planar surface, which is the collection of the trench bottom surfaces 13. Each of the at least one first line is formed directly underneath a first primary lamellar structure 43A not abutting a second lamellar structure 43B or directly underneath a second primary lamellar structures 43B not abutting a first lamellar structure 43A. The second line is formed directly underneath a first primary lamellar structure 43A abutting a second primary lamellar structure 43B. Each of the at least one first line may have a first sublithographic width, which is the first width W1, and second line has a second sublithographic width, which is twice the second width W2. Each neighboring pair of the at least one first line and the second line may be separated by a same sublithographic spacing, which is the lamellar spacing S.

The first sublithographic width and the second sublithographic width are the same if the first width W1 is twice the second width W2. The one dimensional unit pattern has a minimum periodicity that is equal to the sum of the first width W1 and the lamellar spacing S. However, the first sublithographic width and the second sublithographic width are different if the first width W1 is not twice the second width W2. If the first lateral width LW1 and the second lateral width LW2 are the same, the one dimensional unit pattern has a minimum periodicity that is equal to the first lateral width LW1, which is a lithographic dimension. If the first lateral width LW1 and the second lateral width LW2 are different, the one dimensional unit pattern has a minimum periodicity that is equal to the sum of the first lateral width LW1 and the second lateral width LW2, which is a lithographic dimension.

Prior to removal of the first and second primary lamellar structures (43A, 43B), the third exemplary nanoscale structure further comprises a plurality of polymeric lines, which are the first and second primary lamellar structures (43A, 43B) and comprises a polymeric component of a non-photosensitive polymeric resist and located directly on each of the at least one first line and a second line. Each edge of the polymeric lines vertically coincides with an edge of the at least one first line or the second line.

Instead of removing the first and second complementary lamellar structures (53A, 53B) selective to the first and second primary lamellar structures (43A, 43B) from the third exemplary nanoscale structure of FIGS. 31A and 31B, the first and second primary lamellar structures (43A, 43B) may be selected relative to the first and second complementary lamellar structures (53A, 53B). The pattern of the first and second primary lamellar structures (43A, 43B) may then be transferred into the substrate 10 to form another nanoscale structure which has the opposite polarity as the structure of FIGS. 33A and 33B. The resulting pattern is a pattern of recess instead of protrusions, in which the structure further comprises a plurality of polymeric lines comprising a polymeric component of a non-photosensitive polymeric resist and located directly on the substantially planar surface, and each edge of the polymeric lines vertically coincides with an edge of the at least one first line or the second line.

Variation on the geometry of the tiles or openings is also contemplated. The tiles or openings may include one shape, e.g., a hexagon, a rectangle, a rhombus, a parallelogram, a triangle, or a regular polygon, or may comprise a collection of at least two different shapes.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A structure comprising a substrate having a one dimensional periodic repetition of a unit pattern, wherein said unit pattern comprises protrusion or recess of at least one first line and a second line from a horizontal surface, wherein each of said at least one first line has a first sublithographic width, wherein said second line has a second sublithographic width, wherein each neighboring pair of said at least one first line and said second line is separated by a same sublithographic spacing, wherein said first sublithographic width and said second sublithographic width are different and are in a range from 1 nm to 40 nm.

2. The structure of claim 1, wherein said at least one first line is a plurality of first lines.

3. The structure of claim 1, wherein said unit pattern is defined by a set of structures having parallel vertical sidewalls that are perpendicular to a direction of said one dimensional periodic repetition.

4. The structure of claim 1, said unit pattern further comprises protrusion or recess of at least one third line and a fourth line from said horizontal surface, wherein each of said at least one third line has said first sublithographic width, wherein said fourth line has said second sublithographic width, wherein each neighboring pair of said at least one third line and said fourth line is separated by said same sublithographic spacing.

5. The structure of claim 4, wherein said at least one first line and said second line extend over a first lateral width less said same lithographic spacing, and said at least one third line and said fourth line extend over a second lateral width less said same lithographic spacing, and said second lateral width is different from said first lateral width.

6. The structure of claim 1, wherein said pattern is a pattern of protrusion.

7. The structure of claim 6, wherein said structure further comprises a plurality of polymeric lines comprising a polymeric component of a non-photosensitive polymeric resist.

8. The structure of claim 7, wherein said plurality of polymeric lines is located directly on each of said at least one first line and a second line.

9. The structure of claim 8, wherein each edge of said polymeric lines vertically coincides with an edge of said at least one first line or said second line.

10. The structure of claim 6, wherein said pattern of protrusion is defined by a plurality of polymeric lines comprising a polymeric component of a non-photosensitive polymeric resist and including at least one first polymeric line defining said at least one first line and a second polymeric line defining said second line.

11. The structure of claim 6, wherein said pattern of protrusion is defined by at least one first lamellar structure defining said at least one first line and a second lamellar structure defining said second line.

12. The structure of claim 6, wherein said horizontal surface is a substantially planar surface of said substrate that contiguously extends above an entirety of said substrate.

13. The structure of claim 6, wherein said horizontal surface is an interface between said substrate and structures defining said pattern of protrusion.

14. The structure of claim 6, further comprising a plurality of recessed regions having a bottom surface that is recessed below said horizontal surface and having sidewalls that underlie peripheries of said at least one first line and said second line.

15. The structure of claim 1, wherein said pattern is a pattern of recess.

16. The structure of claim 15, further comprising a plurality of polymeric lines comprising a polymeric component of a non-photosensitive polymeric resist.

17. The structure of claim 16, wherein said plurality of polymeric lines is located directly on said substantially planar surface.

18. The structure of claim 17, wherein each edge of said polymeric lines vertically coincides with an edge of said at least one first line or said second line.

19. The structure of claim 15, wherein said pattern of recess is defined by trenches extending downward from said horizontal surface and having said same sublithographic spacing.

* * * * *